United States Patent
Wang

(10) Patent No.: US 8,102,022 B2
(45) Date of Patent: Jan. 24, 2012

(54) SEMICONDUCTOR DEVICE MANUFACTURING METHOD AND SEMICONDUCTOR DEVICE

(75) Inventor: Wensheng Wang, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/630,337

(22) Filed: Dec. 3, 2009

(65) Prior Publication Data

US 2010/0078762 A1    Apr. 1, 2010

Related U.S. Application Data

(63) Continuation of application No. PCT/JP2007/061978, filed on Jun. 14, 2007.

(51) Int. Cl.
*H01L 29/92* (2006.01)
(52) U.S. Cl. ............ 257/532; 438/3; 438/240; 257/528; 257/E21.208
(58) Field of Classification Search .................. 257/532, 257/E21.008, E21.208, E29.342, 528; 438/3, 438/85, 102, 147, 149, 240
See application file for complete search history.

(56) References Cited

U.S. PATENT DOCUMENTS

| 5,293,510 | A  | * | 3/1994  | Takenaka ..................... 257/295 |
| 6,146,906 | A  |   | 11/2000 | Inoue et al. |
| 6,500,678 | B1 |   | 12/2002 | Aggarwal et al. |
| 6,528,328 | B1 |   | 3/2003  | Aggarwal et al. |
| 6,548,343 | B1 |   | 4/2003  | Summerfelt et al. |
| 6,596,547 | B2 |   | 7/2003  | Aggarwal et al. |
| 6,635,497 | B2 |   | 10/2003 | Aggarwal et al. |
| 6,686,236 | B2 |   | 2/2004  | Aggarwal et al. |
| 6,872,669 | B1 |   | 3/2005  | Summerfelt et al. |
| 7,339,218 | B2 |   | 3/2008  | Hidaka et al. |
| 7,402,858 | B2 |   | 7/2008  | Hidaka et al. |
| 2002/0117700 | A1 | | 8/2002  | Fox |
| 2003/0176073 | A1 | | 9/2003  | Ying et al. |
| 2005/0118795 | A1 | | 6/2005  | Hidaka et al. |
| 2005/0161726 | A1 | | 7/2005  | Shin et al. |
| 2008/0073683 | A1 | | 3/2008  | Hidaka et al. |

FOREIGN PATENT DOCUMENTS

| CN | 1652336 A      | 8/2005 |
| JP | 2000-091270 A  | 3/2000 |
| JP | 2001-237392 A  | 8/2001 |

(Continued)

OTHER PUBLICATIONS

International Search Report of PCT/JP2007/061978, mailing date of Aug. 28, 2007.

(Continued)

*Primary Examiner* — Roy Potter
(74) *Attorney, Agent, or Firm* — Fujitsu Patent Center

(57) ABSTRACT

In a semiconductor device manufacturing method, an amorphous or microcrystalline metal oxide film is formed over a first metal film which is preferentially oriented along a predetermined crystal plane. After that, a ferroelectric film is formed by a MOCVD method. When the ferroelectric film is formed, the metal oxide film formed over the first metal film is reduced to a second metal film and the ferroelectric film is formed over the second metal film. When the ferroelectric film is formed, the amorphous or microcrystalline metal oxide film is apt to be reduced uniformly. As a result, the second metal film the orientation of which is good is obtained and the ferroelectric film the orientation of which is good is formed over the second metal film. After the ferroelectric film is formed, an upper electrode is formed over the ferroelectric film.

20 Claims, 43 Drawing Sheets

FOREIGN PATENT DOCUMENTS

| | | |
|---|---|---|
| JP | 2002-110935 A | 4/2002 |
| JP | 2002-151656 A | 5/2002 |
| JP | 2002-261251 A | 9/2002 |
| JP | 2003-068991 A | 3/2003 |
| JP | 2003-197874 A | 7/2003 |
| JP | 2003-282844 A | 10/2003 |
| JP | 2004-253627 A | 9/2004 |
| JP | 2005-159165 A | 6/2005 |

OTHER PUBLICATIONS

Chinese Office Action dated Jul. 5, 2010, issued in corresponding Chinese Patent Application No. 200780053264.1.

* cited by examiner

SEMICONDUCTOR DEVICE MANUFACTURING METHOD AND SEMICONDUCTOR DEVICE

This application is a continuing application, filed under 35 U.S.C. §111(a), of International Application PCT/JP2007/061978, filed on Jun. 14, 2007.

FIELD

The embodiments discussed herein are related to a semiconductor device manufacturing method and a semiconductor device.

BACKGROUND

With the development of digital technology, in recent years there is a growing tendency to process or store large-capacity data at high speed. Accordingly, demands have been made that the integration level and performance of semiconductor devices used in electronic apparatus be increased.

To increase the integration level of semiconductor memories such as dynamic random access memories (DRAMs), investigations on a technique for using a ferroelectric material or a high-dielectric-constant material in place of a silicon oxide (SiO) film or a silicon nitride (SiN) film which has traditionally been used for forming a capacitor insulating film are begun.

Flash memories and ferroelectric random access memories (FeRAMs) have traditionally been known as nonvolatile memories in which stored information is not lost at the time of turning off power.

A flash memory has a structure in which a floating gate is embedded in a gate insulating film of an insulated gate field-effect transistor (IGFET). Information is stored by accumulating electric charges on the floating gate. To write/erase information, it is necessary to pass a tunnel current through the insulating film. Accordingly, a comparatively high voltage is applied.

A FeRAM includes a ferroelectric capacitor in which a ferroelectric film used as a capacitor insulating film is between a pair of electrodes. Polarization is caused in the ferroelectric capacitor according to voltage applied between the electrodes. After the applied voltage is eliminated, spontaneous polarization is caused in the ferroelectric capacitor. Inversion of the polarity of the applied voltage causes inversion of the polarity of the spontaneous polarization. This spontaneous polarization is detected and information is read out. Compared with a flash memory, a FeRAM operates at low voltage and enables low-power high-speed writing. The use of a system on chip (SOC) in which a FeRAM is adopted in, for example, an IC card is being examined.

A Bi layer structure compound such as lead zirconate titanate (PZT) or strontium bismuth tantalate ($SrBi_2Ta_2O_9$) is used as a ferroelectric film in a FeRAM. A sol-gel method, a sputtering method, a metal organic chemical vapor deposition (MOCVD) method, or the like is used for forming the ferroelectric film. If the sol-gel method or the sputtering method is used for forming the ferroelectric film, usually an amorphous or microcrystalline ferroelectric film is formed first over a lower electrode. Heat treatment is then performed for changing the crystal structure of the ferroelectric film to a perovskite structure or a Bi layer structure. If the MOCVD method is used for forming the ferroelectric film, the ferroelectric film is formed at a high temperature. Accordingly, a crystal structure such as a perovskite structure or a Bi layer structure is obtained in this formation process.

When an electrode of a ferroelectric capacitor is formed, it is necessary to use a material which is hard to oxidize or which can maintain conductivity even after oxidation. Usually a platinum metal, such as platinum (Pt) or iridium (Ir), or an oxide of a platinum metal, such as iridium oxide ($IrO_X$), is used.

Usually aluminum (Al) is used as a material for forming a wiring of a FeRAM. This is the same with ordinary semiconductor devices.

Demands have been made that the integration level and performance of FeRAMs be increased. This is the same with the other semiconductor devices. Accordingly, it is necessary in the future to reduce the area of cells. The structures of FeRAMs are divided broadly into two categories: a planar structure and a stack structure. However, to reduce the area of cells, it is effective to adopt the stack structure. With a FeRAM having the stack structure, a barrier metal, a lower electrode, a ferroelectric film, and an upper electrode are formed in that order directly over a plug connected to a source/drain region of a transistor to form a ferroelectric capacitor. The barrier metal has the function of preventing the plug from being oxidized. In recent years lower electrodes often have the function of a barrier metal, so it is impossible to clearly differentiate lower electrodes from barrier metals. However, a material such as titanium nitride (TiN), aluminum titanium nitride (TiAlN), Ir, $IrO_2$, Pt, or strontium ruthenate ($SrRuO_3$ (SRO)) is used for forming a member corresponding to the barrier metal and the lower electrode.

To manufacture a FeRAM which has good electrical properties and the product yield of which is high, it is important to exercise control so as to make the orientation of a ferroelectric film included in a ferroelectric capacitor as uniform as possible. The orientation of the ferroelectric film is greatly influenced by the orientation of a lower electrode formed thereunder. Therefore, by exercising control so as to make the orientation of the lower electrode as uniform as possible, it is possible to improve the orientation of the ferroelectric film formed thereover.

In the past, a method for using, for example, an $IrO_2$ (30 nm)-Ir (30 nm)-Ti (30 nm)-TiN (50 nm) laminated structure for a member corresponding to a lower electrode and a barrier metal (see Japanese Laid-open Patent Publication No. 2005-159165) or a method for using a Pt—$PtO_X$—$IrO_X$—Ir laminated structure for a lower electrode for the purpose of decreasing a leakage current passing through a ferroelectric capacitor (see Japanese Laid-open Patent Publication No. 2003-197874) was proposed.

Furthermore, a method for forming an Ir film at a temperature of 400° C. to 550° C. and an $IrO_X$ film at a temperature of 530° C. to 550° C. by the sputtering method at the time of forming a lower electrode by the use of Ir and $IrO_X$ (see Japanese Laid-open Patent Publication No. 2001-237392) or a method for using an $IrO_2$ film in which $IrO_2$/Ir is greater than or equal to 10 from X-ray diffraction intensity at the time of forming a lower electrode by the use of Ir and $IrO_X$ (see Japanese Laid-open Patent Publication No. 2002-151656) was proposed. In addition, a method for forming $IrO_2$—Ir laminated structure continuously by the sputtering method (see Japanese Laid-open Patent Publication No. 2000-91270) or a method for forming an Ir film at a temperature of 450° C. or higher, forming an $IrO_2$ film at a temperature of 300° C. or higher, and performing heat treatment at a temperature of 350° C. or higher for the purpose of improving the orientation of a PZT film (see Japanese Laid-open Patent Publication No. 2003-68991) was proposed.

Moreover, for example, (1) a method for forming an $IrO_{2+}$ film over an Ir film, (2) a method for forming a crystalline IrO$_2$ film over an Ir film, forming an amorphous IrO$_2$ film over the crystalline IrO$_2$ film, reducing the amorphous IrO$_2$ film at the time of forming a PZT film by the MOCVD method, and oxidizing the amorphous IrO$_2$ film again, (3) a method for forming an oxygen-doped Ir film over an Ir film, or (4) a method for forming an IrO$_2$ film over an Ir film, forming an Ir film over the IrO$_2$ film, and diffusing oxygen into the Ir film at the time of forming a PZT film by the MOCVD method was proposed (see Japanese Laid-open Patent Publication No. 2003-282844, U.S. Pat. Nos. 6,500,678, 6,528,328, 6,548,343, 6,596,547, 6,635,497, 6,686,236, and 6,872,669).

In addition, a method for forming an Ir film, forming a crystalline IrO$_2$ film in a surface portion of the Ir film by performing thermal oxidation, and changing the IrO$_2$ film to an amorphous Ir film at the time of forming a PZT film by the MOCVD method was proposed (see Japanese Laid-open Patent Publication No. 2004-253627).

Furthermore, a method for forming an amorphous IrO$_X$ film as or over an upper electrode for the purpose of preventing a PZT film from being degraded chemically or mechanically (see Japanese Laid-open Patent Publication No. 2002-261251) or the like was proposed.

For example, it is assumed that a lower electrode is formed by the use of an Ir film and that a PZT film is formed over the Ir film as a ferroelectric film by the MOCVD method.

If the MOCVD method is used, usually the PZT film is formed at a high temperature of 600° C. or higher. At this time a wafer on which the Ir film the orientation of which is controlled is formed is put first into a chamber. The temperature is raised to a target temperature in an atmosphere of argon (Ar) or oxygen (O$_2$). Material gas is then introduced into the chamber to form the PZT film over the Ir film. From the viewpoint of productivity and polarization, it is preferable that the PZT film be preferentially oriented along the (111) plane. Therefore, it is preferable that the Ir film formed under the PZT film be preferentially oriented along the (111) plane.

However, if the temperature is raised in an atmosphere of Ar at the time of forming the PZT film by the MOCVD method, not only the (111) plane but also the (100) or (101) plane of the PZT film formed is generated. Accordingly, the (111) orientation ratio of the PZT film decreases. As a result, the electrical properties (switching electric charge amount) of a ferroelectric capacitor deteriorate.

Furthermore, if the temperature is raised in an atmosphere of O$_2$ at the time of forming the PZT film by the MOCVD method, several problems arise. A first problem is as follows. If a PZT film is formed continuously over a plurality of wafers, variation in the (111) (or (222)) orientation ratio of a PZT film tends to occur among the plurality of wafers.

FIGS. 40 through 43 illustrate results obtained by checking the orientation of PZT films formed over a plurality of wafers. FIG. 40 illustrates the (111) integrated intensity of a PZT film in a central portion of each wafer. FIG. 41 illustrates the (111) integrated intensity of a PZT film in an edge portion of each wafer. FIG. 42 illustrates the (222) orientation ratio of a PZT film in a central portion of each wafer. FIG. 43 illustrates the (222) orientation ratio of a PZT film in an edge portion of each wafer.

The (222) orientation ratio of a PZT film is calculated by the following formula (1).

(222) orientation ratio of $PZT$ film (%)={(222) integrated intensity of $PZT$ film}/{(100) integrated intensity of $PZT$ film+(101) integrated intensity of $PZT$ film+(222) integrated intensity of $PZT$ film}×100 (1)

where (222) ((111)) integrated intensity of PZT film, (100) integrated intensity of PZT film, and (101) integrated intensity of PZT film are calculated from measurement results obtained by the use of an X-ray diffraction apparatus.

As illustrated in FIGS. 40 and 41, if the temperature is raised in an atmosphere of O$_2$ at the time of forming a PZT film continuously over each of the plurality of wafers by the MOCVD method, there is significant variation in the (111) integrated intensity of a PZT film among the plurality of wafers, whether in a central portion or an edge portion of a wafer. As illustrated in FIGS. 42 and 43, the (222) orientation ratio of a PZT film is unstable and low. The (222) orientation ratio of a PZT film is very low especially in an edge portion of a wafer.

A second problem is that the surface of the PZT film formed tends to become rough. Extreme surface roughness or what is called cloudiness tends to appear especially in an edge portion of the wafer.

The reason for the arising of these problems is that when the temperature is raised in an atmosphere of O$_2$, the Ir film of the lower electrode is oxidized with O$_2$ gas. In principle, an IrO$_X$ film to which the Ir film is oxidized can be reduced again to Ir with a solvent component (such as tetrahydrofuran (THF) or butyl acetate) contained in material gas which is introduced after the temperature is raised. However, when the temperature is raised in an atmosphere of O$_2$, abnormal oxidation of the Ir film tends to occur. When the IrO$_X$ film formed by such abnormal oxidation is reduced with the solvent component contained in the material gas, the orientation of an Ir film after the reduction degrades or the IrO$_X$ film cannot be reduced completely. As a result, the orientation of the PZT film formed over the Ir film degrades.

In the past, a method for forming a crystalline IrO$_X$ film over an Ir film was proposed. However, if a PZT film is formed by the MOCVD method, it is difficult to reduce the crystalline IrO$_X$ film uniformly at the time of forming the PZT film, or the crystalline IrO$_X$ film cannot be reduced completely to an Ir film. As a result, there is variation in the distribution of the (111) orientation of a PZT film on a wafer or among wafers or an orientation ratio higher than or equal to a certain level cannot be ensured stably.

SUMMARY

According to an aspect of the invention, a method for manufacturing a semiconductor device including a ferroelectric capacitor includes: forming a first metal film electrically connected to a transistor; forming an amorphous or microcrystalline metal oxide film over the first metal film; reducing the metal oxide film to a second metal film and forming a ferroelectric film over the second metal film; and forming a conductive film over the ferroelectric film.

According to another aspect of the invention, a semiconductor device including a ferroelectric capacitor includes: a first metal film electrically connected to a transistor; a second metal film which is formed over the first metal film and in which a diameter of crystal grains is smaller than a diameter of crystal grains in the first metal film; a ferroelectric film formed over the second metal film; and a conductive film formed over the ferroelectric film.

The objects and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWING(S)

DESCRIPTION OF EMBODIMENT(S)

Figure 1:
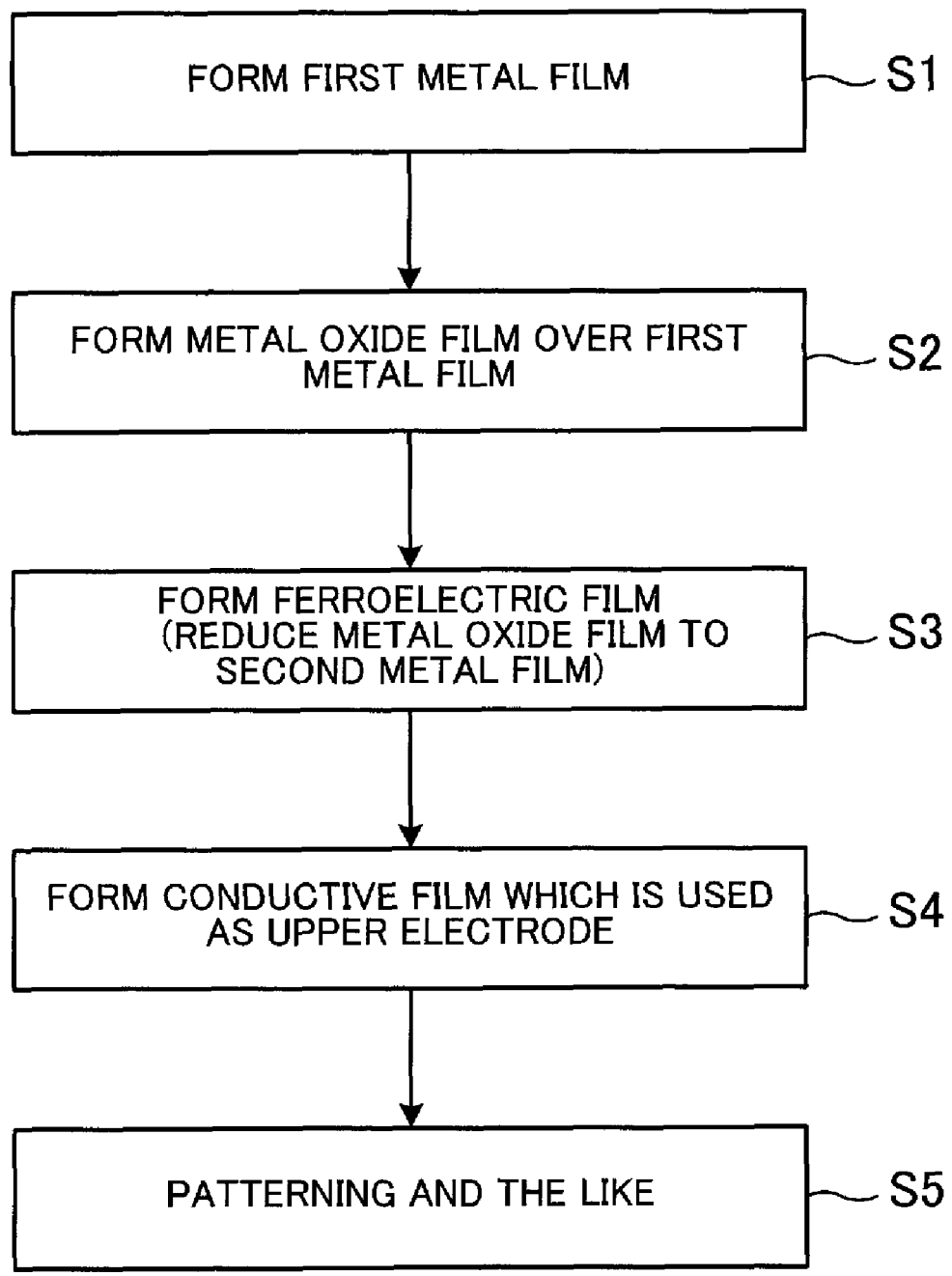
FIG. 1 illustrates an example flow of forming a ferroelectric capacitor.

Embodiments of the present invention will now be described in detail with reference to the accompanying drawings, wherein like reference numerals refer to like elements throughout.

FIG. 1 illustrates an example flow of forming a ferroelectric capacitor.

A ferroelectric capacitor includes a lower electrode electrically connected to a transistor formed over a semiconductor substrate (for example, formed over plugs connected to a transistor), a ferroelectric film formed over the lower electrode, and an upper electrode formed over the ferroelectric film.

To form such a ferroelectric capacitor, a metal film (first metal film) which corresponds to part (lower layer portion) of the lower electrode is formed first (step S1). The first metal film is formed under conditions under which the first metal film is preferentially oriented along a predetermined crystal plane.

For example, a noble metal film which contains Ir, rhodium (Rh), palladium (Pd), ruthenium (Ru), or the like or a laminated structure including two or more such noble metal films can be used as the first metal film. An alloy film which contains two or more of Ir, Rh, Pd, and Ru or a laminated structure including two or more such alloy films may be used as the first metal film.

After the first metal film is formed, a metal oxide film which also corresponds to part (upper layer portion) of the lower electrode is formed over the first metal film (step S2).

For example, a noble metal oxide film which contains Ir, Rh, Pd, Ru, or the like or a laminated structure including two or more such noble metal oxide films can be used as the metal oxide film. An alloy oxide film which contains two or more of Ir, Rh, Pd, and Ru or a laminated structure including two or more such alloy oxide films may be used as the metal oxide film.

When the metal oxide film is formed over the first metal film in step S2, an amorphous or microcrystalline (polycrystalline) metal oxide film formed over the first metal film has predetermined thickness and is thinner than the first metal film. In the present invention, an incomplete crystal state in which amorphousness and crystal grains mingle is referred to as a microcrystal state.

After the metal oxide film is formed, a ferroelectric film is formed by the MOCVD method (step S3).

For example, La-doped PZT (PLZT), a PZT type material doped with a minute amount of calcium (Ca), strontium (Sr), silicon (Si), or the like, or a Bi layer structure compound such as SBT or strontium bismuth tantalate niobate ($SrBi_2(Ta,Nb)_2O_9$ or SBTN) can be used as a material for the ferroelectric film in place of PZT.

To form a ferroelectric film by the MOCVD method, a wafer over which the first metal film and the metal oxide film of the lower electrode are formed is put into a chamber, the temperature is raised to a predetermined temperature in a predetermined atmosphere, and material gas for the ferroelectric film is introduced into the chamber. The material gas contains a solvent component such as TFT or butyl acetate.

When the temperature of the wafer is raised and the material gas is introduced into the chamber, the metal oxide film corresponding to the upper layer portion of the lower electrode is reduced with the solvent component contained in the material gas. As a result, a structure in which another metal film (second metal film) is formed over the first metal film corresponding to the lower layer portion of the lower electrode is finally obtained. In addition, after or at the same time that the structure is obtained, a ferroelectric film is formed over the second metal film with a material component contained in the material gas.

In the process of forming the ferroelectric film, the metal oxide film formed is in an amorphous or microcrystalline state. Therefore, the metal oxide film is apt to be reduced uniformly with the solvent component contained in the material gas. The thickness of the metal oxide film should be set in advance so that the metal oxide film will be reduced completely in the process of forming the ferroelectric film. The diameter of crystal grains formed in the second metal film which is finally obtained by the reduction is smaller than that of crystal grains formed in the first metal film formed thereunder.

In the above step S1 in which the first metal film is formed or the above step S2 in which the metal oxide film is formed, conditions under which the first metal film or the metal oxide film is formed are set properly in advance so that the first metal film in a predetermined crystal state or the metal oxide film with predetermined thickness will be obtained. By doing so, the second metal film the orientation of which is good is obtained by the reduction in step S3 in which the ferroelectric film is formed. Therefore, the orientation of the ferroelectric film formed over the second metal film is very good. In addition, variation in the distribution of orientation on a wafer or among wafers can be made small.

After the ferroelectric film is formed by the MOCVD method, another ferroelectric film may be formed by the sputtering method or the like at need in order to planarize the surface of the ferroelectric film.

After the ferroelectric film is formed, a predetermined conductive film which is used as the upper electrode is formed over the ferroelectric film (step S4).

After that, patterning and the formation of a protection film (which blocks out hydrogen or moisture) are performed on a lamination which is made up of the lower electrode having a laminated structure including the first metal film and the second metal film, the ferroelectric film, and the upper electrode (step S5) to form a ferroelectric capacitor.

After that, an interlayer dielectric film, plugs, wirings, and the like are formed by an ordinary method to complete a FeRAM. Usually predetermined heat treatment is performed on the ferroelectric film of the ferroelectric capacitor at a proper stage so that, for example, the ferroelectric film will recover from damage done in the process of manufacturing the FeRAM.

By following the flow of forming a ferroelectric capacitor illustrated in FIG. 1, the orientation of the lower electrode and the ferroelectric film formed thereover can be improved. In addition, variation in the distribution of orientation on a wafer or among wafers can be controlled. Accordingly, a ferroelectric capacitor with high reliability in which a switching electric charge amount is large can be formed. As a result, a high-performance FeRAM with high reliability can be realized.

An example of manufacturing a FeRAM by utilizing the above principle will now be described concretely.

A first embodiment of the present invention will now be described first.

FIGS. 2 through 10 are views for describing steps for manufacturing a FeRAM. These steps will be described in order.

Figure 2:
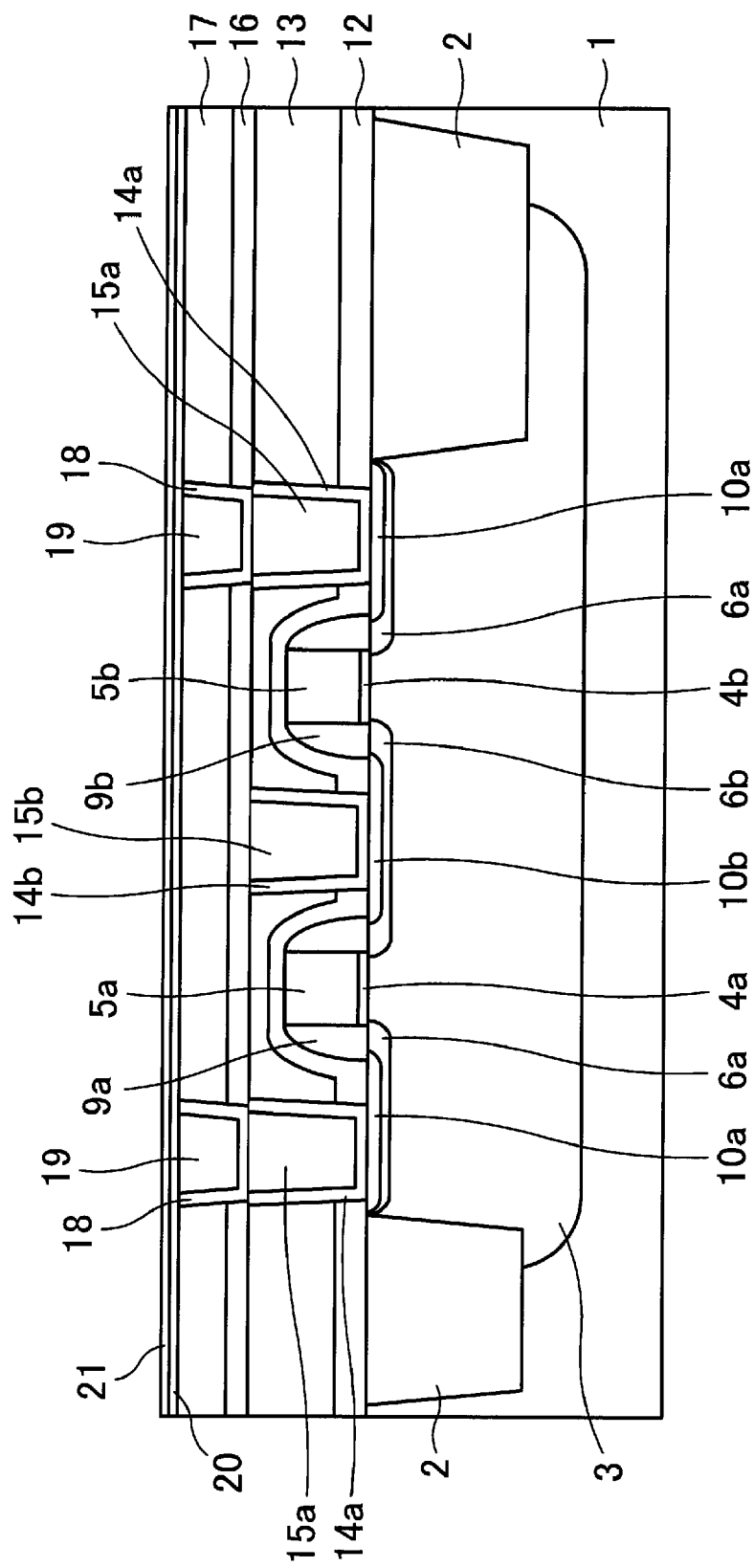
FIG. 2 is a fragmentary schematic sectional view of a FeRAM after the formation of a foundation of a lower electrode.

FIG. 2 is a fragmentary schematic sectional view of a FeRAM after the formation of a foundation of a lower electrode.

Shallow trench isolations (STIs) 2 for defining an active region for a transistor are formed first in an n- or p-type Si substrate 1. An isolation region may be formed in place of the STIs 2 by a local oxidation of silicon (LOCOS) method.

The active region of the Si substrate 1 is then doped with p-type impurities to form a p well 3. After that, the surface of the active region is thermally oxidized. After the thermal oxidation is performed, an amorphous or polycrystalline Si film is formed over an entire surface and patterning is performed. By doing so, gate insulating films 4a and 4b and gate electrodes 5a and 5b are formed.

n-type impurity ions are then implanted with the gate electrodes 5a and 5b as masks to form first and second source/drain extension regions 6a and 6b in the Si substrate 1 on both sides of the gate electrodes 5a and 5b. After that, an insulating film such as a SiO film is formed over an entire surface by a CVD method and an etch-back is performed. By doing so, side walls 9a and 9b are formed on the sides of the gate electrodes 5a and 5b respectively. n-type impurity ions are implanted with the gate electrodes 5a and 5b and the side walls 9a and 9b as masks to form first and second source/drain regions 10a and 10b in the Si substrate 1 on both sides of the gate electrodes 5a and 5b.

By following the above steps, two metal oxide semiconductor (MOS) transistors are formed in the active region of the Si substrate 1.

A refractory metal film such as a cobalt (Co) film is then formed over an entire surface by the sputtering method and is heated. By doing so, the surfaces of the first and second source/drain regions 10a and 10b and the gate electrodes 5a and 5b are silicidated. After that, a silicon oxide nitride (SiON) film with a thickness of 200 nm is formed over an entire surface by a plasma CVD method. This SiON film is a cover insulating film 12. A SiO film (first interlayer dielectric film) 13 with a thickness of 1,000 nm is formed over the cover insulating film 12 by the plasma CVD method using tetraethylorthosilicate (TEOS) gas. The surface of the first interlayer dielectric film 13 is polished by a chemical mechanical polishing (CMP) method and is planarized. After the surface of the first interlayer dielectric film 13 is planarized, the thickness of the first interlayer dielectric film 13 from the flat surface of the Si substrate 1 becomes 700 nm.

The patterning of the first interlayer dielectric film 13 and the cover insulating film 12 is then performed by photolithography to form contact holes with a diameter of, for example, 0.25 μm which connect with the first and second source/drain regions 10a and 10b. After a Ti film with a thickness of 30 nm and a TiN film with a thickness of 20 nm are formed over an entire surface, a tungsten (W) film with a thickness of 300 nm is formed by the CVD method and an excess W film, TiN film, and Ti film are removed by the CMP method. By doing so, W plugs 15a and 15b are formed in the contact holes with adhesive films (glue films) 14a and 14b, respectively, each including a Ti film and a TiN film between.

In the above CMP step, slurry, such as SSW2000 manufactured by Cabot Microelectronics Corporation, by which the speed of the polishing of the W film, the TiN film, and the Ti film becomes higher than the speed of the polishing of the first interlayer dielectric film 13 formed thereunder is used. The amount of polishing set in the CMP step is larger than the total of the thickness of the W film, the TiN film, and the Ti film so that a polishing residue will not be left on the first interlayer dielectric film 13. That is to say, over-polishing is performed.

A SiON film (anti-oxidation film) 16 with a thickness of 130 nm is then formed over an entire surface by the plasma CVD method. A SiO film (second interlayer dielectric film) 17 with a thickness of 300 nm is formed over the SiON film 16 by the plasma CVD method using TEOS as a material. A SiN film or an aluminum oxide (AlO) film may be formed as the anti-oxidation film 16 in place of a SiON film. After that, contact holes which pierce through the second interlayer dielectric film 17 and the anti-oxidation film 16 and which connect with the W plugs 15a connected to the first source/drain regions 10a are formed. Glue films 18 and W plugs 19 are formed in the contact holes. This is the same with the glue films 14a and 14b and W plugs 15a and 15b.

After the glue films 18 and the W plugs 19 are formed, ammonia ($NH_3$) plasma treatment is then performed on a surface. By performing $NH_3$ plasma treatment, NH radicals combine with O atoms on the second interlayer dielectric film 17. Even if a Ti film is formed over the second interlayer dielectric film 17 as described later, Ti atoms of the Ti film are not captured by O atoms and are apt to move on the second interlayer dielectric film 17. As a result, a Ti film which is self-organized and which is preferentially oriented along the (002) plane can be formed over the second interlayer dielectric film 17.

For example, when the above $NH_3$ plasma treatment is performed, a parallel plate plasma treatment system having an opposite electrode at a distance of 9 mm from a wafer to be treated is used. $NH_3$ gas is supplied to a chamber in which the temperature of a substrate is kept at 400° C. at a flow rate of 350 sccm under a pressure of 266 Pa. 100 watts of high-frequency electric power at a frequency of 13.56 megahertz is supplied to the wafer to be treated for 60 seconds and 55 watts of high-frequency electric power at a frequency of 350 kilohertz is supplied to the opposite electrode for 60 seconds.

After the above $NH_3$ plasma treatment is performed, a sputtering system in which the distance between the wafer to be treated and a target is set to, for example, 60 mm is used. The temperature of the substrate is set to 20° C. and a Ti film with a thickness of 20 nm is formed by supplying 2.6 kilowatts of sputtering power for 5 seconds in an atmosphere of Ar under a pressure of 0.15 Pa. As described above, this Ti film can be preferentially oriented along the (002) plane.

After the $NH_3$ plasma treatment is performed and the Ti film is formed, rapid thermal anneal (RTA) treatment is performed for 60 seconds at a temperature of 650° C. in an atmosphere of nitrogen ($N_2$) to nitride the Ti film. By doing so, a TiN film (foundation conductive film) 20 which is preferentially oriented along the (111) plane and which performs the function of improving the orientation of a film formed thereover is formed. An anti-oxidation film 21 which is a TiAlN film is then formed over the foundation conductive film 20. The TiAlN film has a thickness of 100 nm and is formed by reactive sputtering in an atmosphere of mixed gas in which the flow rates of Ar gas and $N_2$ gas are 40 sccm and 10 sccm respectively under a pressure of 253.3 Pa. At this time an alloy of, for example, Ti and Al is used as a target, the temperature of the substrate is set to 400° C., and 1.0 kilowatt of sputtering power is supplied.

BY performing the above steps, the state illustrated in FIG. 2 is obtained.

Figure 3:
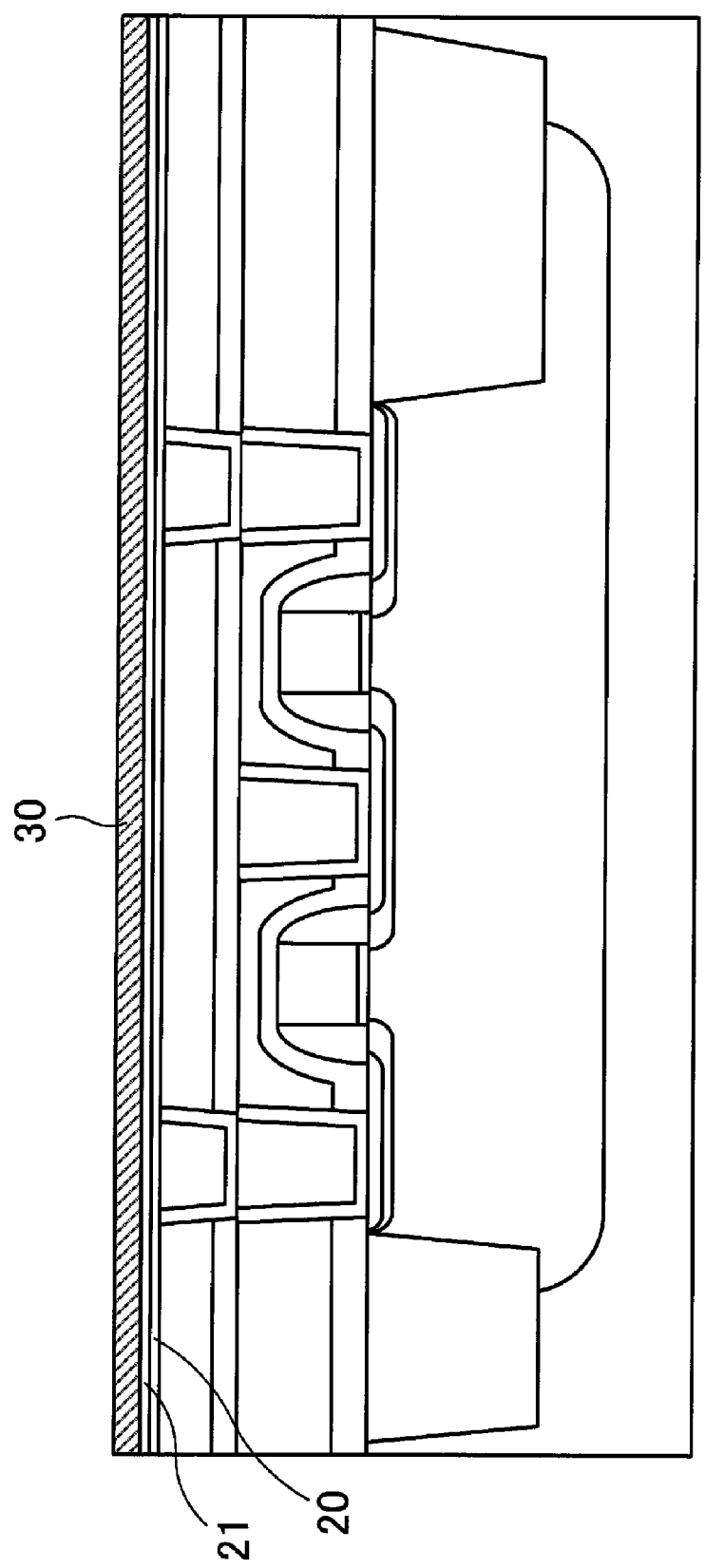
FIG. 3 is a fragmentary schematic sectional view of the step of forming a metal film for the lower electrode.

FIG. 3 is a fragmentary schematic sectional view of the step of forming a metal film for the lower electrode.

After the anti-oxidation film 21 is formed, an Ir film 30 is formed over the anti-oxidation film 21 as a metal film corresponding to a lower layer portion of the lower electrode as illustrated in FIG. 3. For example, the Ir film 30 has a thickness of 60 nm to 100 nm and is formed in an atmosphere of Ar gas under a pressure of 0.2 Pa by setting the temperature of the substrate to 450° C. and supplying 0.3 kilowatts of sputtering power.

Furthermore, to improve the orientation of the Ir film 30 formed, RTA treatment is performed for 60 seconds in an atmosphere of an inert gas (Ar gas, for example) at a temperature of 650° C. to 750° C. By doing so, the Ir film 30 which is preferentially oriented along a predetermined crystal plane (along the (111) plane, for example) is obtained. A Ru film, Rh film, Pd film, or the like may be used as the metal film in place of the Ir film 30.

Figure 4:
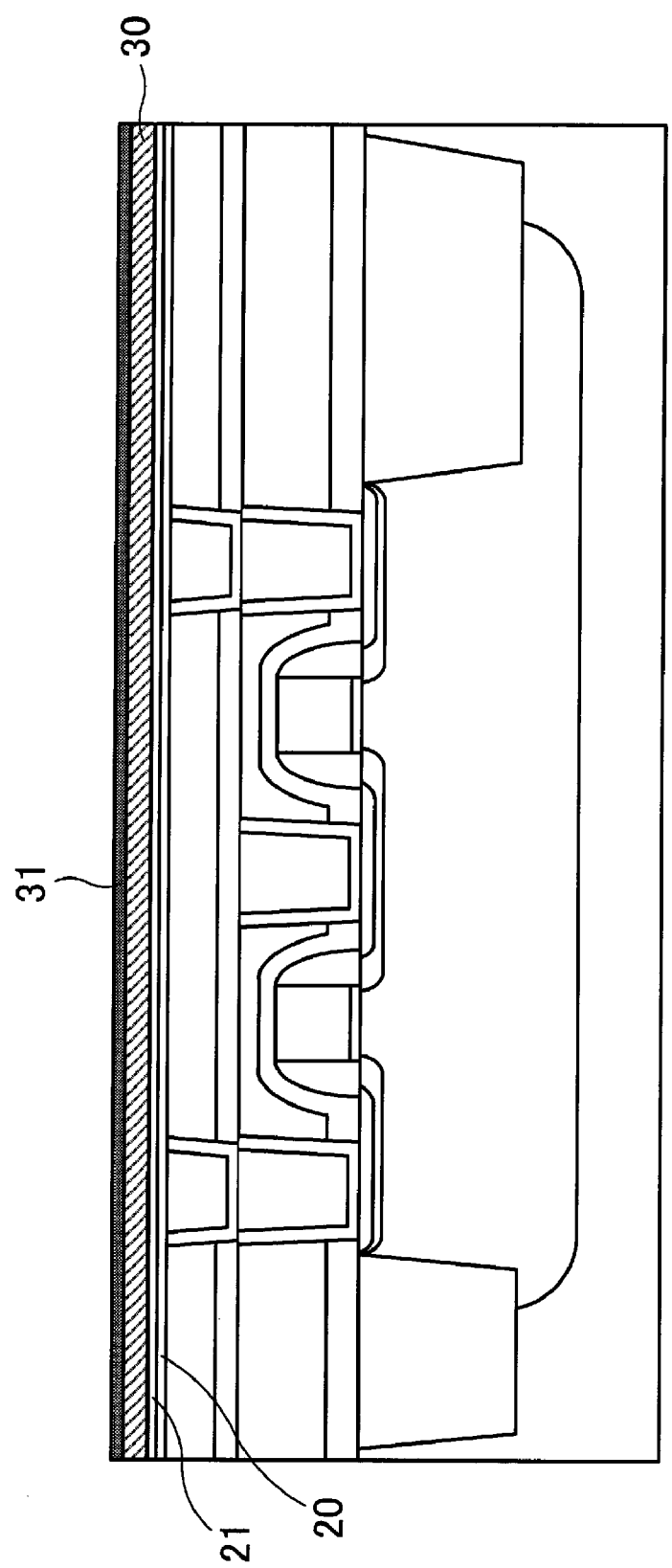
FIG. 4 is a fragmentary schematic sectional view of the step of forming a metal oxide film for the lower electrode.

FIG. 4 is a fragmentary schematic sectional view of the step of forming a metal oxide film for the lower electrode.

After the Ir film 30 is formed, an amorphous or microcrystalline $IrO_X$ film 31 is formed over the Ir film 30 as a metal oxide film corresponding to an upper layer portion of the lower electrode as illustrated in FIG. 4. For example, the $IrO_X$ film 31 has a thickness of 5 nm to 50 nm and is formed in an atmosphere of mixed gas which contains Ar gas and $O_2$ gas under a pressure of 0.11 Pa by setting the temperature of the substrate to 20° C. to 300° C. and supplying 1 kilowatt of sputtering power.

The details of conditions (temperature, thickness, a rate, and the ratio of $O_2$ gas in mixed gas which contains Ar gas and $O_2$ gas) under which the $IrO_X$ film 31 is formed will be described later.

Figure 5:
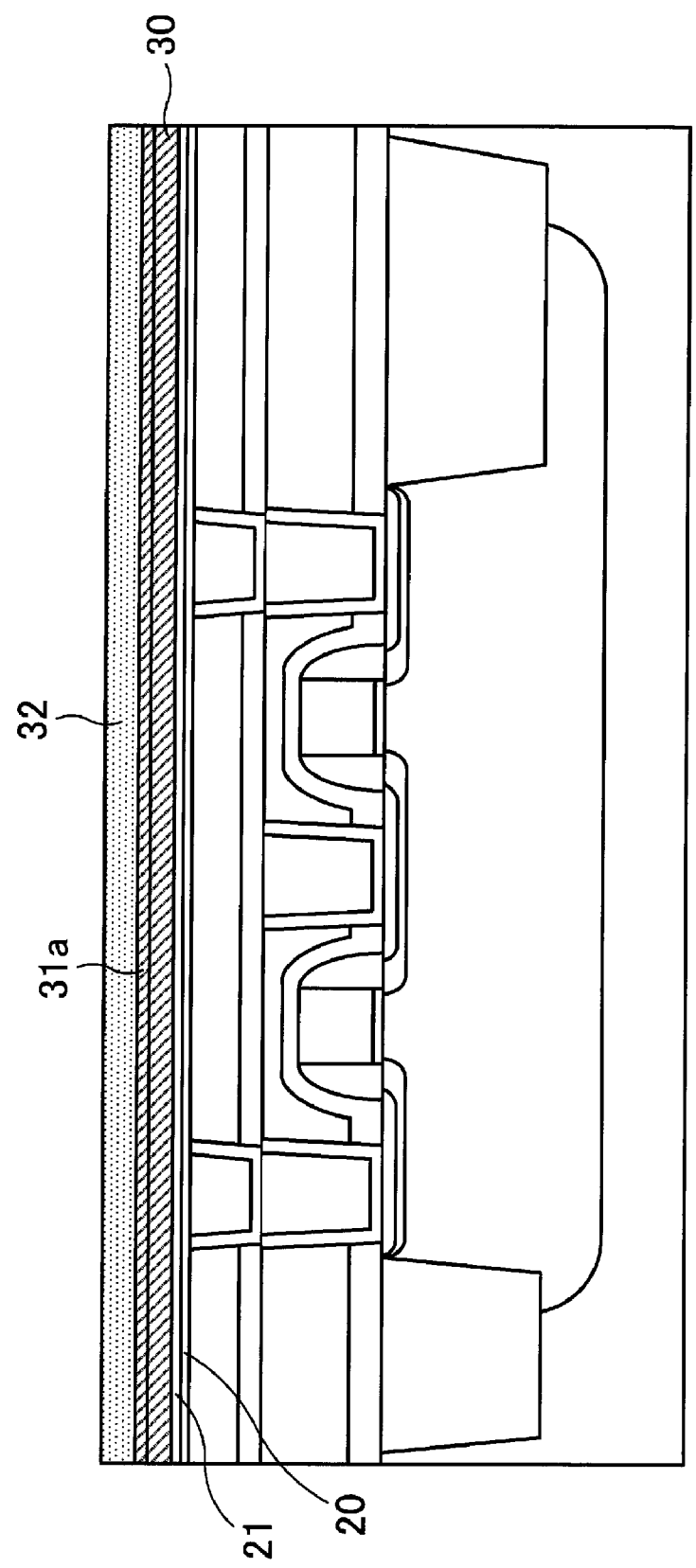
FIG. 5 is a fragmentary schematic sectional view of the step of forming a ferroelectric film.

FIG. 5 is a fragmentary schematic sectional view of the step of forming a ferroelectric film.

After the $IrO_X$ film 31 is formed, a PZT film 32 is formed as a ferroelectric film. To form the PZT film 32, a first PZT film is formed first by the MOCVD method and a second PZT film is formed over the first PZT film.

The first PZT film can be formed by, for example, the following method.

Bisdipivaloyl methanate lead ($Pb(DPM)_2$) is used as a material for Pb, tetrakisdimethyl heptane dionate zirconium ($Zr(DMHD)_4$) is used as a material for Zr, and bisisopropoxy bisdipivaloyl methanate titanium ($Ti(O-iPr)_2(DPM)_2$) is used as a material for Ti. Each substance is dissolved in THF used as a solvent so that a concentration of 0.3 mol/l will be obtained. By doing so, liquid materials for Pb, Zr, and Ti are prepared. The liquid materials for Pb, Zr, and Ti are then supplied to an evaporator of a MOCVD system at flow rates of 0.326 ml/min., 0.200 ml/min., and 0.200 ml/min., respectively, and are vaporized. At this time THF used as a solvent is also supplied to the evaporator at a flow rate of 0.474 ml/min. and is vaporized. By doing so, material gas for Pb, Zr, and Ti is prepared. $O_2$ gas is introduced into a chamber and temperature is raised. After that, the material gas is introduced into the chamber in which, for example, the temperature of the substrate is kept at 620° C. in an atmosphere of mixed gas which contains Ar gas and $O_2$ gas under a pressure of 665 Pa, and is made to react for 620 seconds. As a result, the first PZT film with a thickness of 100 nm is formed.

In the process of forming the first PZT film, the $IrO_X$ film 31 illustrated in FIG. 4 is finally reduced to an Ir film 31a with a THF solvent component contained in the material gas for Pb, Zr, and Ti. The $IrO_X$ film 31 is amorphous or microcrystalline. Accordingly, the $IrO_X$ film 31 is uniformly oxidized (crystallized) first at the time of raising the temperature in an atmosphere of $O_2$ gas, and is then reduced uniformly to the Ir film 31a which is preferentially oriented along a predetermined crystal plane on the basis of the orientation of the Ir film 30 formed thereunder and in which the diameter of crystal grains is small in a reduction atmosphere after the introduction of the material gas. The first PZT film which is preferentially oriented along a predetermined crystal plane on the basis of the orientation of the Ir film 31a is formed over the Ir film 31a obtained in this way. The average diameter of crystal grains in the Ir film 31a to which the amorphous or microcrystalline $IrO_X$ film 31 is reduced is not larger than about 20 nm.

If a crystalline $IrO_X$ film is formed in place of the above amorphous or microcrystalline $IrO_X$ film 31, abnormal oxidation tends to occur at the time of raising the temperature in an atmosphere of $O_2$ gas. Accordingly, when the material gas is then introduced, it is difficult to uniformly reduce the $IrO_X$ film with the solvent component contained in the material gas. Therefore, it is difficult to form a uniform Ir film, like the Ir film 31a, in which the diameter of crystal grains is small.

By forming the amorphous or microcrystalline $IrO_X$ film 31 and forming the uniform Ir film 31a in which the diameter of crystal grains is small, the orientation of the first PZT film formed thereover is improved and a stable yield can be realized. An interface between the lower electrode and the ferroelectric film the orientation of which is uniform is favorable especially for low-voltage operation. In addition, if the first PZT film is formed in this way, what is called cloudiness, for example, does not appear and the first PZT film having a clean surface can be formed.

The details of the characteristics of the first PZT film obtained through the formation of the above amorphous or microcrystalline $IrO_X$ film 31 will be described later.

After the first PZT film is formed, a second amorphous PZT film with a thickness of 1 nm to 30 nm is formed over an entire surface by, for example, the sputtering method. By forming the second PZT film, the flatter PZT film 32 is obtained. The second PZT film may be formed by the MOCVD method. In this case, $Pb(DPM)_2$ is used as a material for Pb, $Zr(DMHD)_4$ is used as a material for Zr, and $Ti(O-iPr)_2(DPM)_2$ is used as a material for Ti. Each substance is dissolved in THF used as a solvent. By doing so, liquid materials for Pb, Zr, and Ti are prepared. The liquid materials for Pb, Zr, and Ti are used for preparing material gas for Pb, Zr, and Ti.

By forming the first PZT film and the second PZT film in this way, the PZT film 32 is formed over the Ir film 31a as illustrated in FIG. 5.

Figure 6:
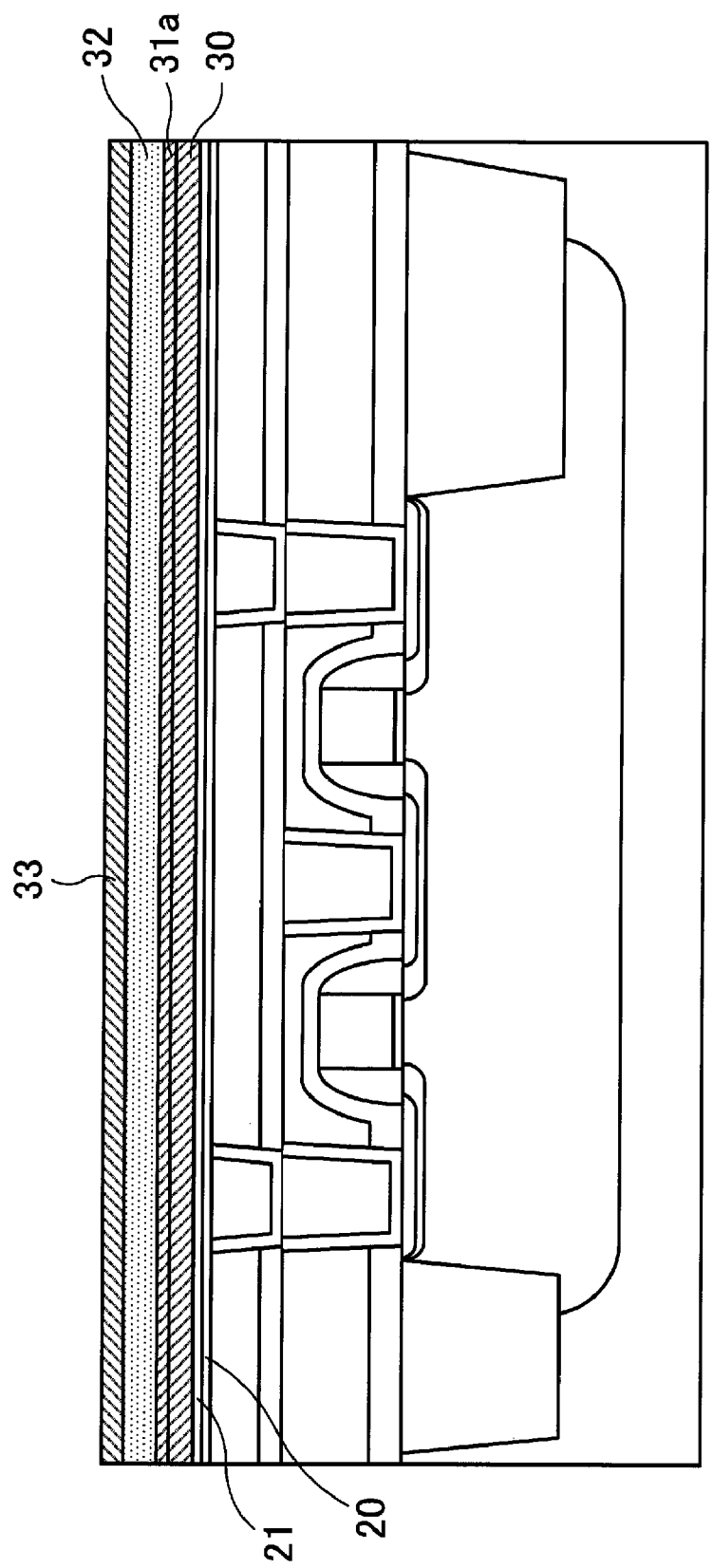
FIG. 6 is a fragmentary schematic sectional view of the step of forming an upper electrode.

FIG. 6 is a fragmentary schematic sectional view of the step of forming an upper electrode.

After the PZT film 32 is formed, an upper electrode 33 is formed. The upper electrode 33 can be formed by, for example, the following method.

An $IrO_X$ film with a thickness of 25 nm which is crystalline at the time of being formed is formed first over the PZT film 32 by the sputtering method. This $IrO_X$ film is formed by, for example, supplying about 1 kilowatts to 2 kilowatts of sputtering power at a temperature of 300° C. in an atmosphere of mixed gas which contains Ar gas and $O_2$ gas the flow rates of which are 140 sccm and 60 sccm respectively.

Heat treatment is then performed by the RTA method for 60 seconds at a temperature of 725° C. in an atmosphere of mixed gas which contains Ar gas and $O_2$ gas the flow rates of which are 2,000 sccm and 20 sccm respectively. This heat treatment is performed in order to make up for oxygen deficiency in the PZT film 32 by crystallizing the PZT film 32 completely and to repair plasma damage caused at the time of forming the $IrO_X$ film for the upper electrode.

An $IrO_Y$ film with a thickness of 50 nm to 150 nm is then formed. If deposition is performed by, for example, supplying 1.0 kilowatt of sputtering power for 45 seconds in an atmosphere of Ar gas under a pressure of 0.8 Pa, then an $IrO_Y$ film with a thickness of 125 nm can be formed. To prevent the $IrO_Y$ film from growing abnormally, it is desirable that the $IrO_Y$ film be formed at a temperature of 100° C. or lower. In addition, to control catalysis on hydrogen, prevent the PZT film 32 from being reduced with hydrogen radicals, and increase the resistance of a ferroelectric capacitor to hydrogen, it is desirable that the $IrO_Y$ film be formed so as to have composition close to the stoichiometry of $IrO_2$.

An Ir film which functions as a hydrogen barrier film and a conductivity improvement film is then formed over the $IrO_Y$ film by the sputtering method. For example, an Ir film with a thickness of 50 nm to 100 nm is formed by supplying 1.0 kilowatt of sputtering power in an atmosphere of Ar under a pressure of 1 Pa.

The upper electrode 33 having an Ir—$IrO_Y$—$IrO_X$ laminated structure is formed in this way.

When the upper electrode 33 is formed, an Ir film, a Ru film, a Rh film, a rhenium (Re) film, an osmium (Os) film, a Pd film, an oxide film which contains one of these elements, a conductive oxide film such as a SRO film, or a laminated structure including some of these films may be used in place of the $IrO_X$ film or the $IrO_Y$ film. Furthermore, a Ru film, a Rh film, a Pd film, or the like may be used in place of the Ir film which is the uppermost layer of the upper electrode 33.

Figure 7:
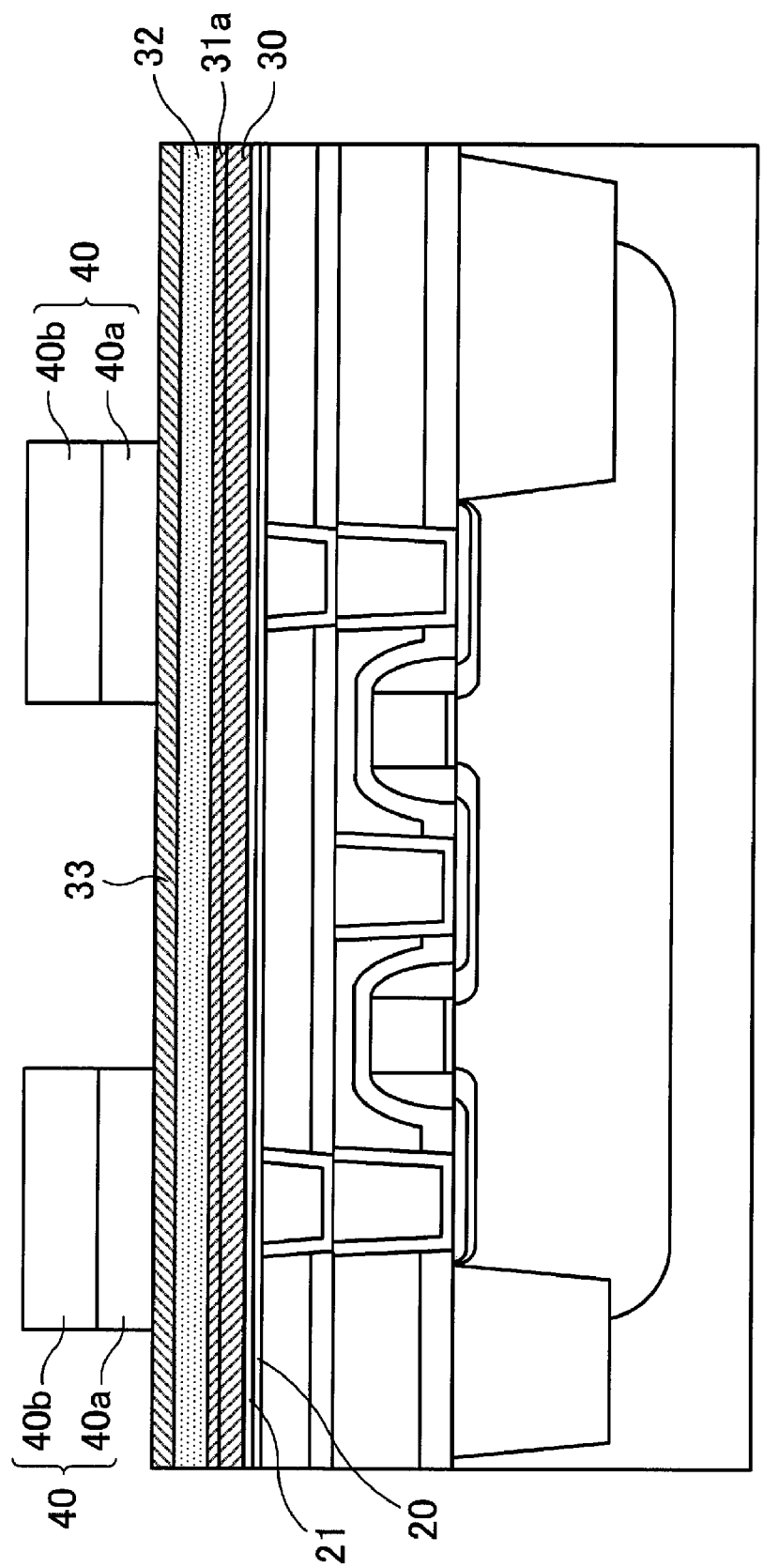
FIG. 7 is a fragmentary schematic sectional view of the step of forming a hard mask for ferroelectric capacitor patterning.
Figure 8:
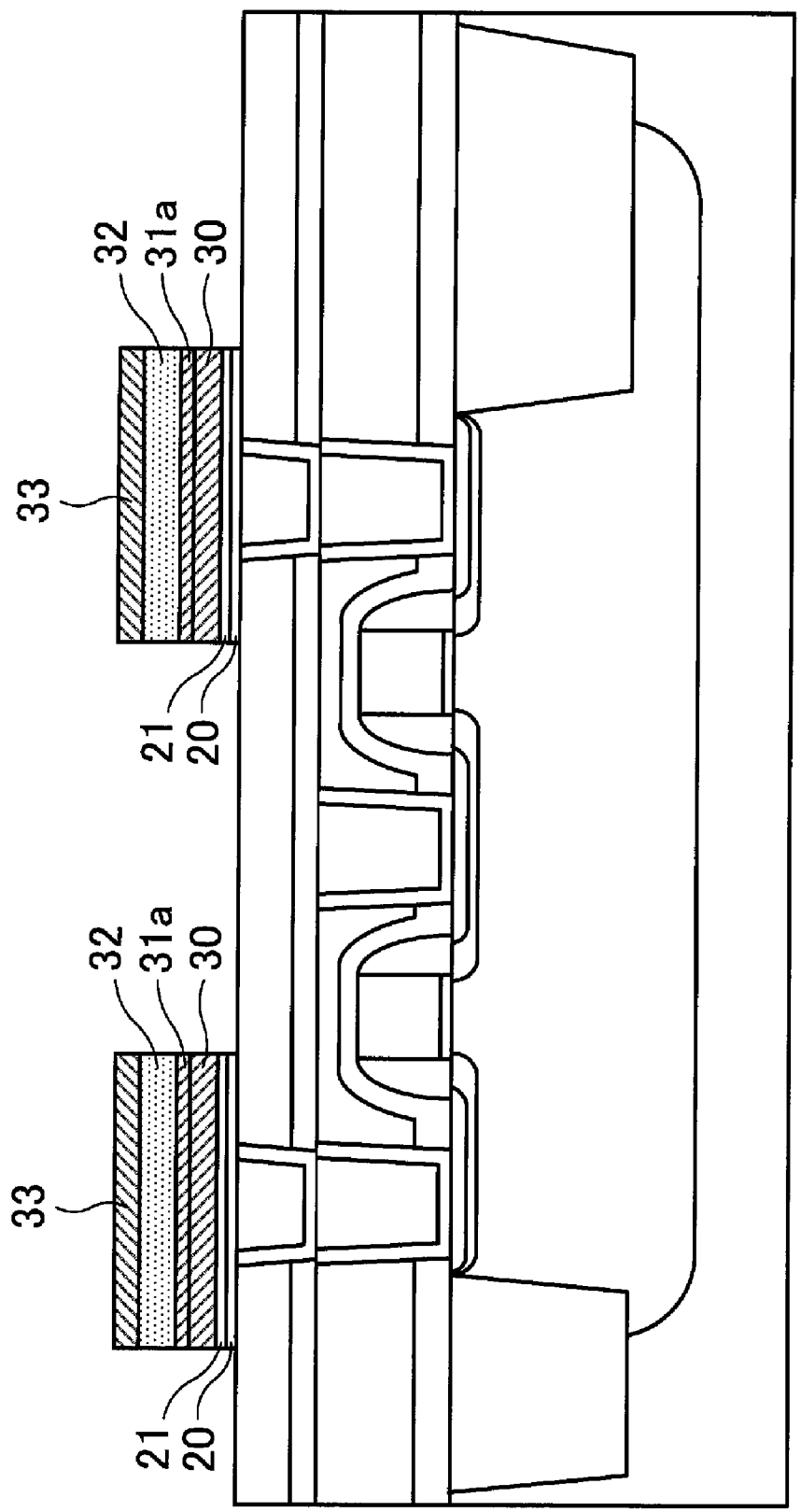
FIG. 8 is a fragmentary schematic sectional view of a ferroelectric capacitor patterning step.

FIG. 7 is a fragmentary schematic sectional view of the step of forming a hard mask for ferroelectric capacitor patterning. FIG. 8 is a fragmentary schematic sectional view of a ferroelectric capacitor patterning step.

After the upper electrode 33 is formed, a back side of the wafer is cleaned. After that, a hard mask 40 including a first mask layer 40a and a second mask layer 40b is formed for ferroelectric capacitor patterning. This hard mask 40 is formed by, for example, the following method.

A TiN film or a TiAlN film is formed first over an entire surface as the first mask layer 40a by the sputtering method. A SiO film is formed over the first mask layer 40a as the second mask layer 40b by the CVD method using TEOS gas. Patterning is then performed on the second mask layer 40b to make the second mask layer 40b insular. The first mask layer 40a is etched with the second mask layer 40b after the patterning as a mask. By doing so, the hard mask 40 including the first mask layer 40a and the second mask layer 40b is formed as illustrated in FIG. 7.

After the hard mask 40 is formed in this way, patterning is performed on a portion of the upper electrode 33 which is not covered with the hard mask 40, the PZT film 32, and the Ir films 31a and 30 by plasma etching using mixed gas which contains hydrogen bromide (HBr), $O_2$ gas, Ar gas, and octafluorobutane ($C_4H_8$) as etching gas.

The second mask layer 40b is then selectively removed by dry etching or wet etching. After that, dry etching is performed in a state in which the first mask layer 40a is left. By doing so, the anti-oxidation film 21 and the foundation conductive film 20 are removed and the first mask layer 40a is removed. As a result, a ferroelectric capacitor structure illustrated in FIG. 8 is obtained.

Figure 9:
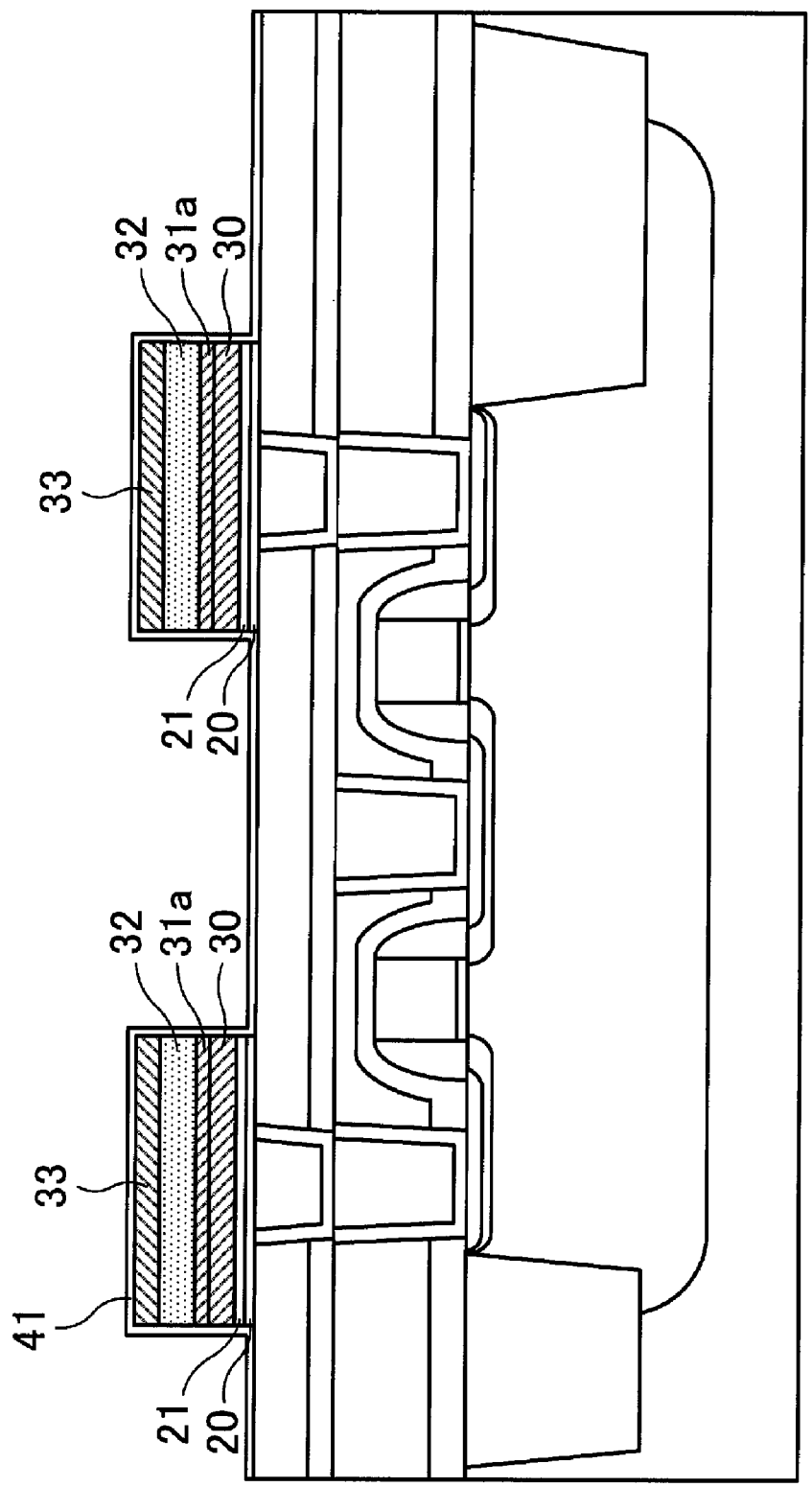
FIG. 9 is a fragmentary schematic sectional view of a protection film formation step.

FIG. 9 is a fragmentary schematic sectional view of a protection film formation step.

After a ferroelectric capacitor is formed, a first AlO film 41 is formed as a protection film so as to cover the ferroelectric capacitor. The first AlO film 41 is formed by, for example, the sputtering method so as to have a thickness of 20 nm. The first AlO film 41 may be formed by the MOCVD method so as to have a thickness of 1 nm to 5 nm.

After the first AlO film 41 is formed, recovery anneal is performed in order to repair damage to the PZT film 32 caused in the above steps. For example, this recovery anneal is performed for 60 minutes in an atmosphere of mixed gas which contains $O_2$ gas by setting the temperature of the wafer in a furnace to 550° C. to 700° C., preferably to 600° C.

Figure 10:
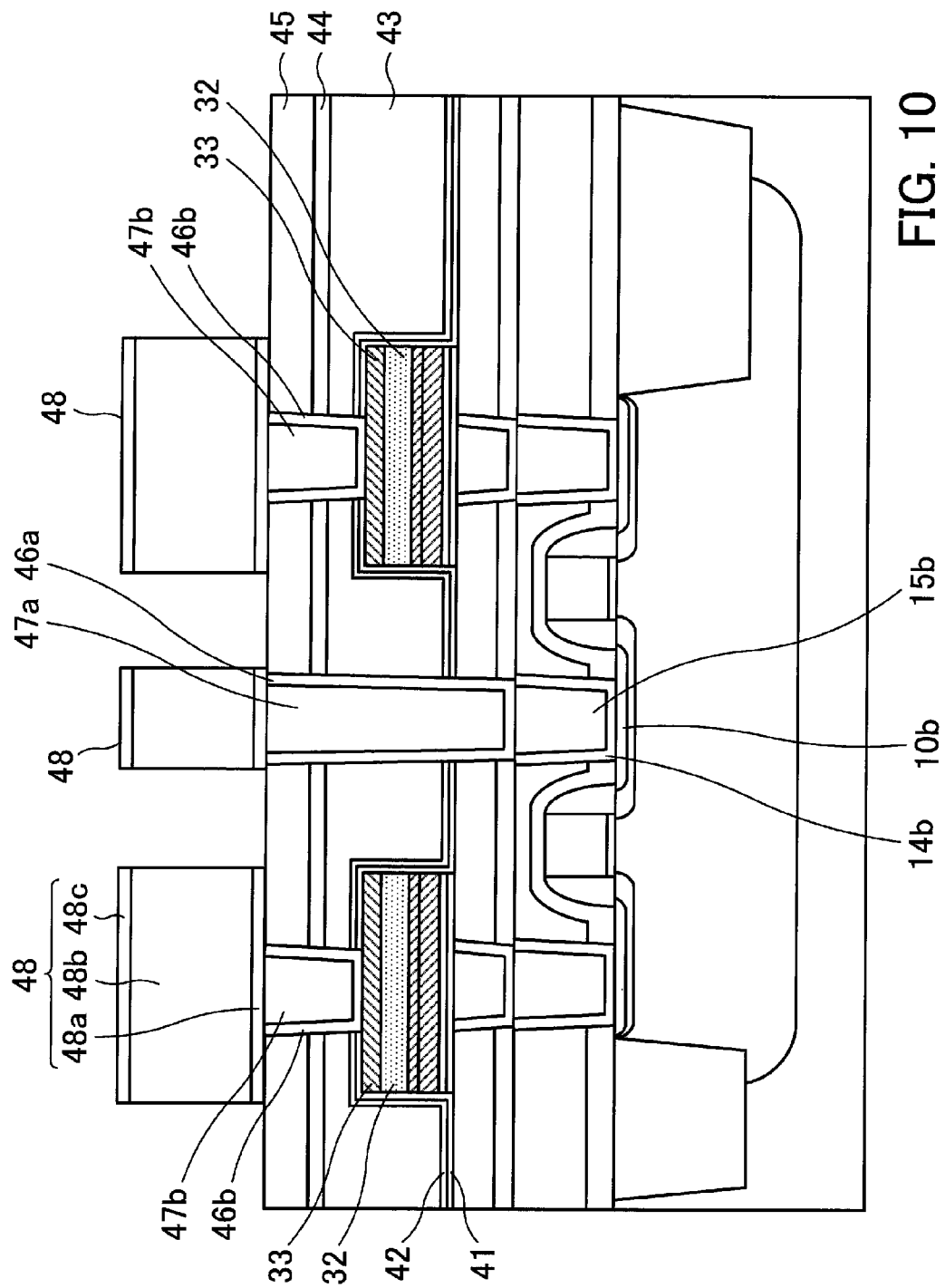
FIG. 10 is fragmentary schematic sectional view of the FeRAM after the formation of a wiring layer.

FIG. 10 is fragmentary schematic sectional view of the FeRAM after the formation of a wiring layer.

After the first AlO film 41 is formed and the recovery anneal is performed, a second AlO film 42 with a thickness of 38 nm is formed over the first AlO film 41 by, for example, the CVD method.

A SiO film with a thickness of 1,500 nm is then formed over an entire surface as a third interlayer dielectric film 43 by, for example, the plasma CVD method using mixed gas which contains TEOS gas, $O_2$ gas, and helium (He) gas. An inorganic film or the like having an insulating property may be formed as the third interlayer dielectric film 43. After the third interlayer dielectric film 43 is formed, the third interlayer dielectric film 43 is planarized by the CMP method.

After that, heat treatment is performed in an atmosphere of plasma generated by the use of dinitrogen monoxide ($N_2O$), $N_2$ gas, or the like. As a result, moisture in the third interlayer dielectric film 43 is removed and the properties of the third interlayer dielectric film 43 change. Accordingly, it is difficult for moisture to get into the third interlayer dielectric film 43.

An AlO film with a thickness of 20 nm to 100 nm is then formed over an entire surface as a barrier film 44 by, for example, the sputtering method or the CVD method. The barrier film 44 is formed over the planarized third interlayer dielectric film 43, so the barrier film 44 is formed in a flat state.

A SiO film with a thickness of 300 nm to 500 nm is then formed over an entire surface as a fourth interlayer dielectric film 45 by, for example, the plasma CVD method using TEOS gas. A SiON film, a SiN film, or the like may be formed as the fourth interlayer dielectric film 45. After the fourth interlayer dielectric film 45 is formed, the fourth interlayer dielectric film 45 is planarized by the CMP method.

The contact hole which connects with the W plug 15b connected to the second source/drain regions 10b is then formed first. After that, a W plug 47a is formed in the contact hole with a glue film 46a between. A contact hole which connects with the upper electrode 33 of the ferroelectric capacitor is then formed. After the contact hole is formed, heat treatment is performed at a temperature of 450° C. in an atmosphere of $O_2$ gas in order to make up for oxygen deficiency in the PZT film 32 caused by the formation of the contact hole. After the heat treatment is performed, a W plug 47b is formed in the contact hole with a glue film 46b between.

It is desirable that each of the glue films 46a and 46b be a single layer of a TiN film. However, a laminated structure in which a TiN film is formed by the MOCVD method over a Ti film formed by the sputtering method may be adopted. If each of the glue films 46a and 46b is a single layer of a TiN film or has a laminated structure including a TiN film, then it is desirable that plasma treatment using $N_2$ gas and hydrogen ($H_2$) gas be performed for the purpose of removing carbon (C) from the TiN film. As stated above, the upper electrode 33 includes the Ir film which functions as a hydrogen barrier film. Accordingly, the $IrO_X$ film and the like formed thereunder are not reduced by this plasma treatment.

After the glue films 46a and 46b and the W plugs 47a and 47b are formed in this way, a wiring 48 is formed over the W plugs 47a and 47b. The wiring 48 can be formed by, for example, the following method. A TiN—Ti laminated film 48a including a Ti film with a thickness of 60 nm and a TiN film with a thickness of 30 nm, a film 48b of an alloy of Al and Cu with a thickness of 360 nm, and a TiN—Ti laminated film 48c including a Ti film with a thickness of 5 nm and a TiN film with a thickness of 70 nm are formed in order by the sputtering method and patterning is performed on these films. By doing so, a first wiring layer is formed.

After that, a second and later wiring layers are formed in the same way to complete the FeRAM.

Conditions under which an amorphous or microcrystalline $IrO_X$ film for a lower electrode is formed and the properties of the PZT film (first PZT film) obtained through the formation of such an $IrO_X$ film in the case of manufacturing a FeRAM by following the above flow will now be described in detail.

$IrO_X$ film formation temperature will be described first.

Each $IrO_X$ film with a thickness of 30 nm is formed over an Ir film corresponding to a lower layer portion of a lower electrode of a ferroelectric capacitor by the sputtering method by supplying 0.5 kilowatts of sputtering power in an atmosphere of mixed gas which contains Ar gas and $O_2$ gas the flow rates of which are 186 sccm and 14 sccm respectively (ratio of $O_2$ gas is 7%). At this time an $IrO_X$ film formation rate is 1.6 nm/sec, $IrO_X$ film formation time is 19 seconds, and $IrO_X$ film formation temperature is set to room temperature (25° C.), 50° C., 100° C., 200° C., and 300° C. That is to say, $IrO_X$ films are formed at different temperatures. A PZT film is formed over each of the $IrO_X$ films formed at the different temperatures by the MOCVD method. The crystal structure of each PZT film formed and an Ir film thereunder is examined by the use of an X-ray diffraction apparatus. In addition, a PZT film is formed over an Ir film without the formation of an $IrO_X$ film for comparison and the crystal structure of the PZT film and the Ir film is examined by the use of the X-ray diffraction apparatus. Results obtained are illustrated in FIGS. 11 through 16. Each PZT film is formed under the conditions under which the above first PZT film is formed (FIG. 5).

Figure 11:
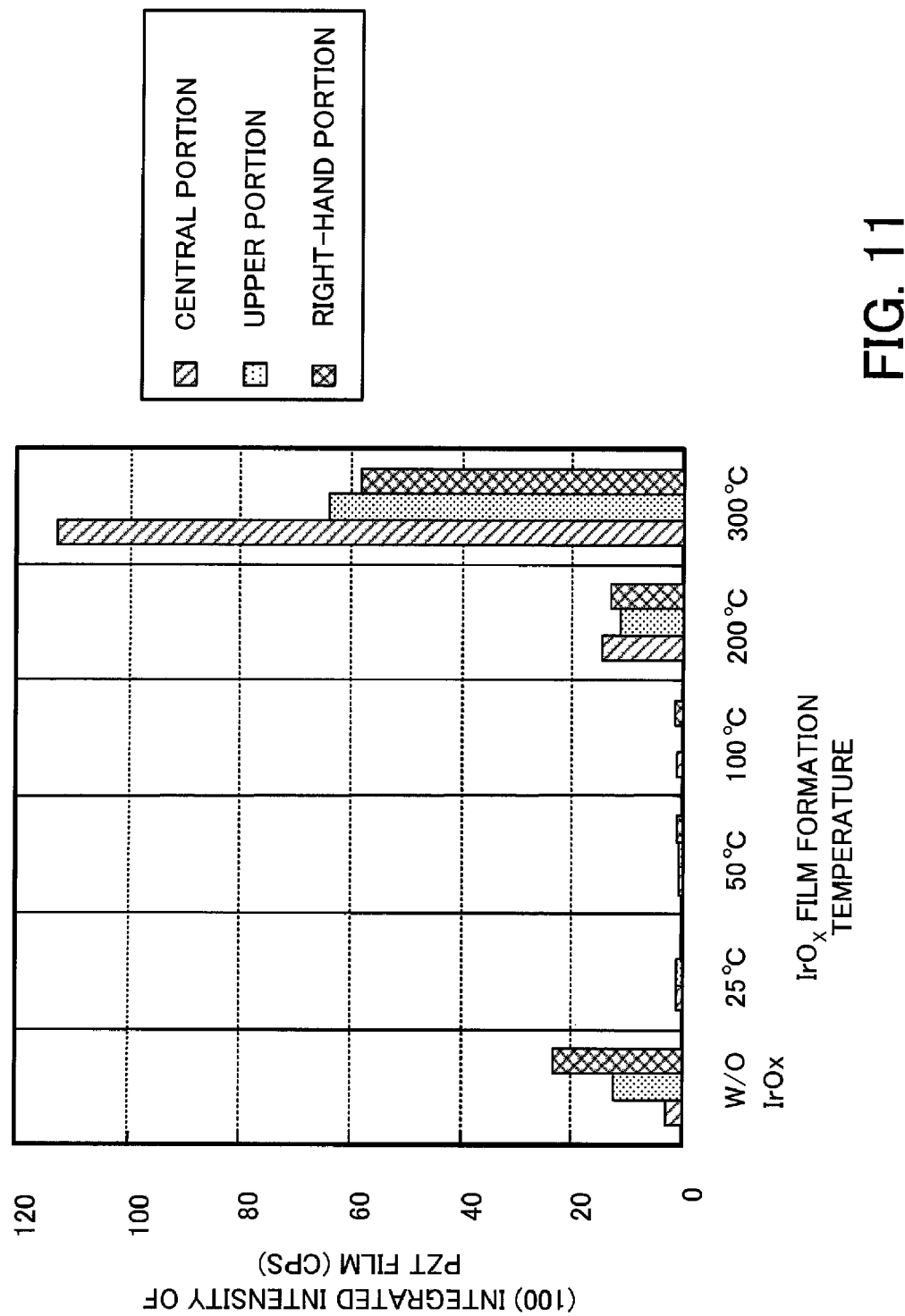
FIG. 11 illustrates the relationship between $IrO_X$ film formation temperature and the (100) integrated intensity of a PZT film.
Figure 12:
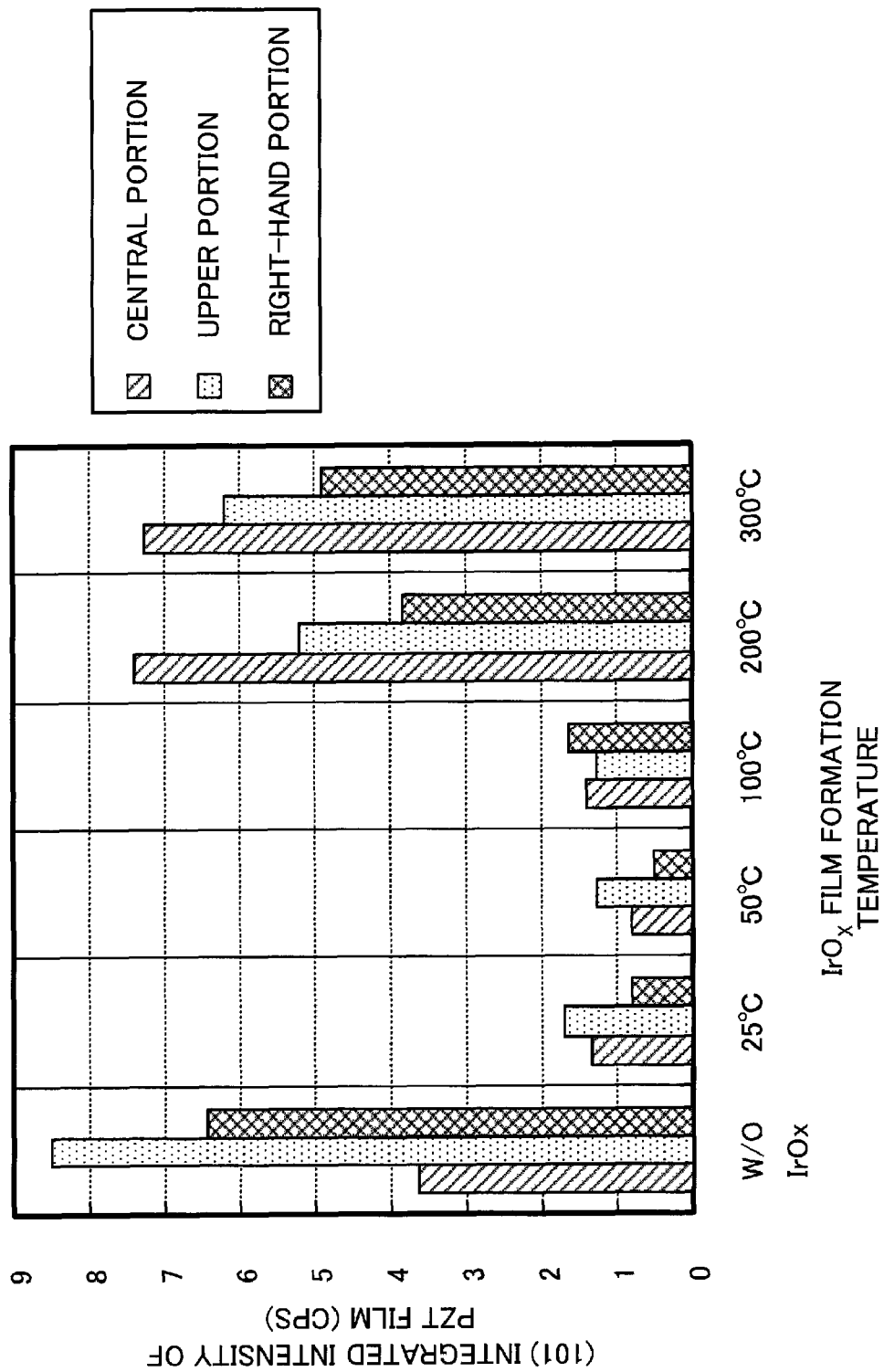
FIG. 12 illustrates the relationship between $IrO_X$ film formation temperature and the (101) integrated intensity of a PZT film.
Figure 13:
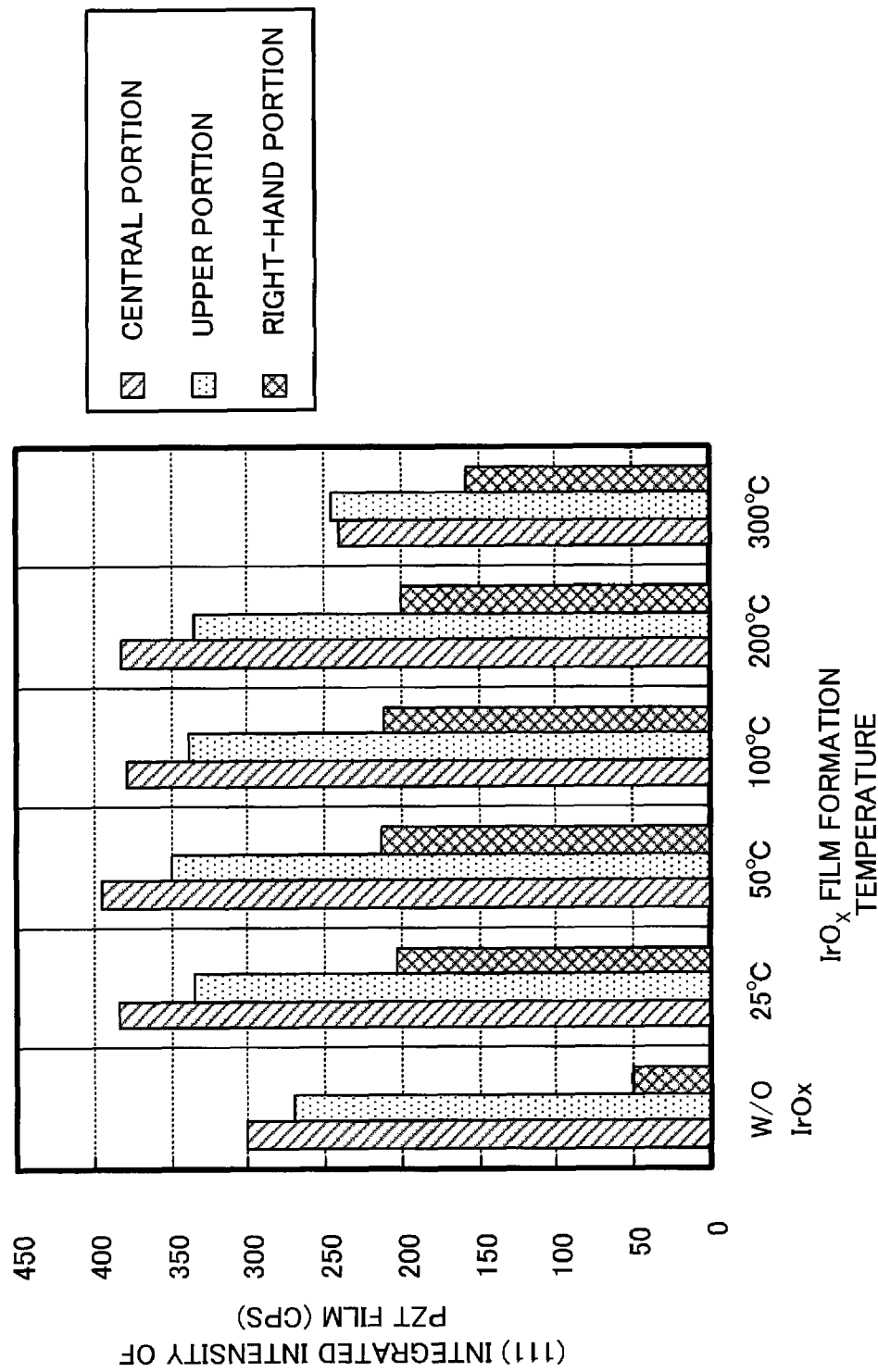
FIG. 13 illustrates the relationship between $IrO_X$ film formation temperature and the (111) integrated intensity of a PZT film.
Figure 14:
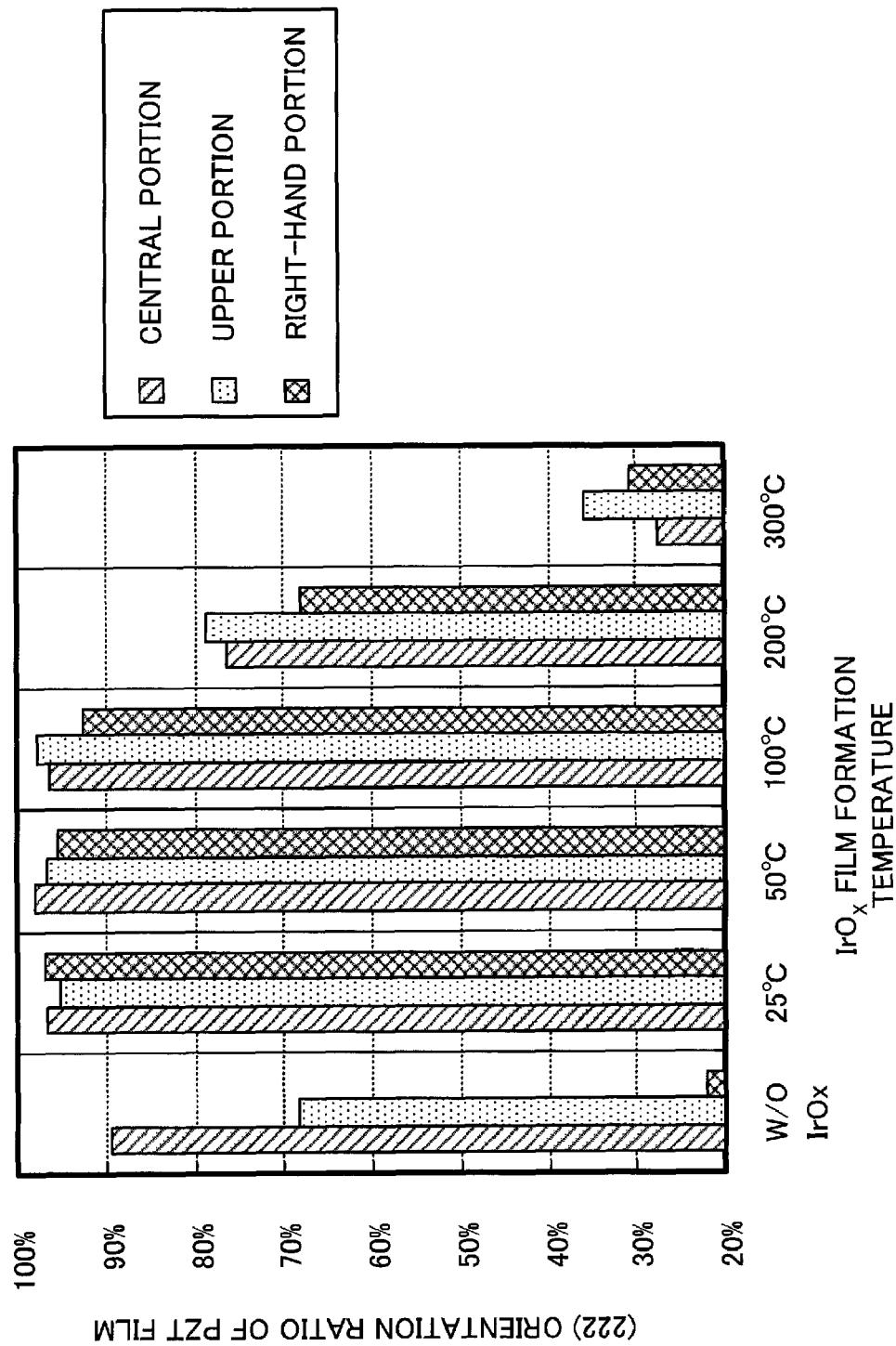
FIG. 14 illustrates the relationship between $IrO_X$ film formation temperature and the (222) orientation ratio of a PZT film.
Figure 15:
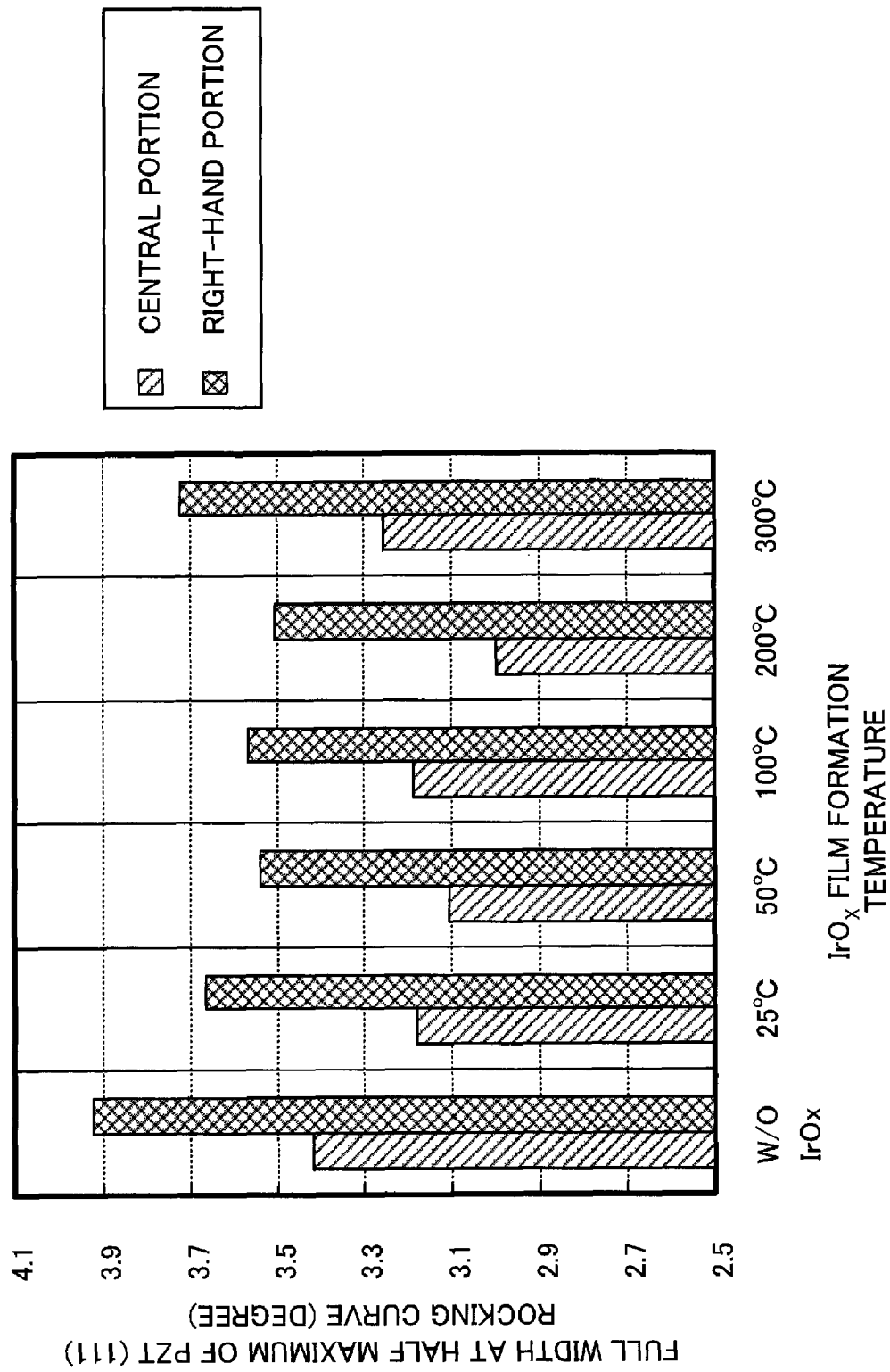
FIG. 15 illustrates the relationship between $IrO_X$ film formation temperature and the full width at half maximum of the PZT (111) rocking curve.
Figure 16:
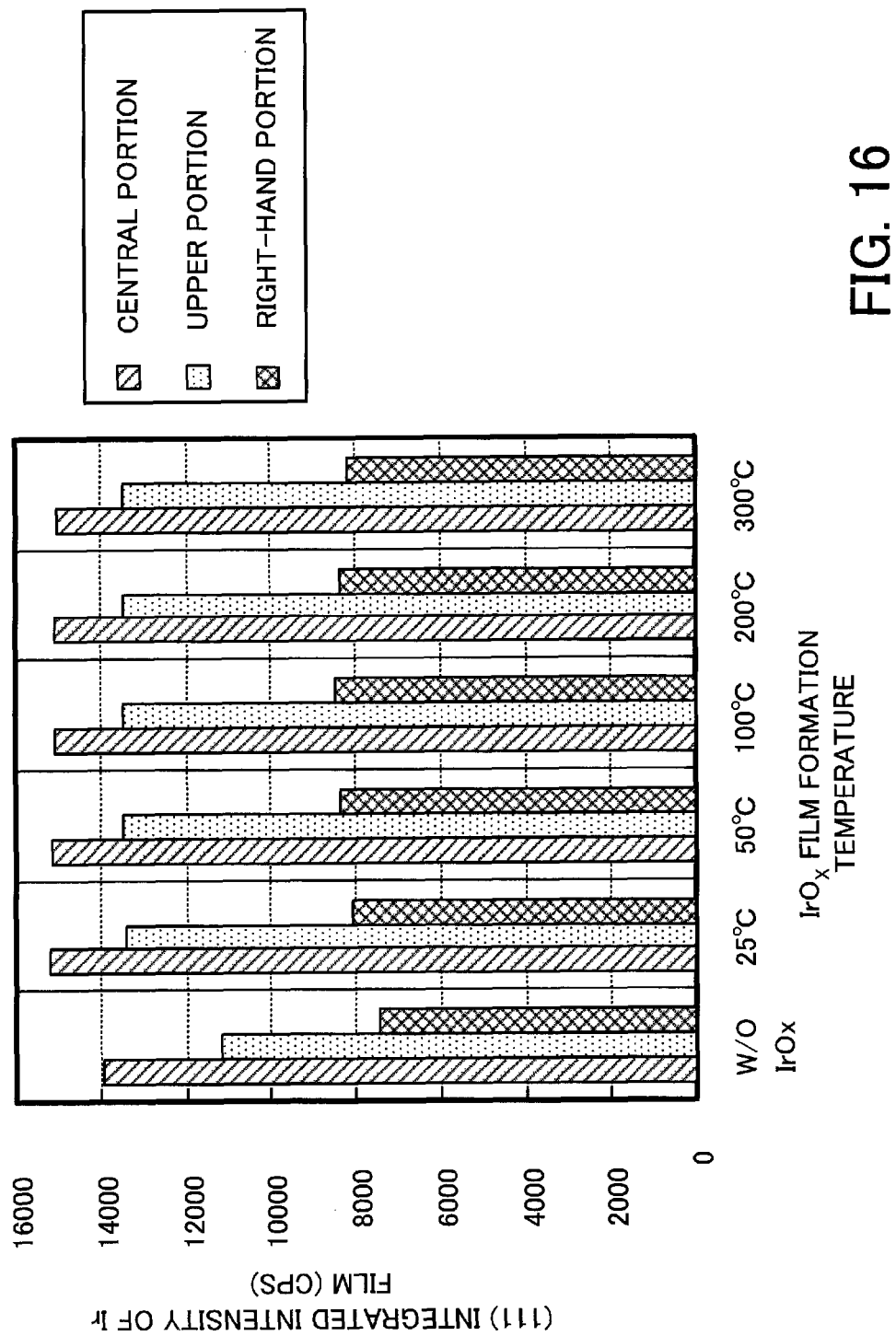
FIG. 16 illustrates the relationship between $IrO_X$ film formation temperature and the (111) integrated intensity of an Ir film after the formation of a PZT film.

FIG. 11 illustrates the relationship between $IrO_X$ film formation temperature and the (100) integrated intensity of a PZT film. FIG. 12 illustrates the relationship between $IrO_X$ film formation temperature and the (101) integrated intensity of a PZT film. FIG. 13 illustrates the relationship between $IrO_X$ film formation temperature and the (111) integrated intensity of a PZT film. FIG. 14 illustrates the relationship between IrO$_X$ film formation temperature and the (222) orientation ratio of a PZT film. FIG. 15 illustrates the relationship between IrO$_X$ film formation temperature and the full width at half maximum (FWHM) of the PZT (111) rocking curve. FIG. 16 illustrates the relationship between IrO$_X$ film formation temperature and the (111) integrated intensity of an Ir film after the formation of a PZT film.

In the following descriptions a central portion of a wafer is a portion which is in the middle of the wafer which is looked at from above. A lower, upper, left-hand, or right-hand portion of a wafer is a portion that is under, over, to the left of, or to the right of a central portion of the wafer which is looked at from above and a notch of which faces in a predetermined direction. In this case, a lower, upper, left-hand, or right-hand portion of a wafer is set with a notch of the wafer faced to this side.

First, as can be seen from FIG. 11, the (100) integrated intensity of a PZT film in a central, upper, or right-hand portion of a wafer is low in the case where IrO$_X$ film formation temperature is 25° C., 50° C., or 100° C., compared with the case where an IrO$_X$ film is not formed (W/O IrO$_X$) or where IrO$_X$ film formation temperature is 200° C. or 300° C. Similarly, as can be seen from FIG. 12, the (101) integrated intensity of a PZT film in an central, upper, or right-hand portion of a wafer is low in the case where IrO$_X$ film formation temperature is 25° C., 50° C., or 100° C., compared with the case where an IrO$_X$ film is not formed or where IrO$_X$ film formation temperature is 200° C. or 300° C. As can be seen from FIG. 13, the (111) integrated intensity of a PZT film in an central, upper, or right-hand portion of a wafer is almost the same in the case where IrO$_X$ film formation temperature is 25° C., 50° C., 100° C., or 200° C. However, the (111) integrated intensity of a PZT film in a central, upper, or right-hand portion of a wafer is low in the case where an IrO$_X$ film is not formed or where IrO$_X$ film formation temperature is 300° C., compared with the case where IrO$_X$ film formation temperature is 25° C., 50° C., 100° C., or 200° C.

The (222) orientation ratio of a PZT film is calculated in accordance with the above formula (1) by the use of the results indicated in FIGS. 11 through 13. As can be seen from FIG. 14, the (222) orientation ratio of a PZT film in a central, upper, or right-hand portion of a wafer is high in the case where IrO$_X$ film formation temperature is 25° C., 50° C., or 100° C. However, the (222) orientation ratio of a PZT film in a central, upper, or right-hand portion of a wafer is low in the case where an IrO$_X$ film is not formed or where IrO$_X$ film formation temperature is 200° C. or 300° C., compared with the case where IrO$_X$ film formation temperature is 25° C., 50° C., or 100° C. As can be seen from FIG. 15, the full width at half maximum of the PZT (111) rocking curve in a central or right-hand portion of a wafer tends to become comparatively large in the case where an IrO$_X$ film is not formed or where IrO$_X$ film formation temperature is 300° C.

In addition, as can be seen from FIG. 16, the (111) integrated intensity of an Ir film in an central, upper, or right-hand portion of a wafer after the formation of a PZT film tends to become low in the case where an IrO$_X$ film is not formed, compared with the case where an IrO$_X$ film is formed (IrO$_X$ film formation temperature is 25° C., 50° C., 100° C., 200° C., or 300° C.).

As stated above, if an IrO$_X$ film is not formed, the (111) integrated intensity of the Ir film is low, compared with the case where an IrO$_X$ film is formed (FIG. 16). Furthermore, if an IrO$_X$ film is not formed, the generation of the (111) plane of a PZT film is controlled by the generation of the (100) or (101) plane of the PZT film (FIGS. 11 through 13) and the (222) orientation ratio of the PZT film is low (FIG. 14). If an IrO$_X$ film is not formed, the (111) integrated intensity and (222) orientation ratio of the PZT film especially in a right-hand portion of a wafer are extremely low, compared with the (111) integrated intensity and (222) orientation ratio of the PZT film in the central or upper portion of the wafer. That is to say, the distribution of orientation on the wafer is extraordinarily non-uniform (FIG. 14). In addition, the full width at half maximum of the PZT (111) rocking curve is large (FIG. 15).

On the other hand, if an IrO$_X$ film is formed, a difference in IrO$_X$ film formation temperature does not lead to a noticeable difference in the (111) integrated intensity of an Ir film after the formation of a PZT film (FIG. 16). However, there is a great difference in the orientation of a PZT film formed over the IrO$_X$ film. The reason for this will be as follows.

If IrO$_X$ film formation temperature is 200° C. or 300° C., then an IrO$_X$ film formed is crystallized completely and a PZT film is formed over the crystalline IrO$_X$ film by using the MOCVD method under predetermined conditions. At this time the IrO$_X$ film is oxidized first by raising temperature in an atmosphere of O$_2$. If the IrO$_X$ film is crystalline, its oxidation tends to become non-uniform. After the temperature is raised to a predetermined formation temperature, material gas is introduced. The IrO$_X$ film after the oxidation is reduced with a solvent component contained in the material gas. If oxidation of the IrO$_X$ film is non-uniform, then it is difficult to reduce the IrO$_X$ film to a uniform Ir film. As a result, the (100) or (101) plane of the PZT film formed over the IrO$_X$ film is apt to be generated (FIGS. 11 through 13), and the (222) orientation ratio of the PZT film is low (FIG. 14).

On the other hand, if IrO$_X$ film formation temperature is 25° C., then an IrO$_X$ film formed is amorphous. If IrO$_X$ film formation temperature is 50° C. or 100° C., then an IrO$_X$ film formed is microcrystallized uniformly. In the process of forming a PZT film by the MOCVD method, an amorphous or microcrystalline IrO$_X$ film is uniformly oxidized (crystallized) first at the time of raising the temperature in an atmosphere of O$_2$ gas. When material gas is introduced after raising the temperature to a predetermined formation temperature, the IrO$_X$ film is reduced to a uniform Ir film in which the diameter of crystal grains is small with a solvent component contained in the material gas. As a result, the generation of the (100) or (101) plane of the PZT film formed over the IrO$_X$ film is controlled (FIGS. 11 through 13) and the (222) orientation ratio of the PZT film is high (FIG. 14). In addition, the distribution of orientation on a wafer is uniform (FIG. 14) and the full width at half maximum of the PZT (111) rocking curve is comparatively small (FIG. 15).

Therefore, it is desirable that IrO$_X$ film formation temperature be 25° C. to 100° C. However, as IrO$_X$ film formation temperature approaches 25° C., it becomes difficult to stabilize the temperature. Moreover, when IrO$_X$ films are formed continuously over a plurality of wafers, the temperature is apt to rise. As a result, an IrO$_X$ film may partially be crystallized. If a margin is taken into consideration, it is more desirable that IrO$_X$ film formation temperature be set to about 60° C. which is the middle of a temperature range of from 25° C. to 100° C.

IrO$_X$ film thickness will now be described.

Each IrO$_X$ film is formed over an Ir film corresponding to a lower layer portion of a lower electrode of a ferroelectric capacitor by the sputtering method at a formation temperature of 60° C. (which is the middle of a temperature range of from 25° C. to 100° C.) by supplying 0.5 kilowatts of sputtering power in an atmosphere of mixed gas which contains Ar gas and O$_2$ gas the flow rates of which are 186 sccm and 14 sccm respectively (ratio of O$_2$ gas is 7%). At this time an IrO$_X$ film formation rate is set to 1.6 nm/sec and IrO$_X$ film thickness is set to 15 nm, 25 nm, 35 nm, 40 nm, and 50 nm. A PZT film is formed over each of $IrO_X$ films of the different thicknesses by the MOCVD method. The crystal structure of each PZT film is examined by the use of an X-ray diffraction apparatus. Results obtained are illustrated in FIGS. 17 through 20. Each PZT film is formed under the conditions under which the above first PZT film is formed (FIG. 5).

Figure 17:
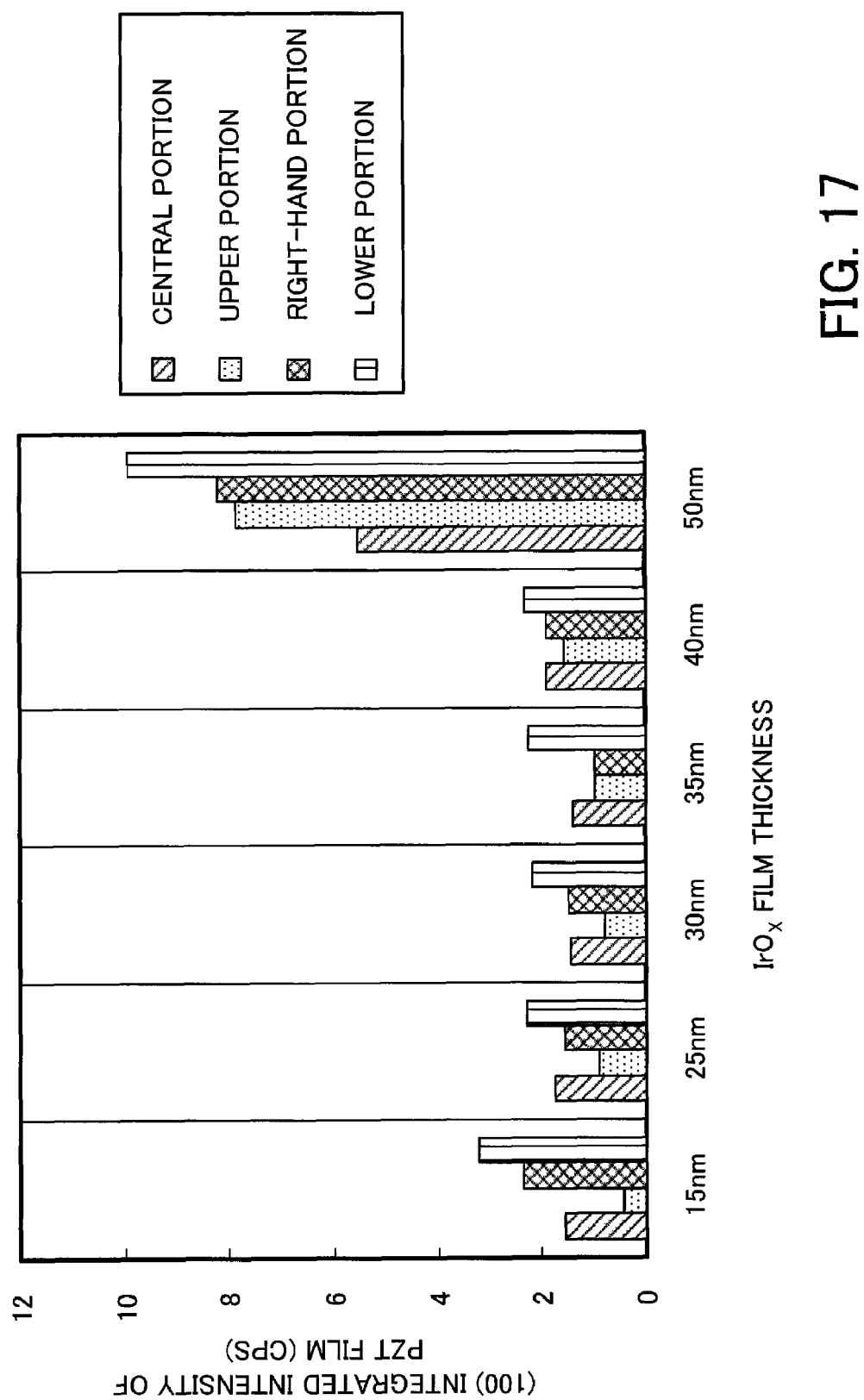
FIG. 17 illustrates the relationship between $IrO_X$ film thickness and the (100) integrated intensity of a PZT film.
Figure 18:
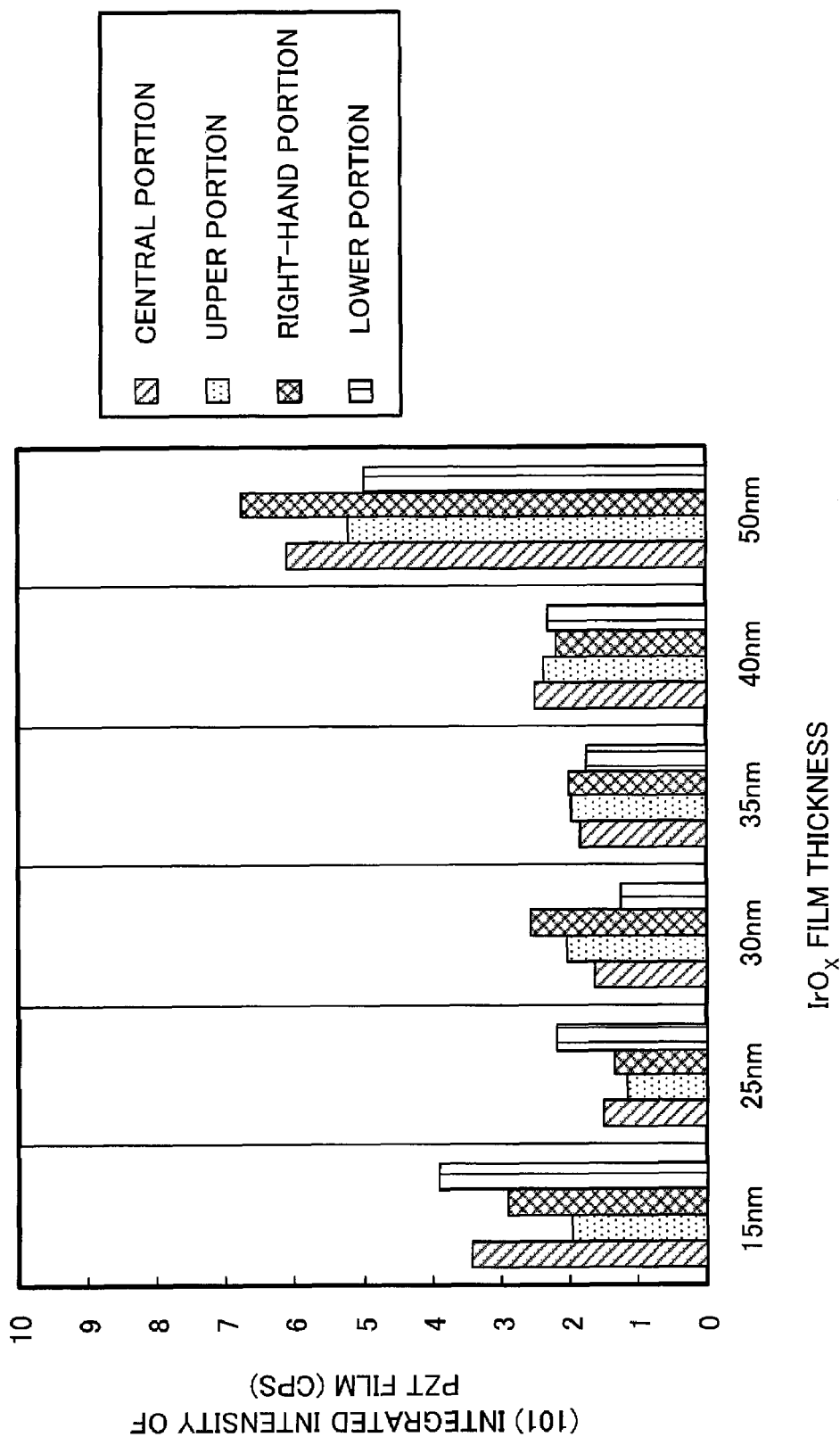
FIG. 18 illustrates the relationship between $IrO_X$ film thickness and the (101) integrated intensity of a PZT film.
Figure 19:
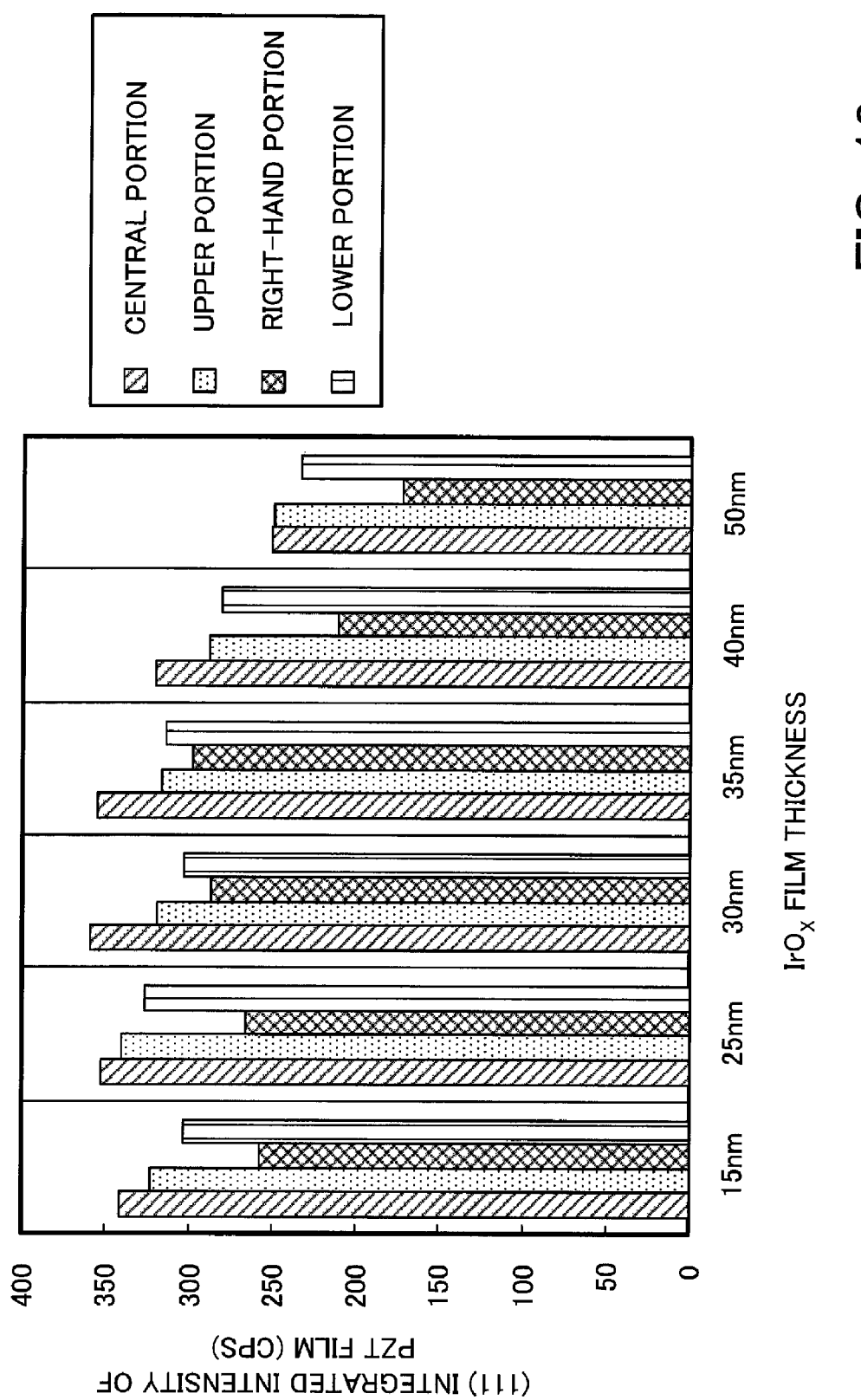
FIG. 19 illustrates the relationship between $IrO_X$ film thickness and the (111) integrated intensity of a PZT film.
Figure 20:
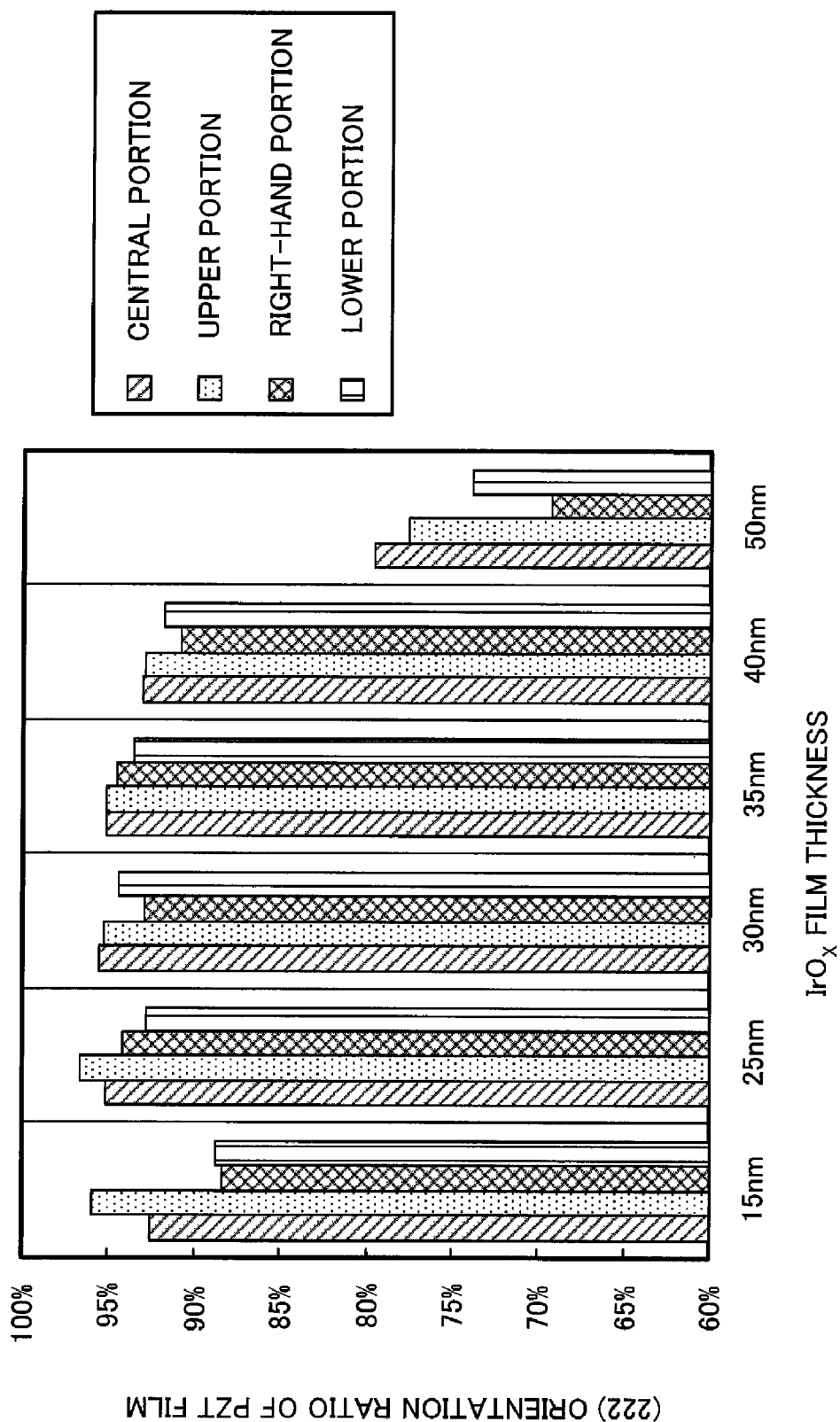
FIG. 20 illustrates the relationship between $IrO_X$ film thickness and the (222) orientation ratio of a PZT film.

FIG. 17 illustrates the relationship between $IrO_X$ film thickness and the (100) integrated intensity of a PZT film. FIG. 18 illustrates the relationship between $IrO_X$ film thickness and the (101) integrated intensity of a PZT film. FIG. 19 illustrates the relationship between $IrO_X$ film thickness and the (111) integrated intensity of a PZT film. FIG. 20 illustrates the relationship between $IrO_X$ film thickness and the (222) orientation ratio of a PZT film.

As can be seen from FIGS. 17 and 18, the (100) integrated intensity or (101) integrated intensity of a PZT film in a central, upper, right-hand, or lower portion of a wafer is high in the case where $IrO_X$ film thickness is set to 50 nm. In addition, as can be seen from FIG. 19, the (111) integrated intensity of a PZT film in a central, upper, right-hand, or lower portion of a wafer is low in the case where $IrO_X$ film thickness is set to 50 nm. Moreover, as can be seen from FIG. 20, the (222) orientation ratio of a PZT film is also low in the case where $IrO_X$ film thickness is set to 50 nm.

If $IrO_X$ film thickness is set to 50 nm, it is difficult to reduce, at the time of forming a PZT film by the MOCVD method, an $IrO_X$ film completely with a solvent component contained in material gas because of the thickness of the $IrO_X$ film. As a result, the $IrO_X$ film is left in the lower electrode. Accordingly, the (100) or (101) plane of the PZT film formed over the $IrO_X$ film is apt to be generated (FIGS. 17 through 19), and the (222) orientation ratio of the PZT film is low (FIG. 20). $IrO_X$ film thickness should be set to less than 50 nm, preferably to 40 nm or less.

On the other hand, if $IrO_X$ film thickness is set to 15 nm, an $IrO_X$ film is oxidized first by raising the temperature in an atmosphere of $O_2$ gas at the time of forming a PZT film by the MOCVD method. However, an Ir film formed under the $IrO_X$ film will also be oxidized slightly because of the thinness of the $IrO_X$ film. An oxidized portion of the Ir film does not become uniform $IrO_X$. That is to say, there is a strong possibility that the oxidized portion of the Ir film is abnormally oxidized $IrO_X$. Even if abnormally oxidized $IrO_X$ is reduced with a solvent component contained in material gas introduced, uniform crystal grains are not obtained. Therefore, the (100) or (101) plane of the PZT film is apt to be generated (FIGS. 17 through 19), and the (222) orientation ratio of the PZT film is low. The (222) orientation ratio of the PZT film is below 90%, depending on positions on a wafer (FIG. 20).

However if conditions under which the temperature is raised at the time of forming the PZT film by the MOCVD method are controlled, the rate at which the $IrO_X$ film is oxidized can be reduced, oxidation of the Ir film formed under the $IrO_X$ film can be prevented, and the (222) orientation ratio of the PZT film can be raised. Even if $IrO_X$ film thickness is set to 10 nm, the (222) orientation ratio of the PZT film can be made high, depending on conditions under which the temperature is raised at the time of forming the PZT film. Accordingly, $IrO_X$ film thickness can be set to 10 nm or more.

As stated above, it is desirable that $IrO_X$ film thickness be set to 10 nm to 40 nm. By doing so, a lower electrode in which an Ir film with a thickness of 10 nm to 40 nm in which the diameter of crystal grains is small is formed over an Ir film is obtained. If the characteristics, production costs, production efficiency, and the like of a ferroelectric capacitor and a FeRAM including it are taken into consideration, it is more desirable that $IrO_X$ film thickness be set to 25 nm to 30 nm.

An $O_2$ gas ratio and a formation rate at $IrO_X$ film formation time will now be described.

Each $IrO_X$ film with a thickness of 30 nm is formed over an Ir film corresponding to a lower layer portion of a lower electrode of a ferroelectric capacitor by the sputtering method at a formation temperature of 60° C. by supplying 0.5 kilowatts of sputtering power in an atmosphere of mixed gas which contains Ar gas and $O_2$ gas. At this time an $IrO_X$ film formation rate is 1.6 nm/sec, $IrO_X$ film formation time is 19 seconds, and the ratio of $O_2$ gas contained in the mixed gas is set to 5% (flow rates of Ar gas and $O_2$ gas are 190 sccm and 10 sccm respectively), 7% (flow rates of Ar gas and $O_2$ gas are 186 sccm and 14 sccm respectively), 10% (flow rates of Ar gas and $O_2$ gas are 180 sccm and 20 sccm respectively), 20% (flow rates of Ar gas and $O_2$ gas are 160 sccm and 40 sccm respectively), 25% (flow rates of Ar gas and $O_2$ gas are 150 sccm and 50 sccm respectively), 30% (flow rates of Ar gas and $O_2$ gas are 140 sccm and 60 sccm respectively), and 35% (flow rates of Ar gas and $O_2$ gas are 130 sccm and 70 sccm respectively). That is to say, $IrO_X$ films are formed at different $O_2$ gas ratios. A PZT film is formed over each of the $IrO_X$ films formed at the different $O_2$ gas ratios by the MOCVD method. The crystal structure of each PZT film is examined by the use of an X-ray diffraction apparatus. Results obtained are illustrated in FIGS. 21 through 24. Each PZT film is formed under the conditions under which the above first PZT film is formed (FIG. 5).

Figure 21:
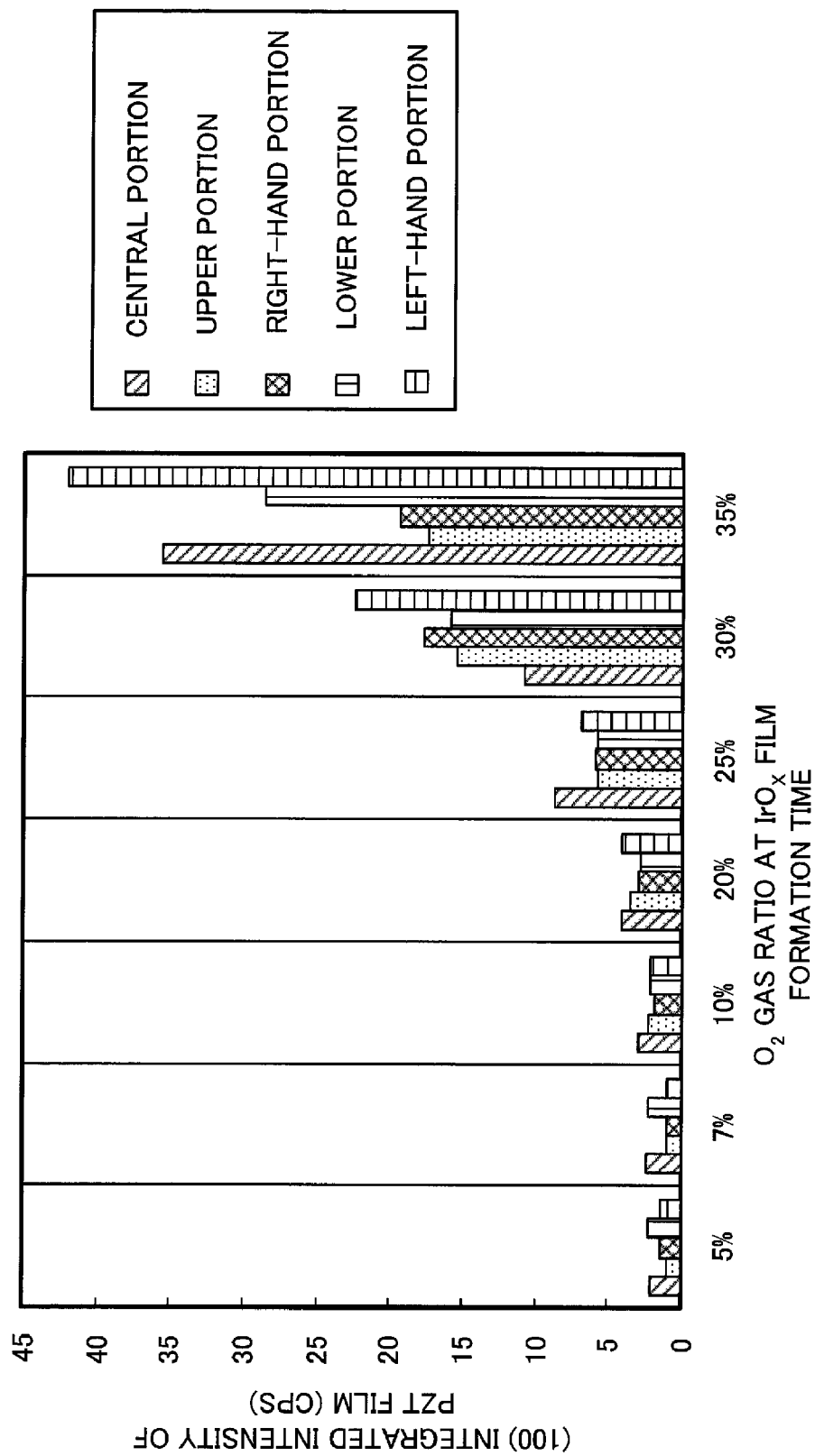
FIG. 21 illustrates the relationship between $O_2$ gas ratio at $IrO_X$ film formation time and the (100) integrated intensity of a PZT film.
Figure 22:
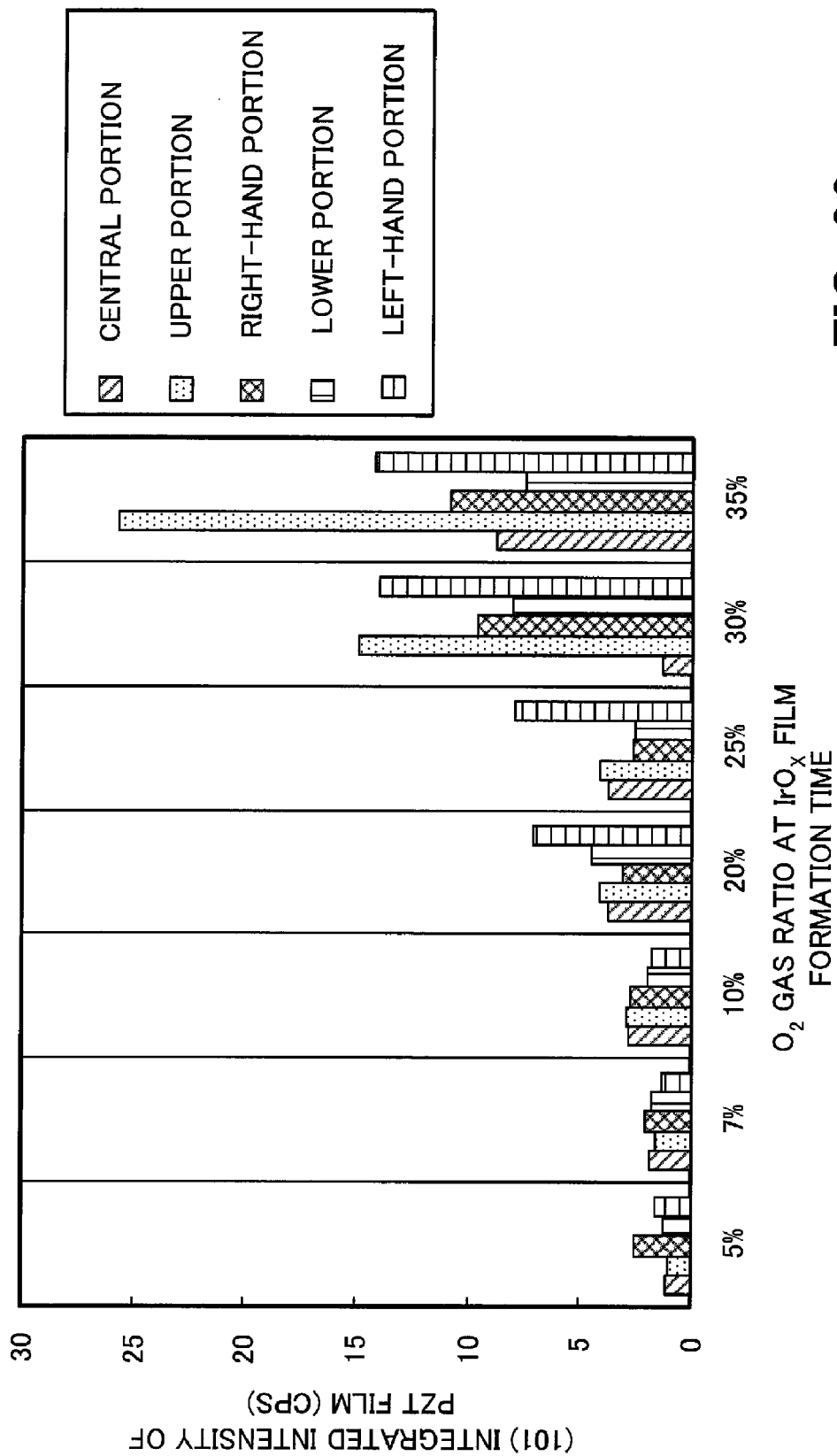
FIG. 22 illustrates the relationship between $O_2$ gas ratio at $IrO_X$ film formation time and the (101) integrated intensity of a PZT film.
Figure 23:
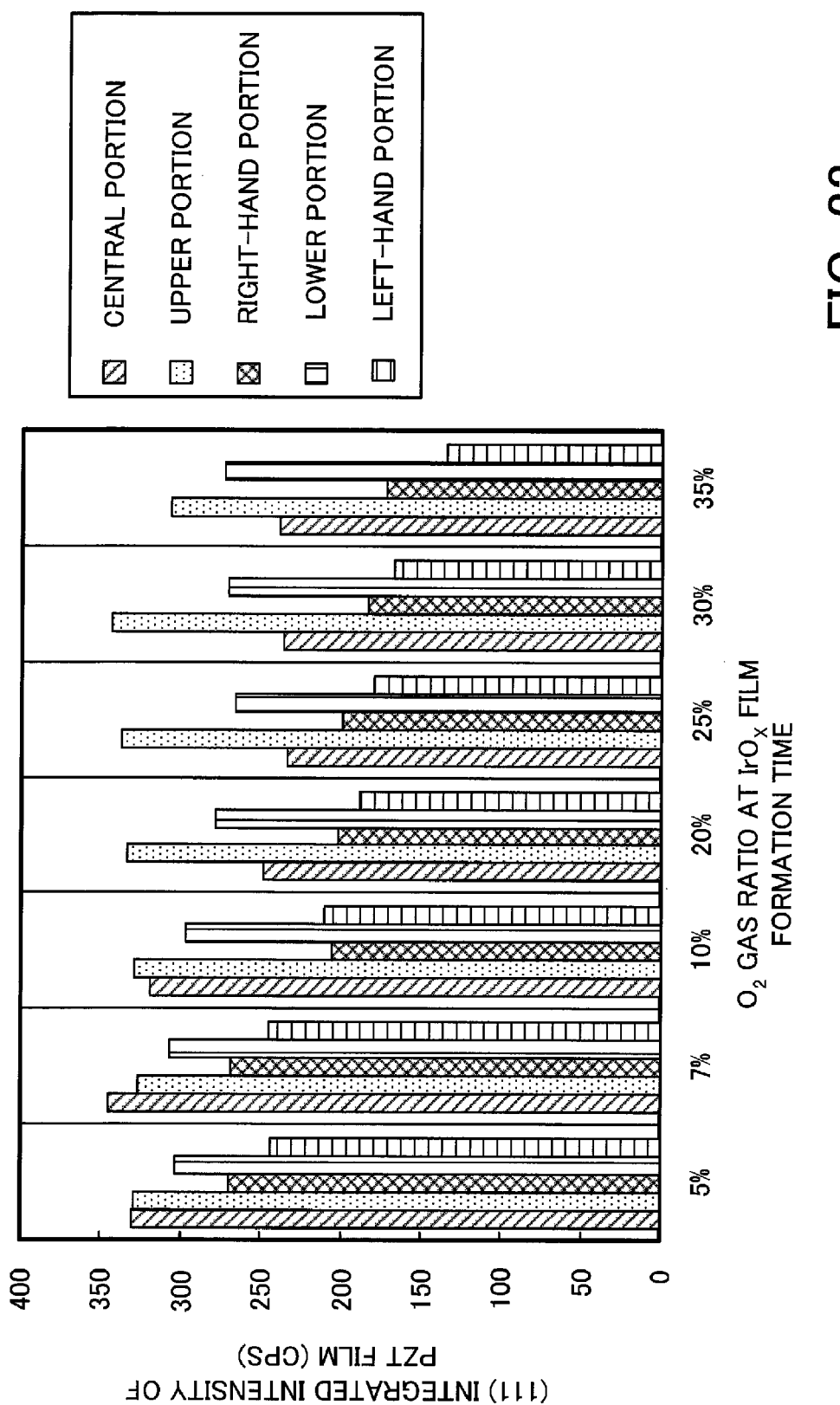
FIG. 23 illustrates the relationship between $O_2$ gas ratio at $IrO_X$ film formation time and the (111) integrated intensity of a PZT film.
Figure 24:
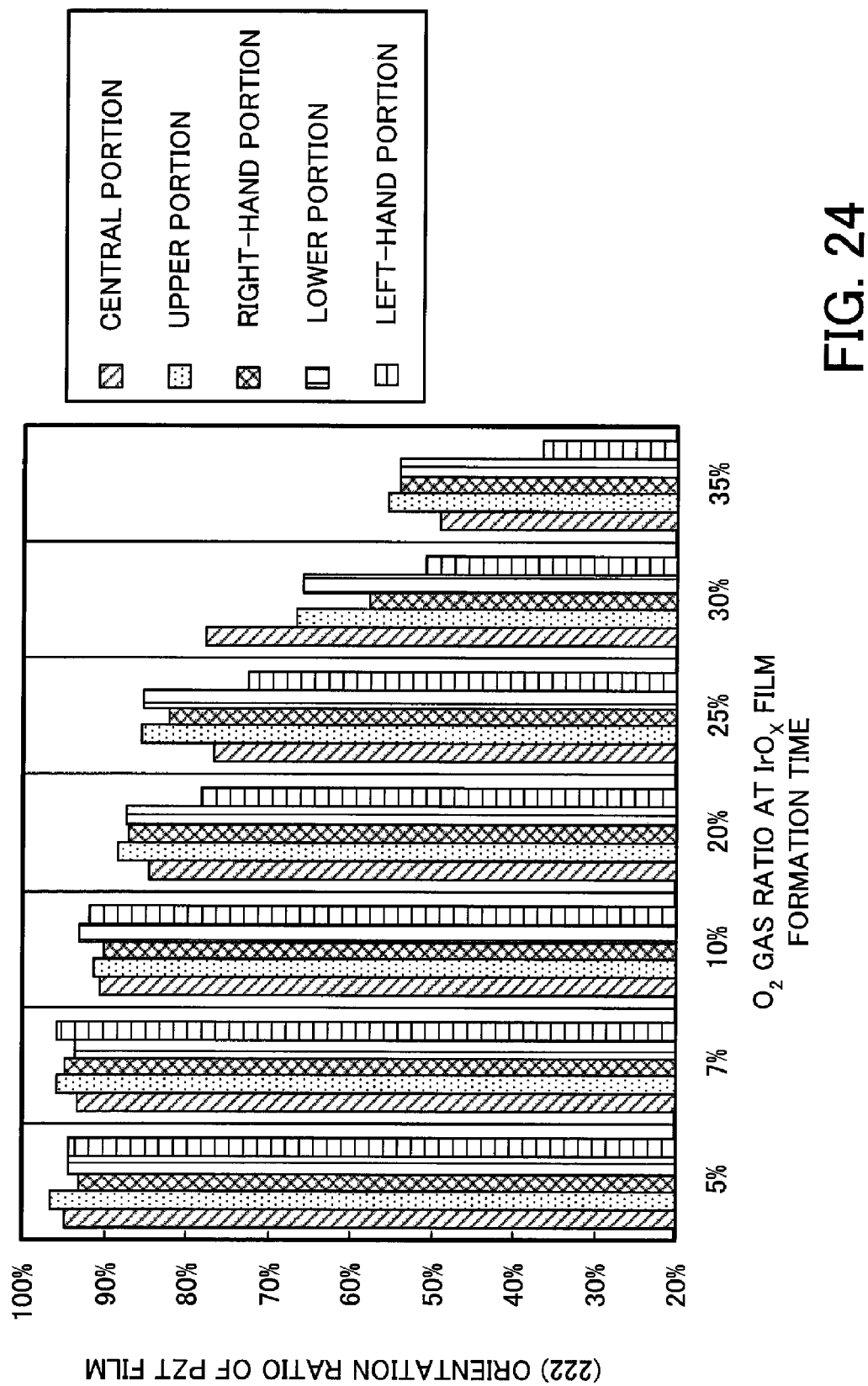
FIG. 24 illustrates the relationship between $O_2$ gas ratio at $IrO_X$ film formation time and the (222) orientation ratio of a PZT film.

FIG. 21 illustrates the relationship between $O_2$ gas ratio at $IrO_X$ film formation time and the (100) integrated intensity of a PZT film. FIG. 22 illustrates the relationship between $O_2$ gas ratio at $IrO_X$ film formation time and the (101) integrated intensity of a PZT film. FIG. 23 illustrates the relationship between $O_2$ gas ratio at $IrO_X$ film formation time and the (111) integrated intensity of a PZT film. FIG. 24 illustrates the relationship between $O_2$ gas ratio at $IrO_X$ film formation time and the (222) orientation ratio of a PZT film.

If $O_2$ gas ratio at $IrO_X$ film formation time is 5% to 10%, the (222) orientation ratio of a PZT film in a central, upper, right-hand, or lower portion of a wafer is 90% or higher (FIG. 24). The reason for this is as follows. If a PZT film is formed by the MOCVD method over an $IrO_X$ film formed under such an $O_2$ gas ratio condition, the $IrO_X$ film is oxidized uniformly and then is reduced uniformly. As a result, the generation of the (100) or (101) plane of the PZT film is controlled (FIGS. 21 through 23).

On the other hand, if $O_2$ gas ratio at $IrO_X$ film formation time is higher than 10%, the oxidation degree of an $IrO_X$ film formed becomes high. When a PZT film is formed over the $IrO_X$ film by the MOCVD method, then the $IrO_X$ film is apt to be oxidized abnormally. Therefore, even when a reduction is then performed, it is difficult to obtain a uniform Ir film. That is to say, the generation of the (100) or (101) plane of the PZT film cannot be controlled effectively (FIGS. 21 through 23). As a result, the (222) orientation ratio of the PZT film in a central, upper, right-hand, or lower portion of a wafer is low (FIG. 24).

Accordingly, if an $IrO_X$ film is formed at a temperature of 60° C. by supplying 0.5 kilowatts of sputtering power ($IrO_X$ film formation rate is 1.6 nm/sec) in an atmosphere of mixed gas which contains Ar gas and $O_2$ gas, it is desirable that $O_2$ gas ratio at $IrO_X$ film formation time be set to 5% to 10%.

If sputtering power supplied at $IrO_X$ film formation time is changed, an optimum condition for $O_2$ gas ratio changes correspondingly. Attention should be paid to this. For example, if 0.5 kilowatts of sputtering power is supplied and $O_2$ gas ratio at $IrO_X$ film formation time is 5%, then an $IrO_X$ film formation rate is 1.5 nm/sec. If 1.0 kilowatt of sputtering power is supplied and $O_2$ gas ratio at $IrO_X$ film formation time is 10%, then an $IrO_X$ film formation rate is 3.0 nm/sec. If 2.0 kilowatts of sputtering power is supplied and $O_2$ gas ratio at $IrO_X$ film formation time is 18%, then an $IrO_X$ film formation rate is 6.0 nm/sec. $IrO_X$ films formed under these conditions are equal in quality and have a resistivity of 300 Ω·cm.

Therefore, it is necessary to optimize $O_2$ gas ratio, while taking sputtering power ($IrO_X$ film formation rate) at $IrO_X$ film formation time into consideration. For example, if an $IrO_X$ film formation rate is set to 1.0 nm/sec to 2.5 nm/sec, then the optimum range of $O_2$ gas ratio is 2% to 15%. If an $IrO_X$ film formation rate is set to 2.6 nm/sec to 4.0 nm/sec, then the optimum range of $O_2$ gas ratio is 4% to 20%. If an $IrO_X$ film formation rate is set to 4.1 nm/sec to 7.0 nm/sec, then the optimum range of $O_2$ gas ratio is 6% to 30%.

For example, results obtained by examining the orientation of an $IrO_X$ film formed at a temperature of 60° C. by supplying 0.5 kilowatts of sputtering power ($IrO_X$ film formation rate is 1.6 nm/sec) in an atmosphere of mixed gas in which $O_2$ gas ratio is 7%, the orientation of the $IrO_X$ film after raising the temperature at the time of forming a PZT film by the MOCVD method, and the orientation of the PZT film formed will be described.

Figure 25:
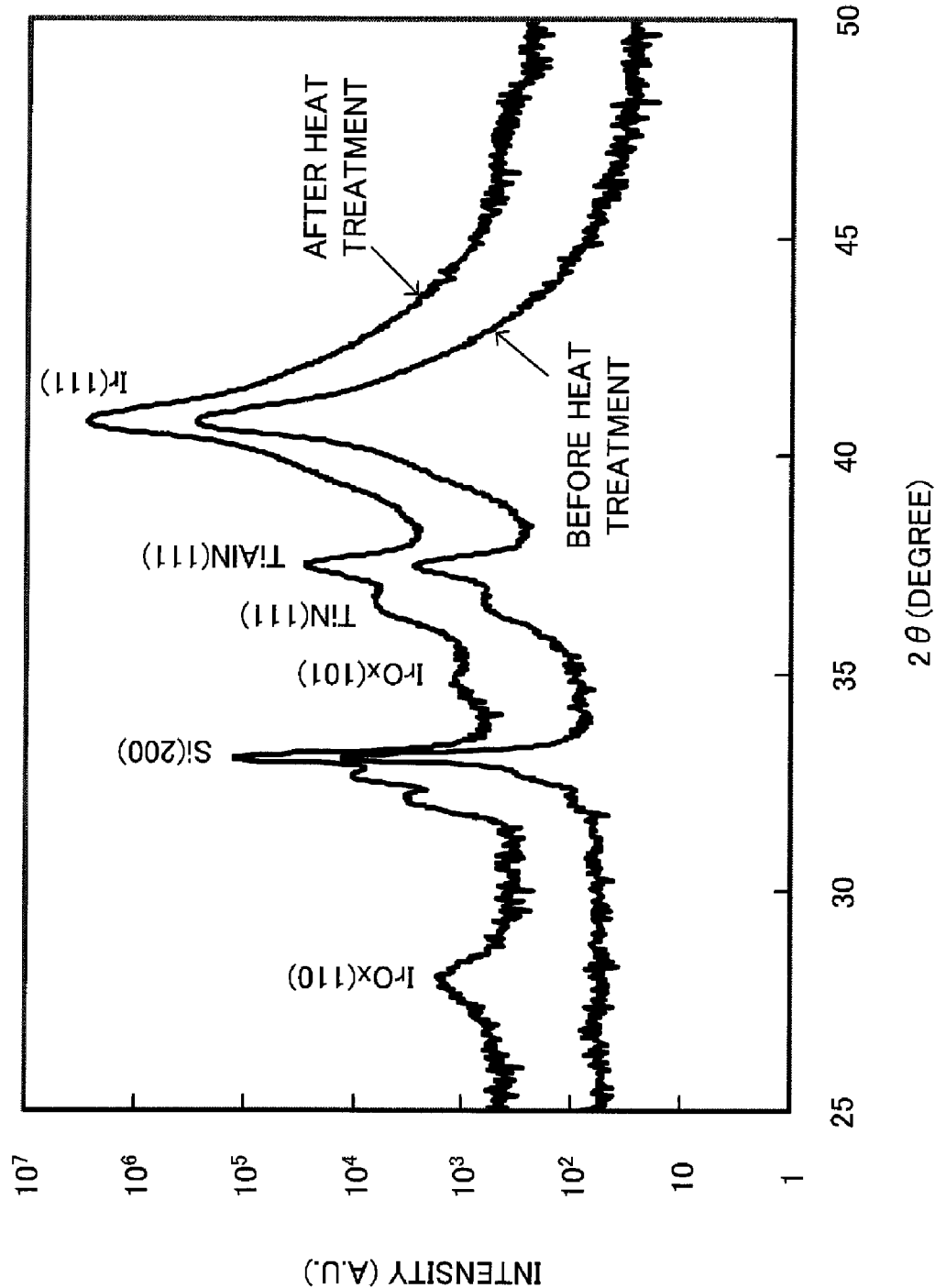
FIG. 25 illustrates X-ray diffraction data on an $IrO_X$ film before and after raising the temperature.
Figure 26:
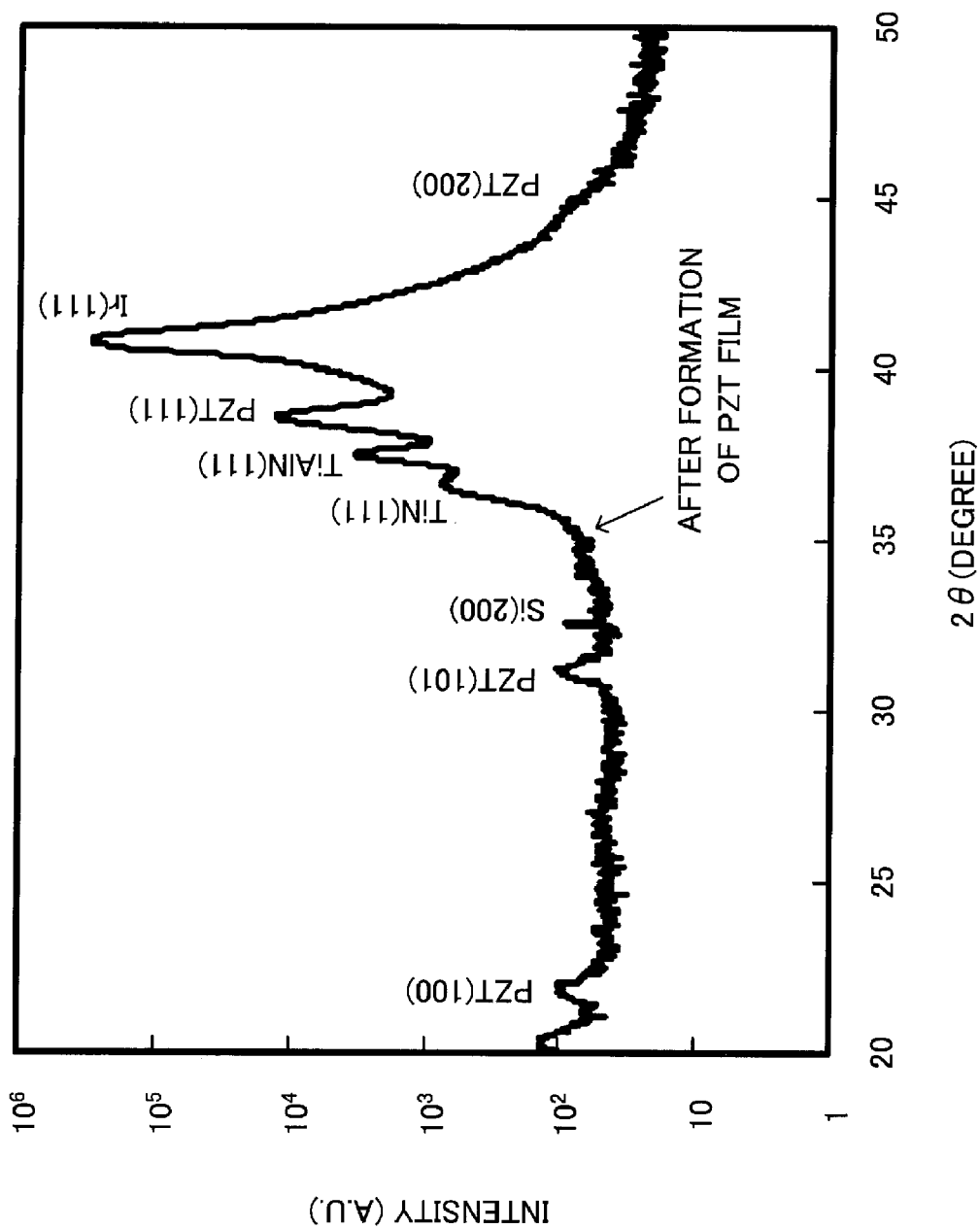
FIG. 26 illustrates X-ray diffraction data on a PZT film.

FIG. 25 illustrates X-ray diffraction data on the $IrO_X$ film before and after raising the temperature. FIG. 26 illustrates X-ray diffraction data on the PZT film.

As can be seen from FIG. 25, a peak corresponding to $IrO_X$ does not appear in the X-ray diffraction data on the $IrO_X$ film formed at a temperature of 60° C. by supplying 0.5 kilowatts of sputtering power in an atmosphere of mixed gas in which $O_2$ gas ratio is 7% (before heat treatment corresponding to raising the temperature at the time of forming the PZT film by the MOCVD method). That is to say, the $IrO_X$ film just after the formation is not crystalline. Heat treatment ($O_2$ gas ratio is 100%) corresponding to raising the temperature at the time of forming the PZT film by the MOCVD method is performed on the $IrO_X$ film. Peaks corresponding to the (110) plane and (101) plane of the $IrO_X$ film appear in the X-ray diffraction data on the $IrO_X$ film after the heat treatment. That is to say, it is ascertained that the $IrO_X$ film is crystallized by the heat treatment.

In the case where an $IrO_X$ film is formed at a temperature of 60° C. by supplying 0.5 kilowatts of sputtering power in an atmosphere of mixed gas in which $O_2$ gas ratio is 7%, where the predetermined process of raising the temperature is undergone, and where a PZT film is formed, as can be seen from FIG. 26, the peak corresponding to the (110) plane or (101) plane of the $IrO_X$ film does not appear in the X-ray diffraction data on the $IrO_X$ film after the formation of the PZT film. A marked peak corresponding to the (111) plane of an Ir film appears. That is to say, it is ascertained that the $IrO_X$ film is reduced to an Ir film which is preferentially oriented along the (111) plane in the process of forming the PZT film.

In addition, a section of the PZT film and lower electrode formed is examined by bright field-scanning transmission electron microscopy (BF-STEM) and energy dispersive X-ray (EDX) spectroscopy.

Figure 27:
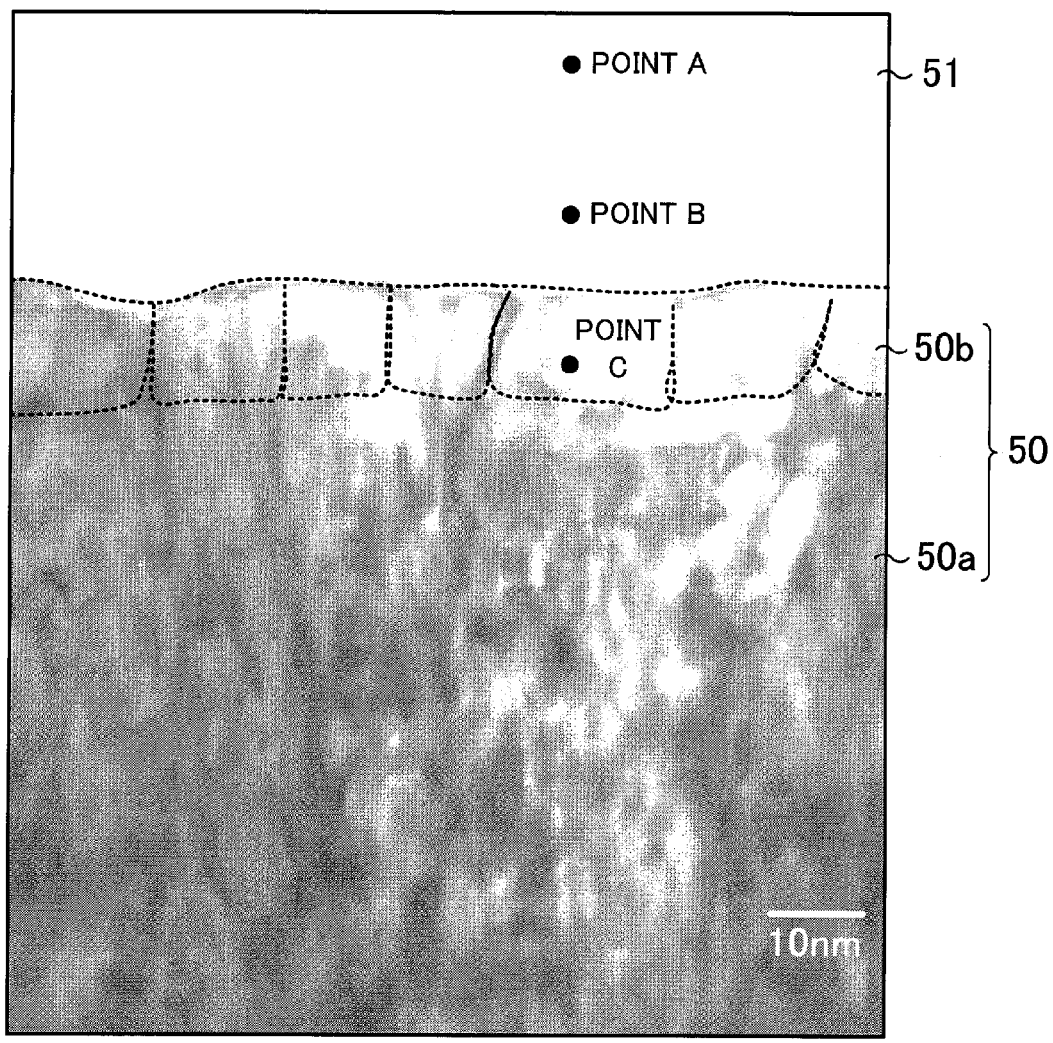
FIG. 27 is an image obtained by BF-STEM.
Figure 28:
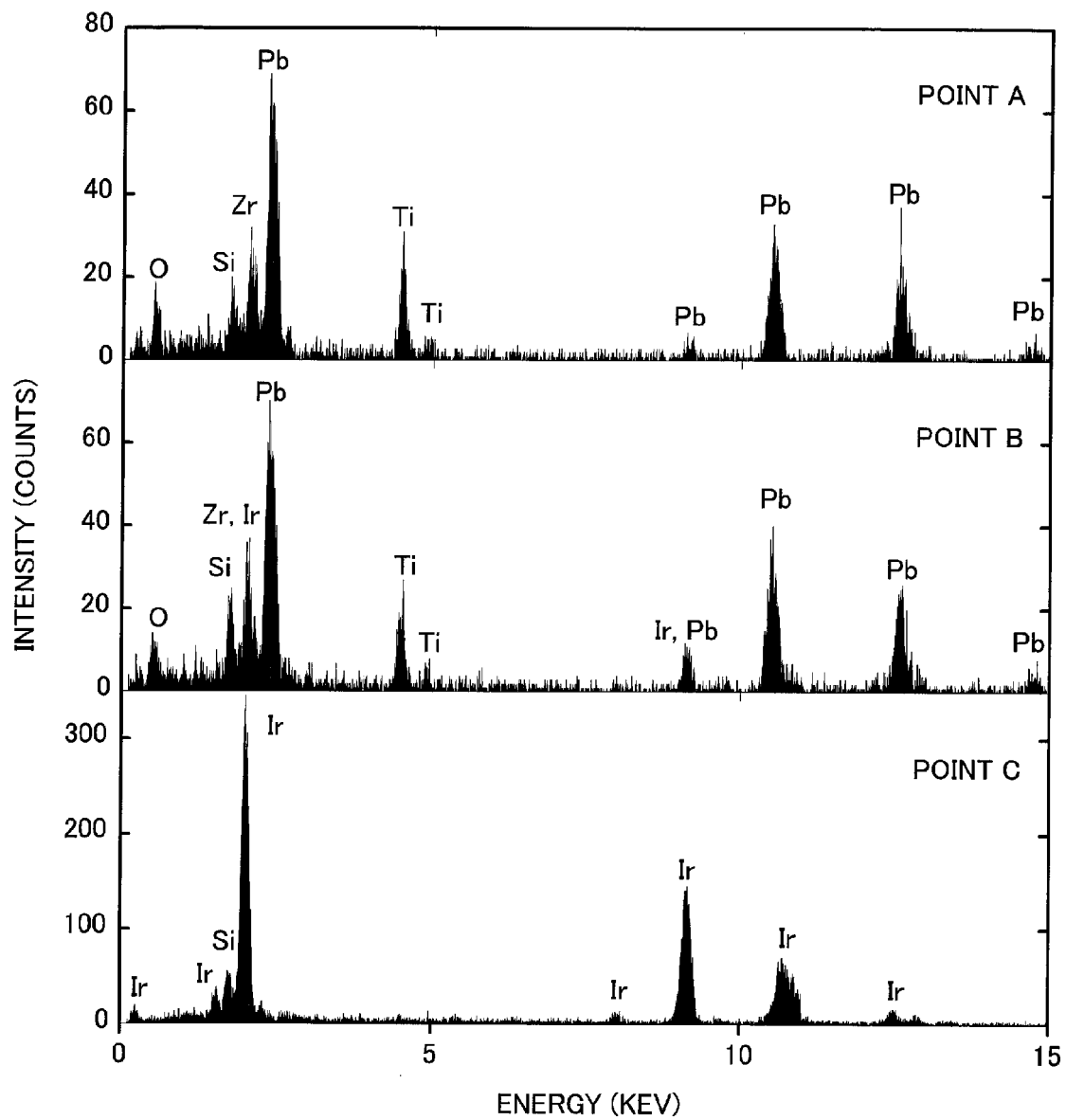
FIG. 28 is EDX spectra.

FIG. 27 is an image obtained by BF-STEM. FIG. 28 is EDX spectra.

As can be seen from FIG. 27, an observation by BF-STEM reveals that a lower electrode 50 has a two-layer structure including Ir films 50a and 50b, that columnar crystal grains contained in the Ir film 50a and columnar crystal grains contained in the Ir film 50b differ in diameter, and that a PZT film 51 is formed over the above lower electrode 50. The Ir film 50b corresponding to an upper layer portion is originally an $IrO_X$ film. This $IrO_X$ film is reduced to the Ir film 50b at the time of forming the PZT film 51. The Ir film 50a corresponding to a lower layer portion is formed under the $IrO_X$ film. The diameter of crystal grains contained in the Ir film 50b corresponding to the upper layer portion of the lower electrode 50 is smaller than that of crystal grains contained in the Ir film 50a corresponding to the lower layer portion of the lower electrode 50 and is, on average, 11 nm.

FIG. 28 is EDX spectra obtained at a point (point A) in the PZT film 51, a point (point B) near an interface between the PZT film 51 and the Ir film 50b, and a point (point C) in the Ir film 50b in the section of which the above observation by BF-STEM is made. Aside from Si, Pb, Zr, Ti, and O are detected at point A, Pb, Zr, Ti, Ir, and O are detected at point B, and Ir is detected at point C. That is to say, Ir is not detected at point A in the PZT film 51 and is detected only at point B near the interface between the PZT film 51 and the Ir film 50b and at point C in the Ir film 50b. The diffusion of Ir from the Ir film 50b into the PZT film 51 (point A) is not observed.

As can be seen from FIG. 28, only Ir is detected at point C in the Ir film 50b (aside from Si). This means that the $IrO_X$ film is reduced completely at the time of forming the PZT film 51. Therefore, by controlling the conditions under which an $IrO_X$ film is formed, the $IrO_X$ film can be reduced completely to an Ir film in which the diameter of crystal grains is small at the time of forming a PZT film by MOCVD method. As a result, the orientation of the PZT film can be improved significantly.

Figure 29:
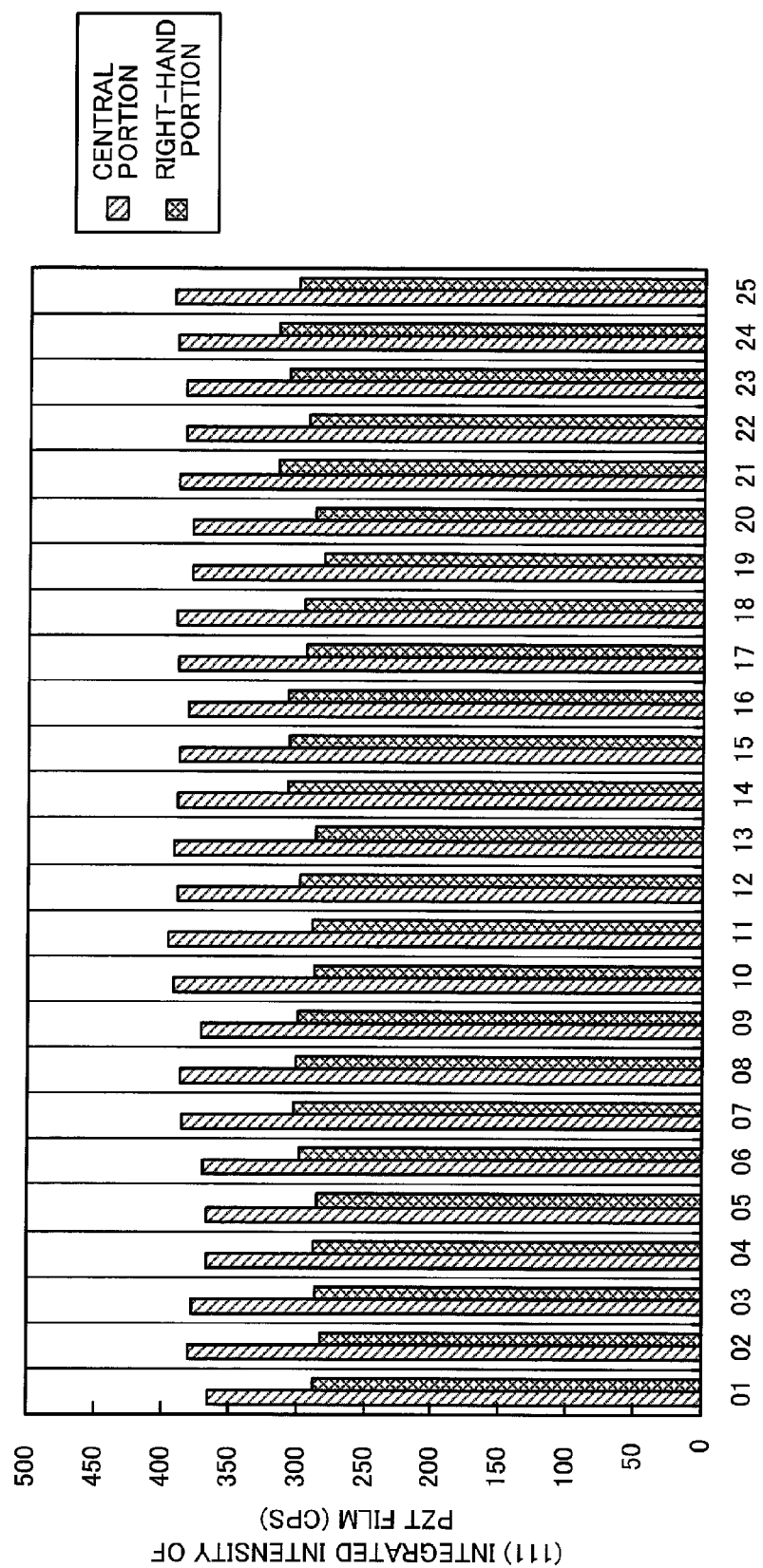
FIG. 29 illustrates the (111) integrated intensity of a PZT film formed over each of a plurality of wafers.
Figure 30:
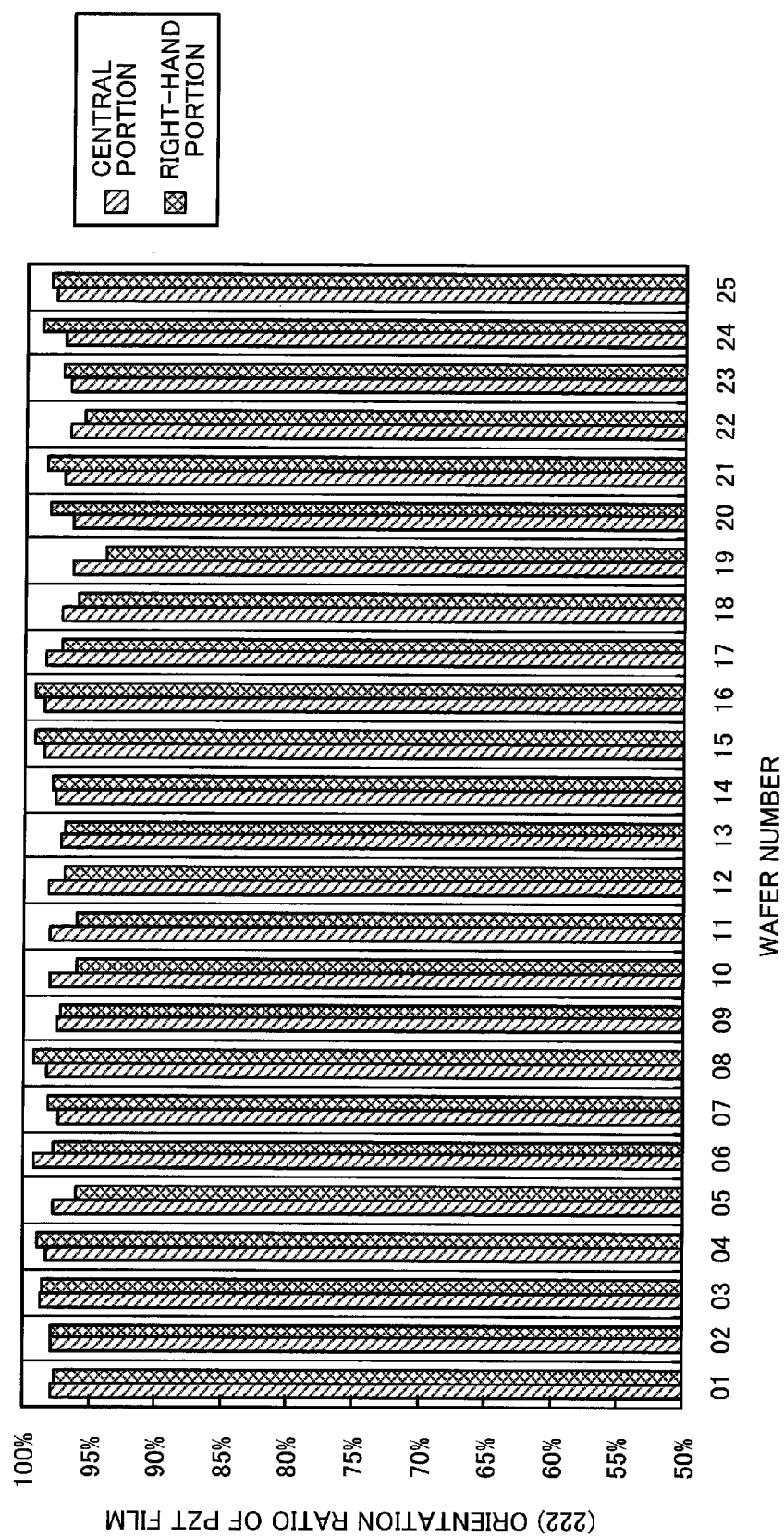
FIG. 30 illustrates the (222) orientation ratio of a PZT film formed over each of the plurality of wafers.

In addition, results obtained by examining variations in the distribution of orientation on a wafer and among wafers are illustrated in FIGS. 29 and 30.

FIG. 29 illustrates the (111) integrated intensity of a PZT film formed over each of a plurality of wafers. FIG. 30 illustrates the (222) orientation ratio of a PZT film formed over each of the plurality of wafers.

An Ir film, an $IrO_X$ film, and a PZT film are formed in succession over each of 25 wafers. From the above knowledge, the $IrO_X$ film is formed by supplying 0.5 kilowatts of sputtering power in an atmosphere of mixed gas which contains Ar gas and $O_2$ gas the flow rates of which are 186 sccm and 14 sccm respectively (ratio of $O_2$ gas is 7%). At this time $IrO_X$ film formation temperature is 60° C., an $IrO_X$ film formation rate is 1.6 nm/sec, and $IrO_X$ film thickness is 30 nm. The PZT film is formed under the conditions under which the first PZT film illustrated in the above FIG. 5 is formed. The crystal structure of a PZT film formed over each wafer is examined by the use of an X-ray diffraction apparatus.

As can be seen from FIG. 29, variation in the (111) integrated intensity of a PZT film is very small among central or right-hand portions of the 25 wafers. Even if the PZT films are formed in succession over the 25 wafers, variation in the (111) integrated intensity of a PZT film is vary small among the 25 wafers. As can be seen from FIG. 30, the difference in the (222) orientation ratio of a PZT film between central and right-hand portions of each wafer is very small. The (222) orientation ratio of a PZT film in a central or right-hand portion of each wafer is 94% or higher. In addition, variation in the (222) orientation ratio of a PZT film among the 25 wafers is also very small.

As has been described, by adopting the FeRAM manufacturing method according to the first embodiment, a ferroelectric capacitor in which the orientation of a ferroelectric film is good and in which variation in the orientation of the ferroelectric film is vary small can be obtained. Therefore, a high-performance FeRAM with high reliability can be manufactured stably.

A second embodiment of the present invention will now be described. In descriptions of the second embodiment the same members that are described in the above first embodiment are marked with the same symbols.

Figure 31:
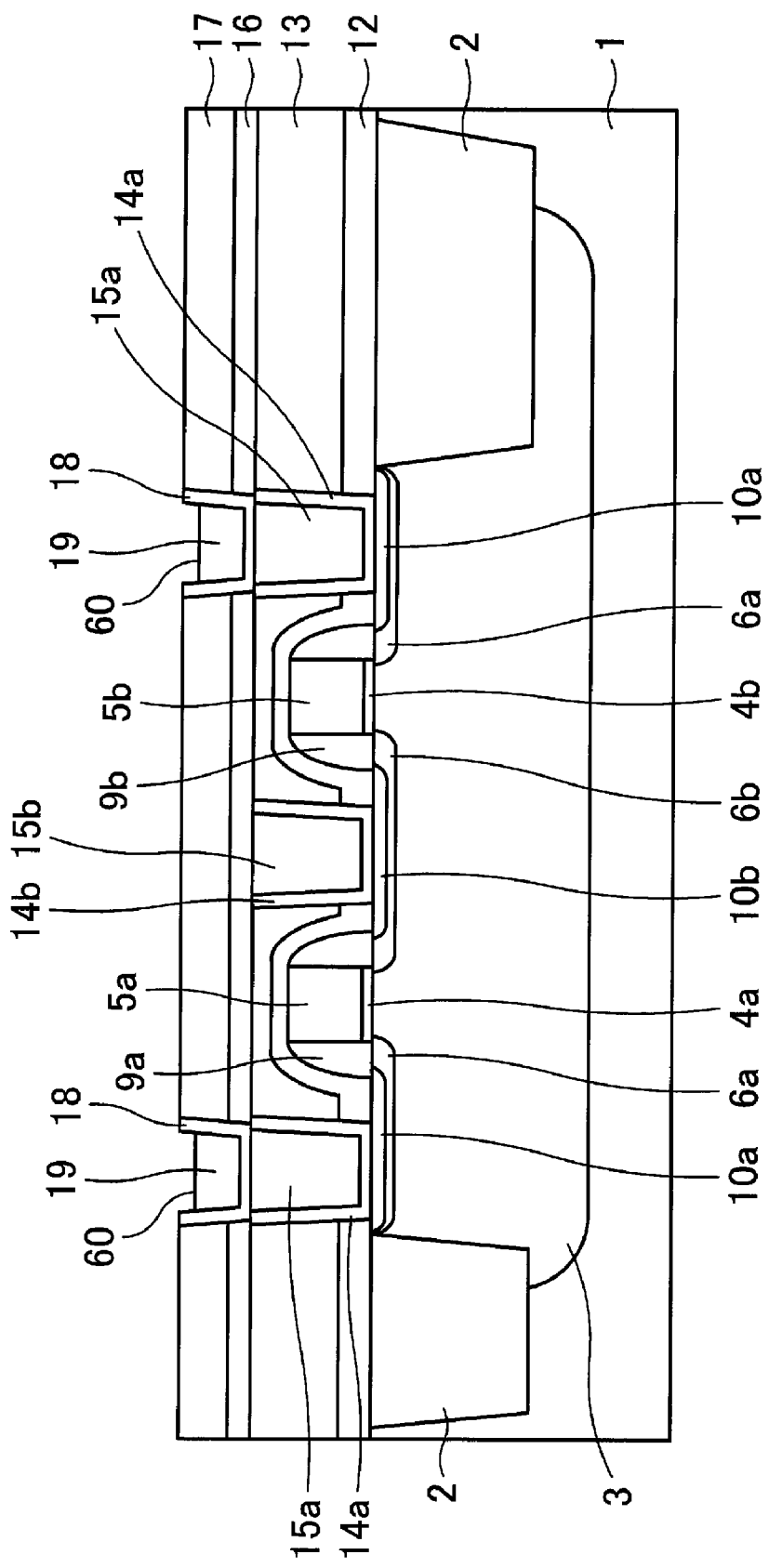
FIG. 31 is a fragmentary schematic sectional view of a FeRAM after the formation of a glue film and W plugs included in a FeRAM manufacturing method according to a second embodiment of the present invention.

FIG. 31 is a fragmentary schematic sectional view of a FeRAM after the formation of a glue film and W plugs included in a FeRAM manufacturing method according to a second embodiment of the present invention.

With the FeRAM manufacturing method according to the above first embodiment, as illustrated in FIG. 2, contact holes are made first in the second interlayer dielectric film 17 in the step of forming the glue films 18 and the W plugs 19. After that, a Ti film, a TiN film, and a W film are formed over an entire surface. The Ti film, the TiN film, and the W film are then polished (over-polished) by the CMP method so that the second interlayer dielectric film 17 will get exposed. After that, the foundation conductive film 20 and the anti-oxidation film 21 are formed.

As illustrated in FIG. 31, however, a concave portion 60 may be formed in the W plug 19 at polishing time. In this case, a surface after the polishing does not become flat. If the concave portion 60 is formed, the concave portion 60 has a depth of about 20 nm to 50 nm. The concave portion 60 has a great influence on the orientation of a lower electrode or PZT film to be formed later. Accordingly, in the second embodiment a foundation conductive film 20 formed after the polishing is made thick. By doing so, the foundation conductive film 20 is embedded in the concave portion 60.

In this case, $NH_3$ plasma treatment is performed first on a surface in which the concave portion 60 is formed after the polishing performed for forming the glue films 18 and the W plugs 19. This $NH_3$ plasma treatment may be performed under the same conditions that are described in the above first embodiment.

Figure 32:
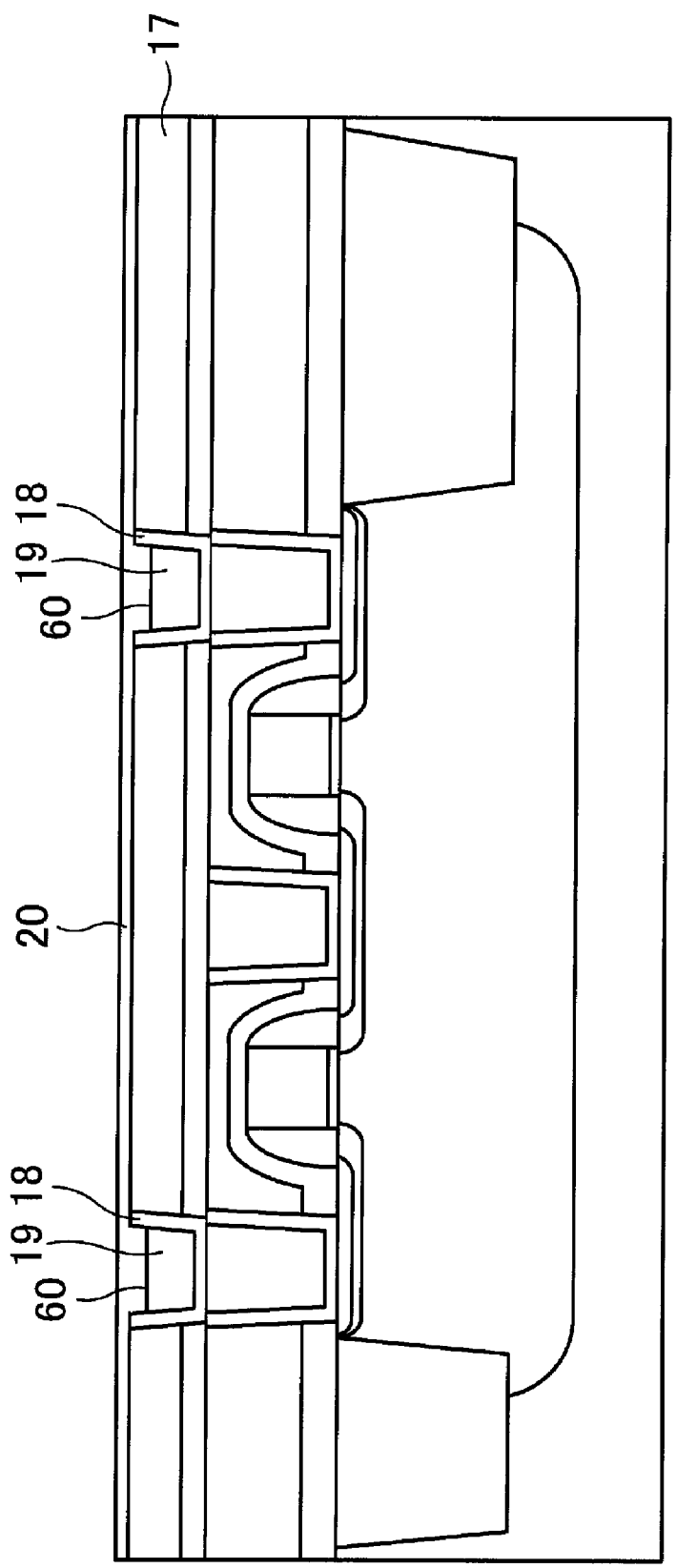
FIG. 32 is a fragmentary schematic sectional view of the step of forming a foundation conductive film included in the FeRAM manufacturing method according to the second embodiment of the present invention.

FIG. 32 is a fragmentary schematic sectional view of the step of forming a foundation conductive film included in the FeRAM manufacturing method according to the second embodiment of the present invention.

After the $NH_3$ plasma treatment is performed, a Ti film with a thickness of 100 nm is formed over an entire surface which is preferentially oriented along the (002) plane. For example, at this time a sputtering system in which the distance between a wafer to be treated and a target is set to 60 mm is used, the temperature of a substrate is set to 20° C., 2.6 kilowatts of sputtering power is supplied for 35 seconds in an atmosphere of Ar under a pressure of 0.15 Pa. RTA treatment is then performed for 60 seconds at a temperature of 650° C. in an atmosphere of $N_2$. By doing so, a foundation conductive film 20 of a TiN film which is preferentially oriented along the (111) plane is formed. In this case, the thickness of the foundation conductive film 20 is about 100 nm. However, the thickness of the foundation conductive film 20 can be set properly in the range of 100 nm to 300 nm according to, for example, the depth of the concave portion 60. In this case, a TiN film is used as the foundation conductive film 20. However, a W film, a polycrystalline Si film, a Cu film, or the like may be used.

Just after the foundation conductive film 20 is formed, a concave portion is also formed in a surface of the foundation conductive film 20 because of the presence of the concave portion 60. Accordingly, after the foundation conductive film 20 is formed, a surface portion of the foundation conductive film 20 is polished by the CMP method. After the polishing is performed, the influence of the concave portion 60 is curbed and a surface of the foundation conductive film 20 becomes flat. For example, SSW2000 manufactured by Cabot Microelectronics Corporation is used for polishing the foundation conductive film 20. The thickness of the foundation conductive film 20 after the polishing is set to 50 nm to 100 nm, preferably to 50 nm.

Polishing the surface portion of the foundation conductive film 20 in this way tends to cause distortion in crystals near the surface of the foundation conductive film after the polishing. Such distortion has a great influence on the orientation of a lower electrode or PZT film to be formed later. Accordingly, $NH_3$ plasma treatment, for example, is performed on the surface of the foundation conductive film 20 after the polishing. This is the same with the above case. By doing so, distortion caused in crystals near the surface of the foundation conductive film 20 after the polishing is eliminated.

The state illustrated in FIG. 32 is obtained by performing the above step.

Figure 33:
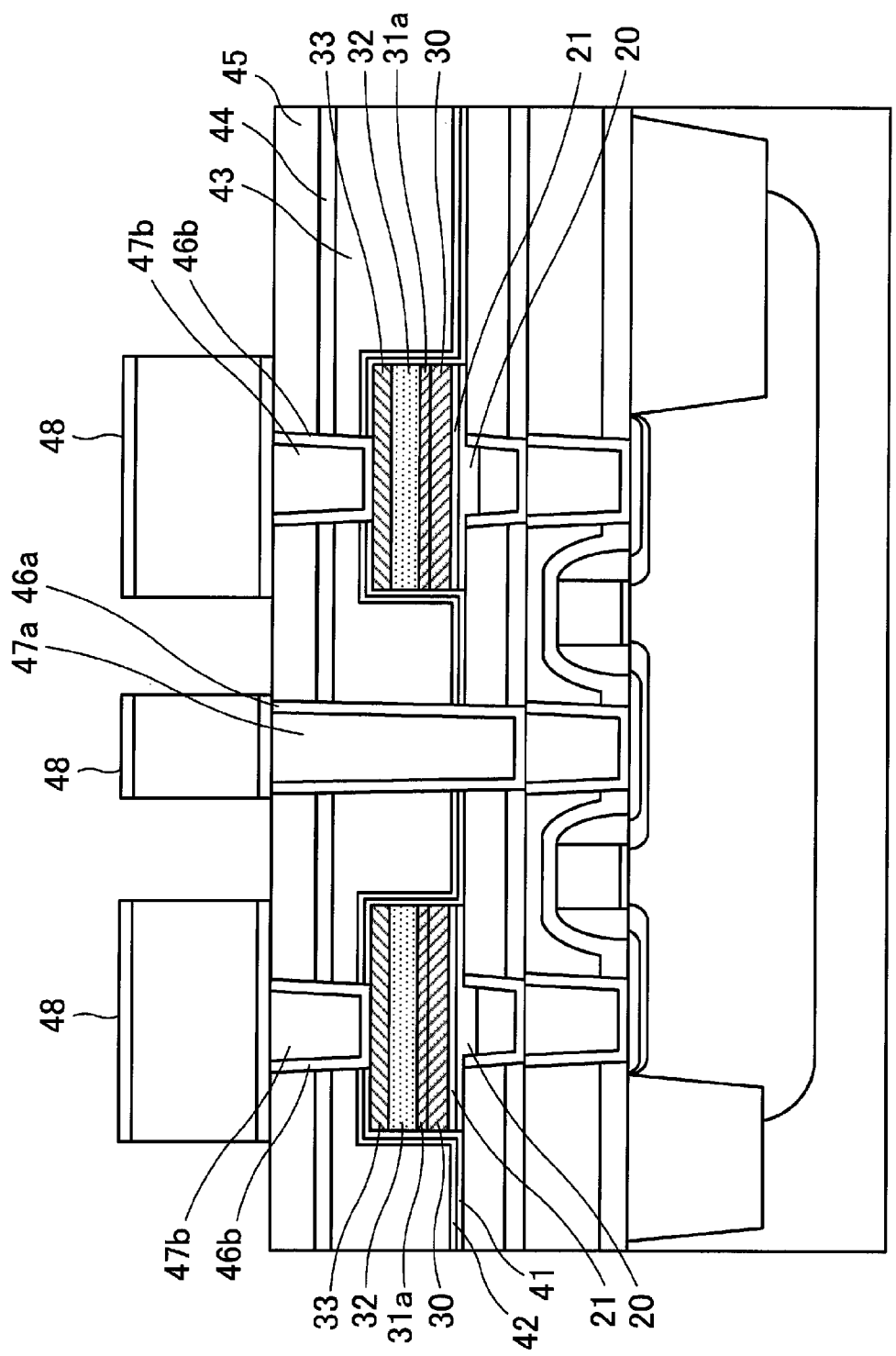
FIG. 33 is a fragmentary schematic sectional view of a FeRAM manufactured by the FeRAM manufacturing method according to the second embodiment of the present invention.

FIG. 33 is a fragmentary schematic sectional view of a FeRAM manufactured by the FeRAM manufacturing method according to the second embodiment of the present invention.

After the polishing and the $NH_3$ plasma treatment are performed in the above way, the same flow that is described in the above first embodiment is followed.

That is to say, an anti-oxidation film 21 is formed first over the foundation conductive film 20. An Ir film 30, an $IrO_X$ film 31 (which is reduced to an Ir film 31a), a PZT film 32, and an upper electrode 33 are then formed and patterning is performed on them. Moreover, patterning is performed on the anti-oxidation film 21 and the foundation conductive film 20 formed thereunder. After that, a first AlO film 41, a second AlO film 42, a third interlayer dielectric film 43, a barrier film 44, a fourth interlayer dielectric film 45, glue films 46a and 46b, and W plugs 47a and 47b are formed and wirings 48 are formed. By doing so, a first wiring layer is formed. As a result, the structure illustrated in FIG. 33 is obtained.

After that, a second and later wiring layers are formed in the same way to complete the FeRAM.

Results obtained by examining the electrical properties of a FeRAM manufactured by the method explained in the second embodiment will now be described.

Each of (amorphous or microcrystalline) $IrO_X$ films formed under different conditions is formed over an Ir film. After that, a PZT film and an upper electrode are formed. By doing so, each ferroelectric capacitor is formed. In addition, a PZT film and an upper electrode are formed over an Ir film without the formation of an $IrO_X$ film to form a ferroelectric capacitor. If an $IrO_X$ film is formed, 0.5 kilowatts of sputtering power is supplied in an atmosphere of mixed gas in which the ratio of $O_2$ gas is 5, 6, or 7%. At this time $IrO_X$ film formation temperature is 60° C., an $IrO_X$ film formation rate is 1.6 nm/sec, and $IrO_X$ film thickness is 30 nm. The Ir film, the PZT film, and the upper electrode are formed under the conditions indicated in the steps of the above first embodiment illustrated in FIGS. 3, 5, and 6 respectively. After each ferroelectric capacitor is formed, first through fifth wiring layers are formed. The electrical properties of each ferroelectric capacitor are measured. Results obtained are illustrated in FIGS. 34 through 37.

Figure 34:
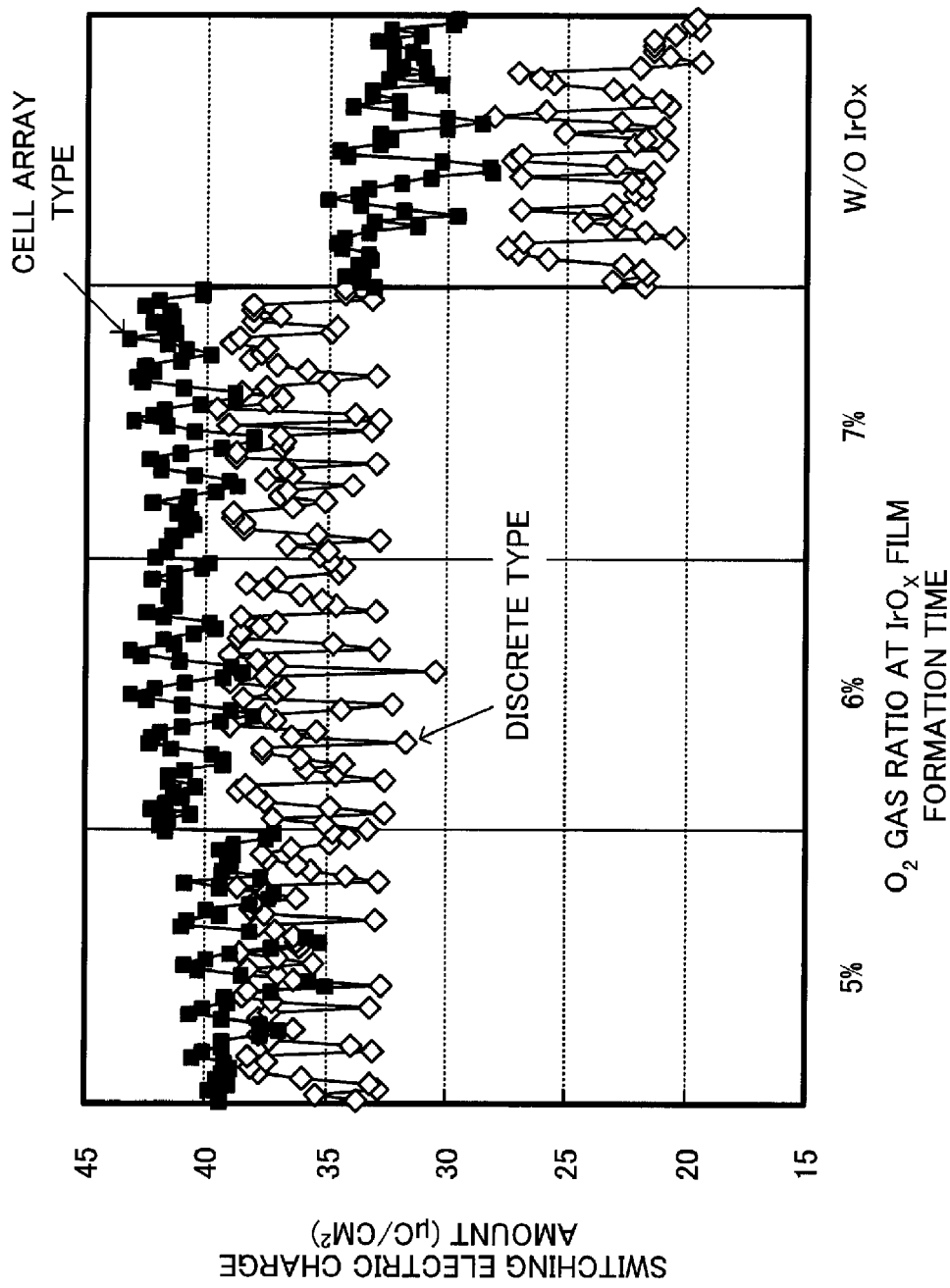
FIG. 34 illustrates results obtained by measuring a switching electric charge amount (part 1)
Figure 35:
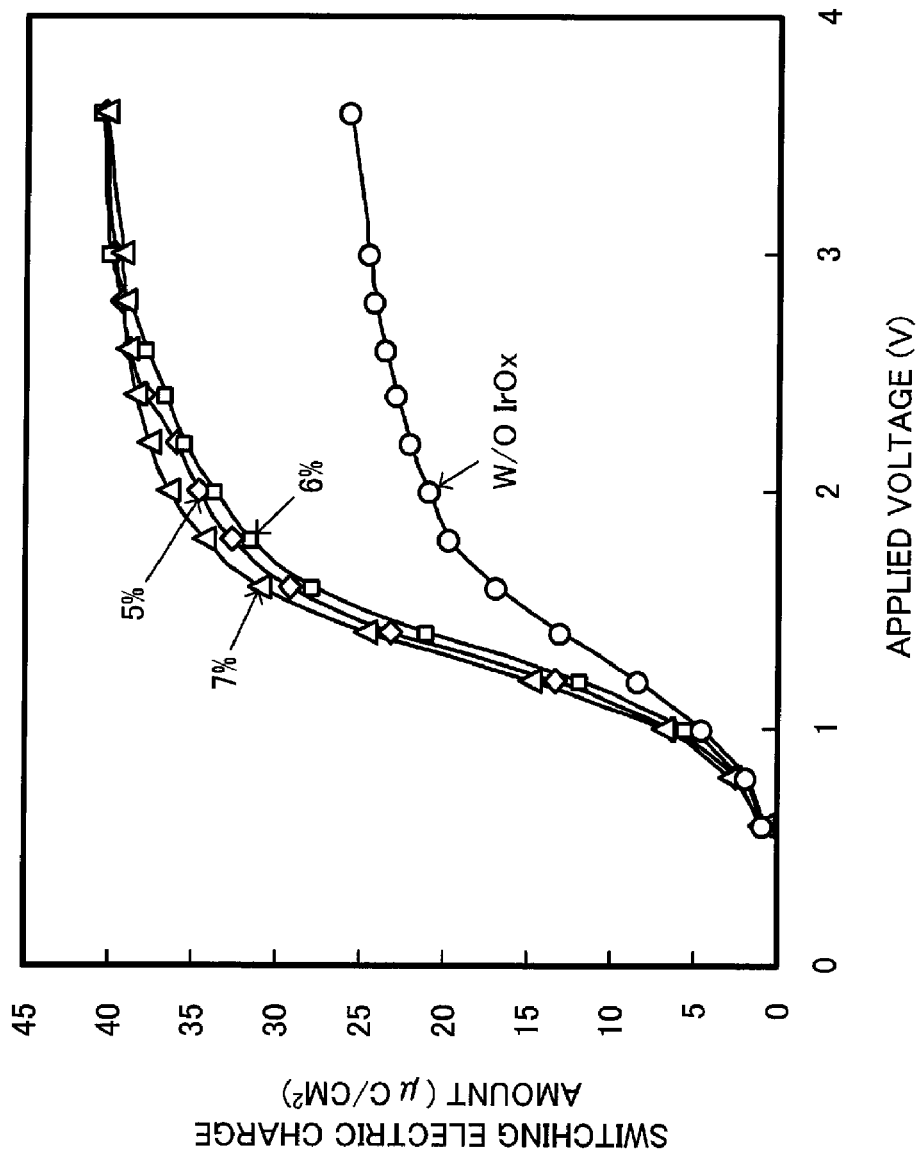
FIG. 35 illustrates results obtained by measuring a switching electric charge amount (part 2)
Figure 36:
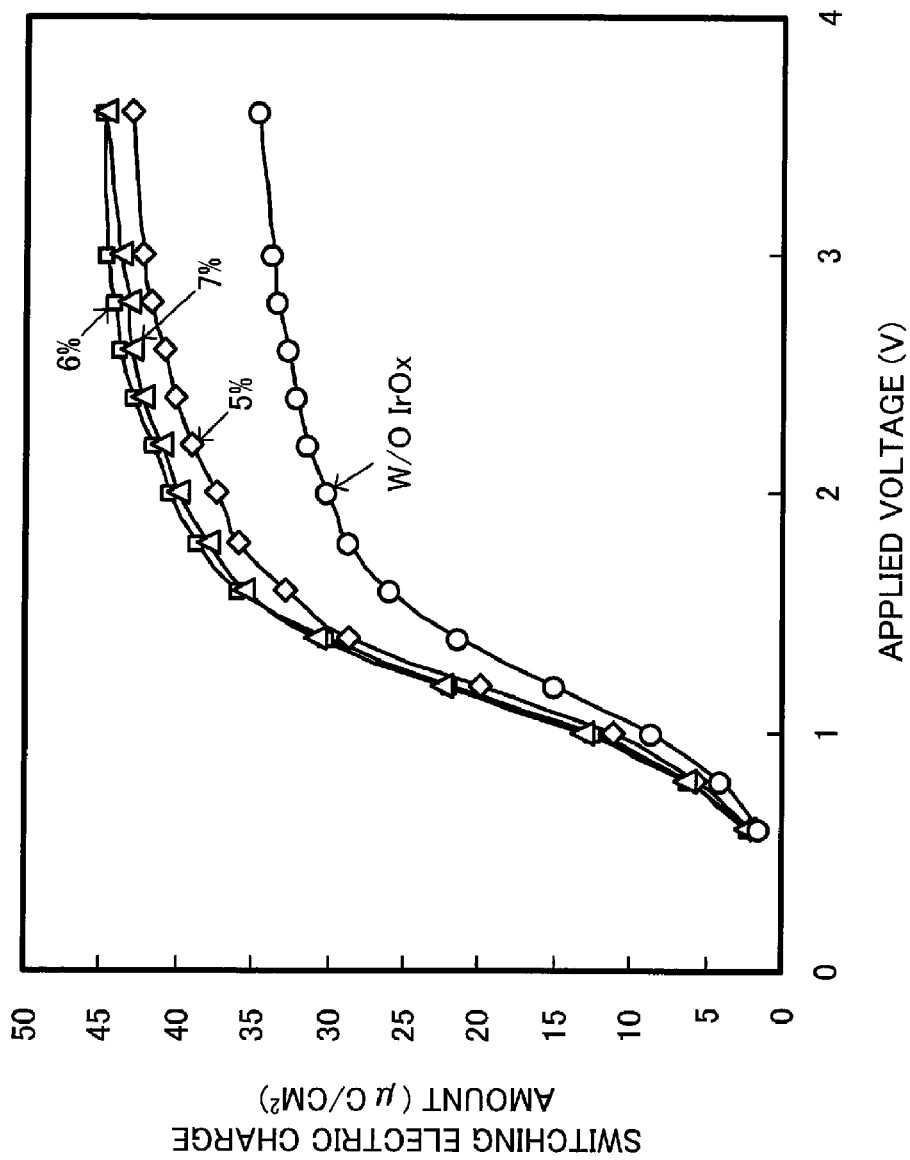
FIG. 36 illustrates results obtained by measuring a switching electric charge amount (part 3)
Figure 37:
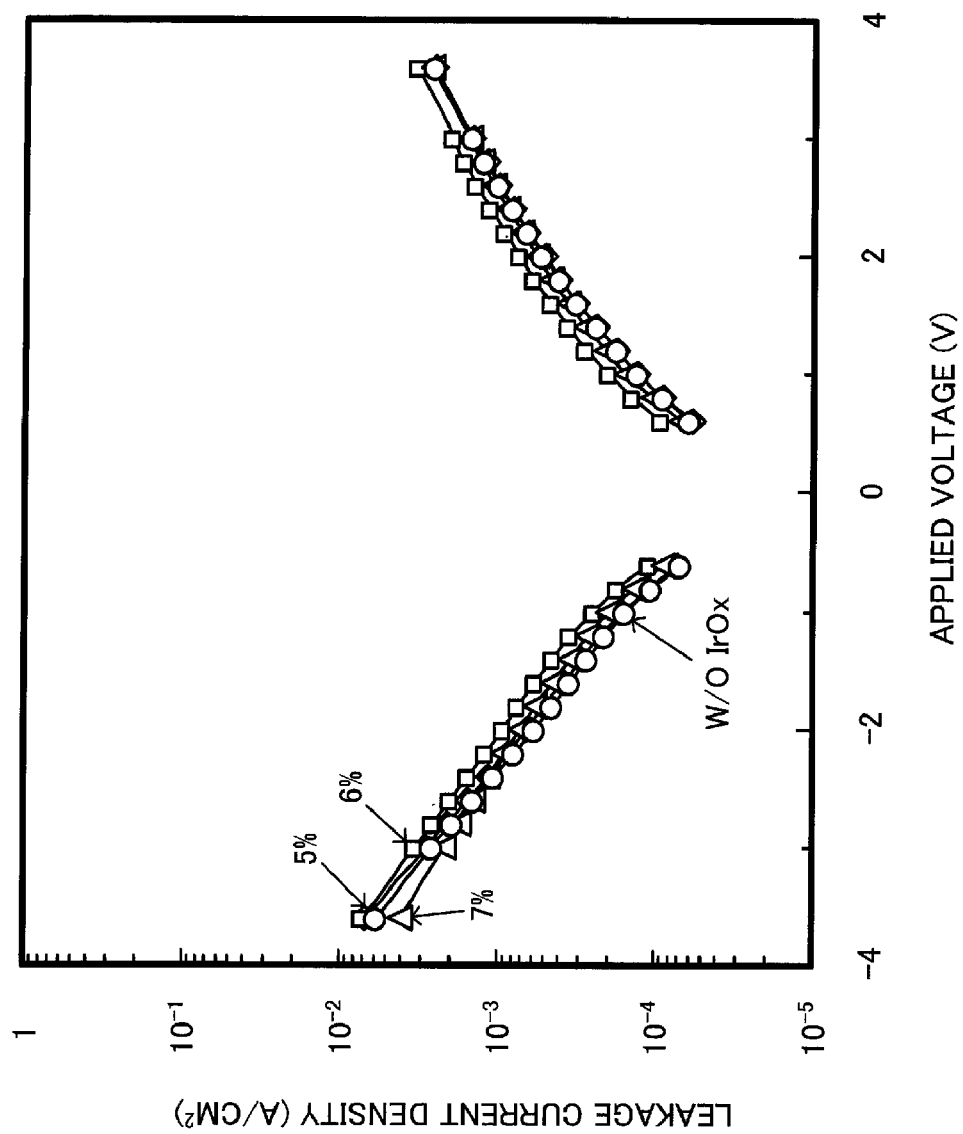
FIG. 37 illustrates results obtained by measuring leakage current density.

FIGS. 34 through 36 illustrate results obtained by measuring a switching electric charge amount and FIG. 37 illustrates results obtained by measuring leakage current density.

FIG. 34 illustrates results obtained by measuring a switching electric charge amount in 50 ferroelectric capacitors (of a discrete type) each of which is 50×50 μm in size, which are formed isolatedly over a Si substrate under the above predetermined conditions, and to which a voltage of 1.8 volts is applied and by measuring a switching electric charge amount in 50 cell regions (of a cell array type) each including 5,152 ferroelectric capacitors each of which is 0.7×0.7 μm in size, which are formed densely over a Si substrate under the above predetermined conditions, and to which a voltage of 1.8 volts is applied.

As can be seen from FIG. 34, a switching electric charge amount is small in the case where an $IrO_X$ film is not formed (W/O $IrO_X$), compared with the case where an $IrO_X$ film is formed ($O_2$ gas ratio is 5, 6, or 7%). This applies both to the discrete type and to the cell array type. As stated above, if an $IrO_X$ film is not formed, the intensity of the orientation of the (111) plane of a PZT film which contributes to polarization inversion is low. Accordingly, a switching electric charge amount is small in such a ferroelectric capacitor. On the other hand, if an $IrO_X$ film is formed, the intensity of the orientation of the (111) plane of a PZT film becomes higher and a switching electric charge amount becomes larger in such a ferroelectric capacitor.

FIG. 34 demonstrates the following tendency. A switching electric charge amount in a ferroelectric capacitor is slightly large in the case where $O_2$ gas ratio at $IrO_X$ film formation time is 6 or 7%, compared with the case where $O_2$ gas ratio at $IrO_X$ film formation time is 5%.

FIGS. 35 and 36 illustrate results obtained by measuring a switching electric charge amount in the ferroelectric capacitors while varying applied voltage. FIG. 35 illustrates results obtained by measuring a switching electric charge amount in the ferroelectric capacitors of the discrete type. FIG. 36 illustrates results obtained by measuring a switching electric charge amount in the cell regions of the cell array type.

As can be seen from FIGS. 35 and 36, a switching electric charge amount in a ferroelectric capacitor is large to saturation voltage in the case where an $IrO_X$ film is formed ($O_2$ gas ratio is 5, 6, or 7%), compared with the case where an $IrO_X$ film is not formed (W/O $IrO_X$). Moreover, a slope in a low voltage region is sharp in the case where an $IrO_X$ film is formed under the condition that $O_2$ gas ratio is 5, 6, or 7%, compared with the case where an $IrO_X$ film is not formed. If an $IrO_X$ film is formed under the predetermined conditions and the orientation of a PZT film is improved, a switching electric charge amount in a ferroelectric capacitor increases significantly with an increase in applied voltage. This is favorable especially for low voltage operation.

FIG. 37 illustrates the relationship between voltage applied to a ferroelectric capacitor of the cell array type and leakage current density. As can be seen from FIG. 37, there is no great difference in leakage current density in a ferroelectric capacitor between the case where an $IrO_X$ film is formed ($O_2$ gas ratio is 5, 6, or 7%) and the case where an $IrO_X$ film is not formed (W/O $IrO_X$). The formation of an $IrO_X$ film under the predetermined conditions does not have an influence on leakage current density in a ferroelectric capacitor.

By adopting the above FeRAM manufacturing method according to the second embodiment, a ferroelectric capacitor the surface of which is flat, in which the orientation of a ferroelectric film is good, and in which variation in the orientation ratio of the ferroelectric film is vary small can be obtained. Therefore, a high-performance FeRAM with high reliability can be manufactured stably.

A third embodiment of the present invention will now be described. In descriptions of the third embodiment the same members that are described in the above second embodiment are marked with the same symbols.

Figure 38:
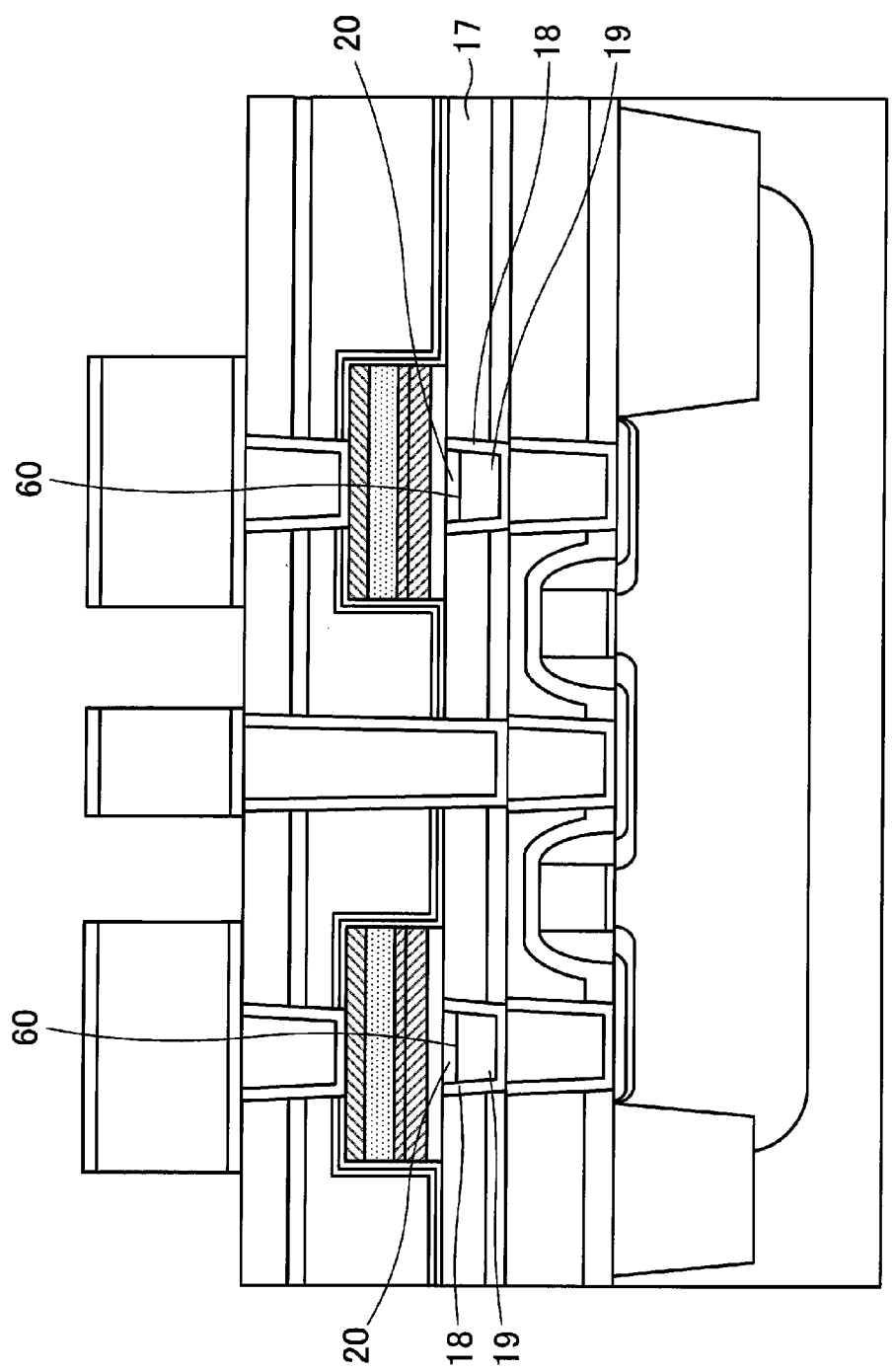
FIG. 38 is a fragmentary schematic sectional view of a FeRAM manufactured by a FeRAM manufacturing method according to a third embodiment of the present invention.

FIG. 38 is a fragmentary schematic sectional view of a FeRAM manufactured by a FeRAM manufacturing method according to a third embodiment of the present invention.

In the above second embodiment, as illustrated in FIG. 32, a state in which all of the second interlayer dielectric film 17, the glue films 18, and the W plugs 19 are covered with the foundation conductive film 20 is realized after the foundation conductive film 20 is polished.

In the third embodiment, on the other hand, a foundation conductive film 20 is polished until a second interlayer dielectric film 17 gets exposed. As illustrated in FIG. 38, the polishing is performed so that a state in which the foundation conductive film 20 is embedded only in concave portions 60 of W plugs 19 will be realized. After that, each process can be performed in accordance with the same flow that is described in the above second embodiment.

By adopting the FeRAM manufacturing method according to the third embodiment, a ferroelectric capacitor the surface of which is flat, in which the orientation of a ferroelectric film is good, and in which variation in the orientation ratio of the ferroelectric film is vary small can also be obtained. This is the same with the above second embodiment.

A fourth embodiment of the present invention will now be described. In descriptions of the fourth embodiment the same members that are described in the above first embodiment are marked with the same symbols.

Figure 39:
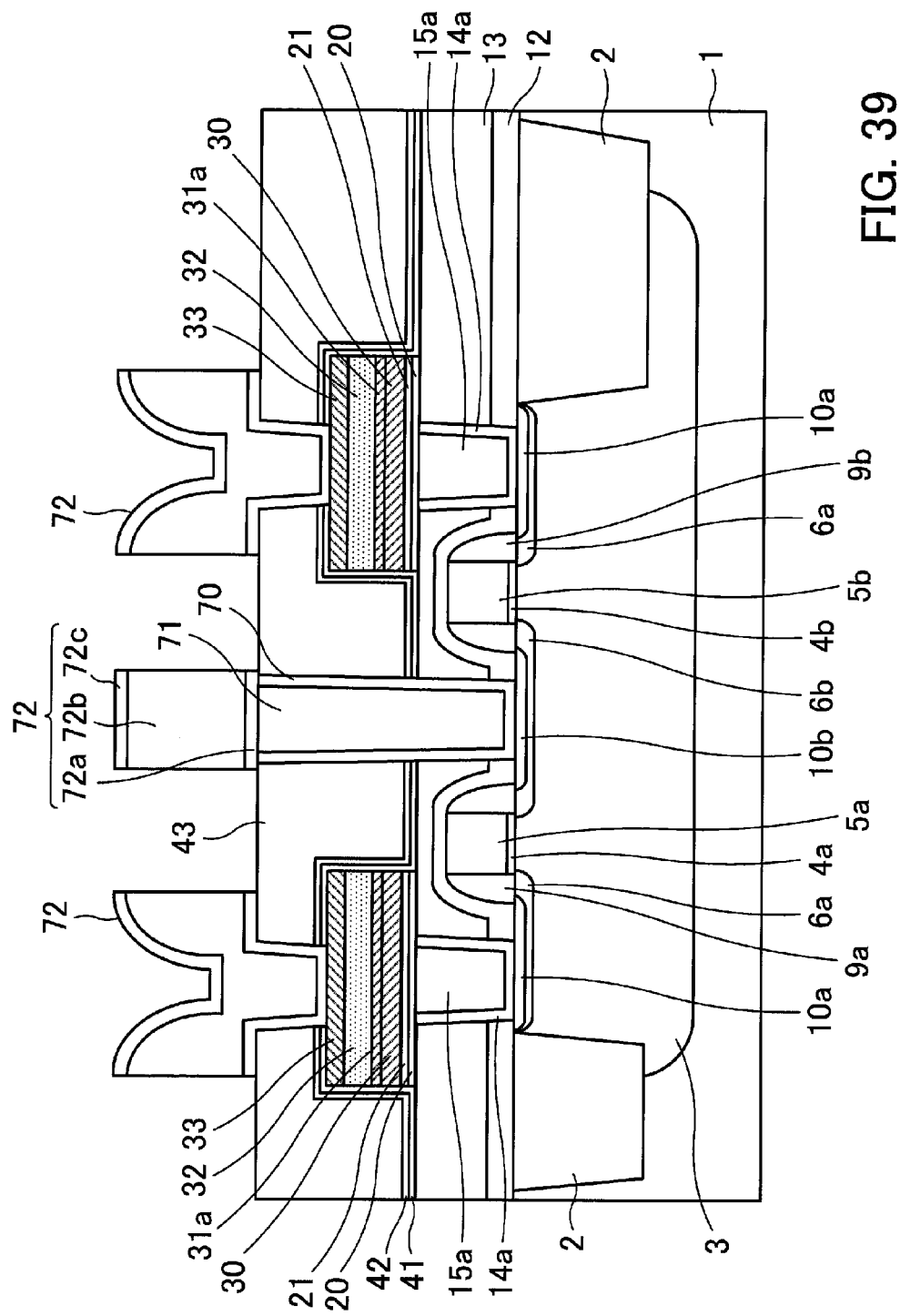
FIG. 39 is a fragmentary schematic sectional view of a FeRAM manufactured by a FeRAM manufacturing method according to a fourth embodiment of the present invention.
Figure 40:
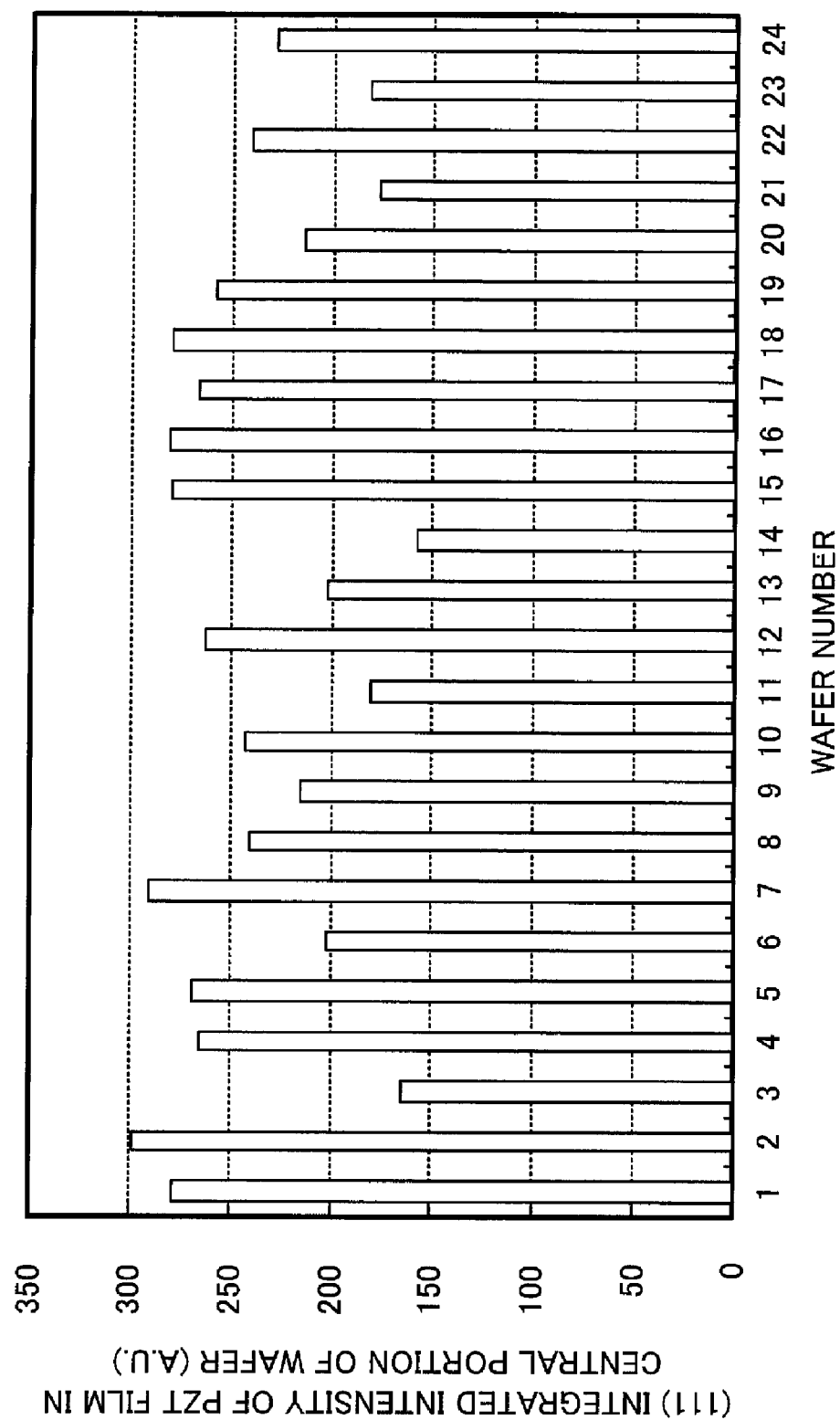
FIG. 40 illustrates the (111) integrated intensity of a PZT film in a central portion of each wafer.
Figure 41:
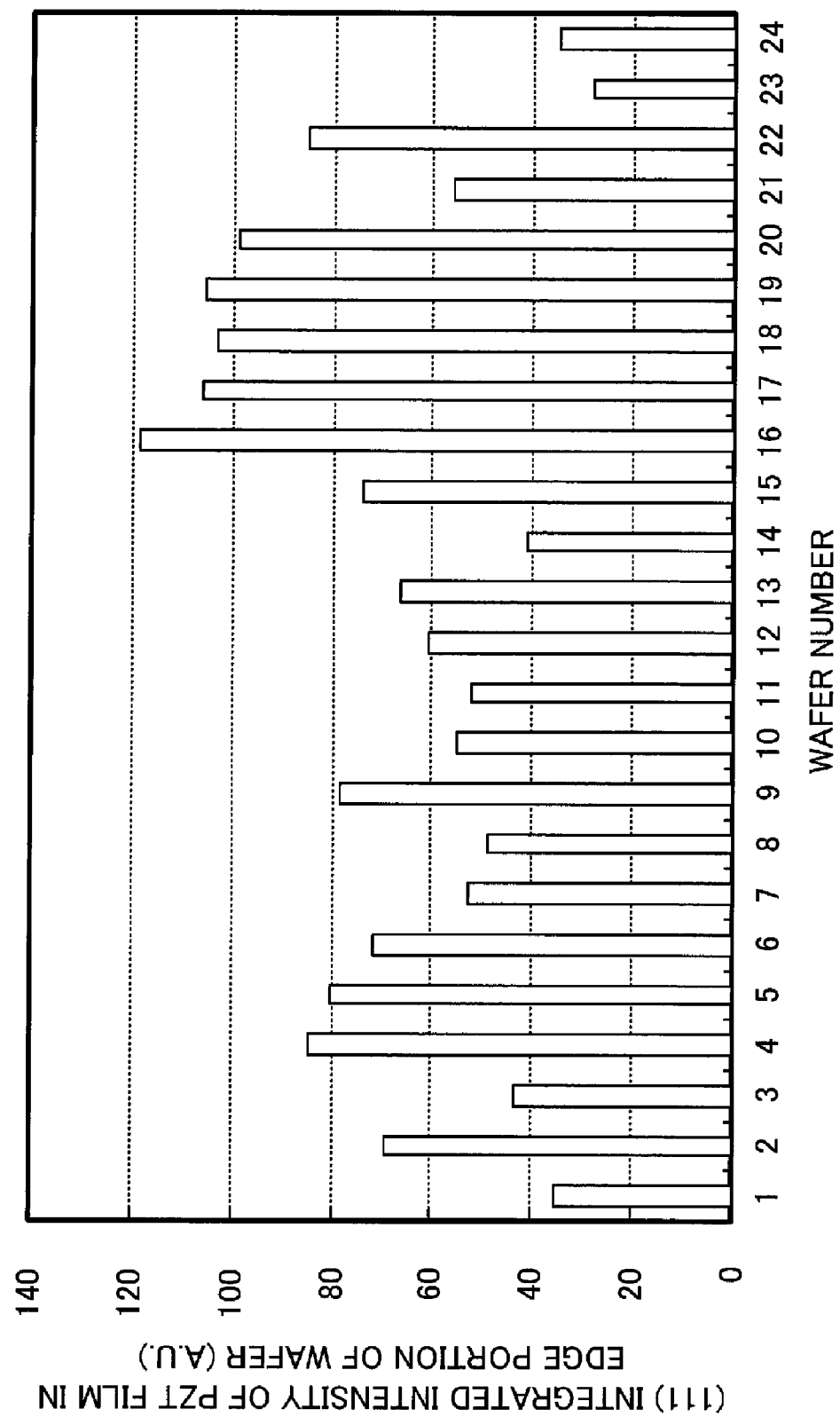
FIG. 41 illustrates the (111) integrated intensity of a PZT film in an edge portion of each wafer.
Figure 42:
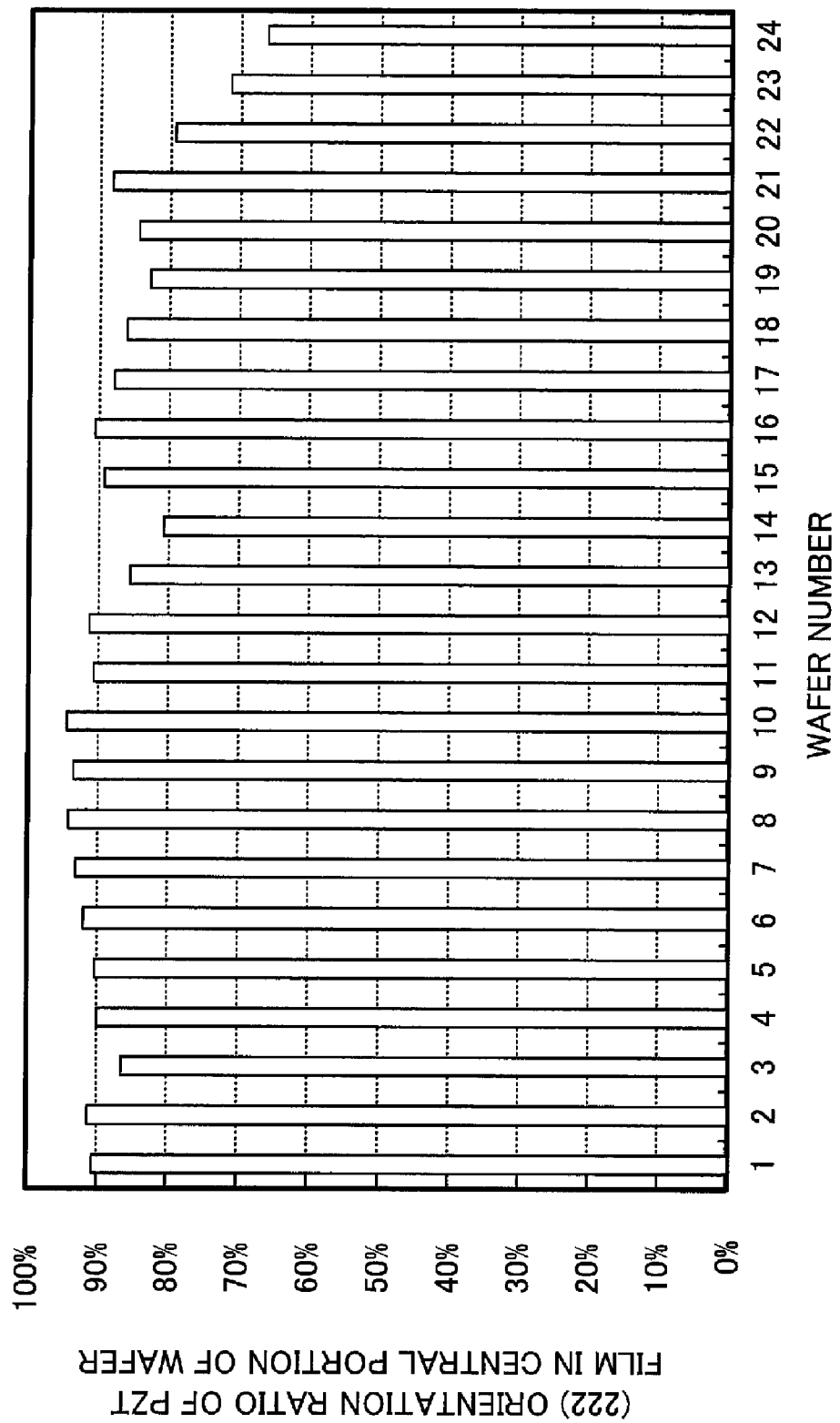
FIG. 42 illustrates the (222) orientation ratio of a PZT film in a central portion of each wafer.
Figure 43:
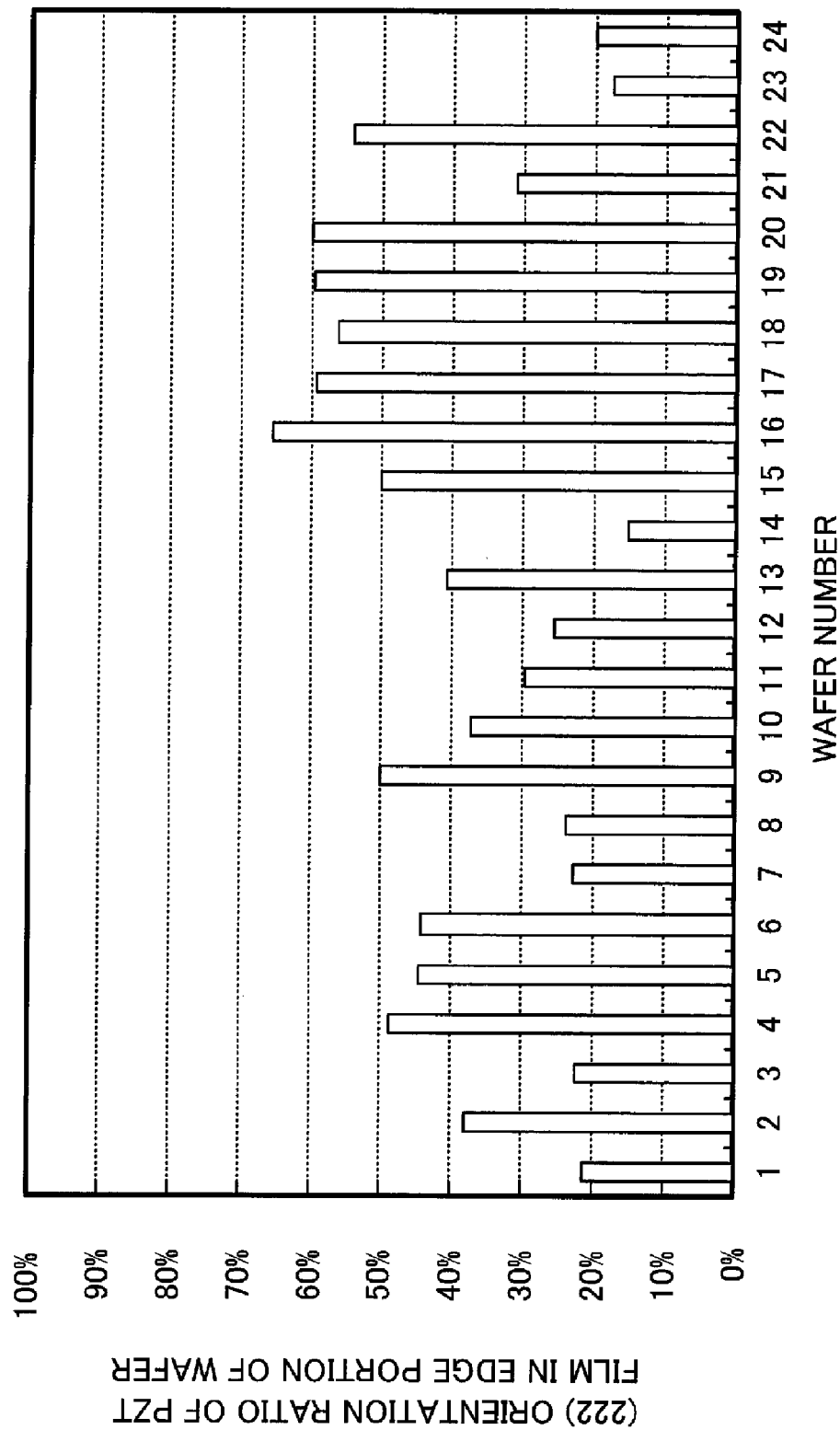
FIG. 43 illustrates the (222) orientation ratio of a PZT film in an edge portion of each wafer.

FIG. 39 is a fragmentary schematic sectional view of a FeRAM manufactured by a FeRAM manufacturing method according to a fourth embodiment of the present invention.

A FeRAM manufactured by a FeRAM manufacturing method according to a fourth embodiment differs from the FeRAM manufactured by the FeRAM manufacturing method according to the above first embodiment in that a ferroelectric capacitor is formed over a glue film 14a and a W plug 15a with a foundation conductive film 20 and an anti-oxidation film 21 between and that a wiring 72 is formed directly over the ferroelectric capacitor. Such a FeRAM can be manufactured in the following way.

The same steps that are described in the above first embodiment are performed first until a first interlayer dielectric film 13 is formed. After that, the glue film 14a and the W plug 15a connected to a first source/drain region 10a are formed in a contact hole. The foundation conductive film 20 and the anti-oxidation film 21 are formed over the first interlayer dielectric film 13 in which the glue film 14a and the W plug 15a is formed. An Ir film 30, an $IrO_X$ film 31 (which is reduced to an Ir film 31a), a PZT film 32, and an upper electrode 33 are then formed and patterning is performed on them. Moreover, patterning is performed on the anti-oxidation film 21 and the foundation conductive film 20 formed thereunder. After that, a first AlO film 41, a second AlO film 42, and a third interlayer dielectric film 43 are formed. In addition, a contact hole which connects with second source/drain regions 10b is formed and a glue film 70 and a W plug 71 are formed. After a contact hole which connects with the upper electrode 33 of the ferroelectric capacitor is formed, a TiN—Ti laminated film 72a, a film 72b of an alloy of Al and Cu, and a TiN—Ti laminated film 72c, for example, are formed in order. By doing so, a wiring 72 is formed.

By adopting the FeRAM manufacturing method according to the fourth embodiment, a high-performance FeRAM with high reliability can also be manufactured. This is the same with the above first embodiment.

The first through fourth embodiments of the present invention have been described. However, the principles of manufacturing the above ferroelectric capacitor are applicable not only to a FeRAM in which the stack structure exemplified is adopted but also to a FeRAM in which the planar structure is adopted.

In the present invention, a ferroelectric capacitor included in a semiconductor device is formed by forming an amorphous or microcrystalline metal oxide film over a first metal film electrically connected to a transistor, forming a ferroelectric film over a second metal film to which the metal oxide film is reduced, and forming a conductive film over the ferroelectric film. As a result, a ferroelectric capacitor having a ferroelectric film the orientation of which is good can be formed stably. Accordingly, a high-performance semiconductor device with high reliability including a ferroelectric capacitor can be realized.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has(have) been described in detail, it should be understood that various changes, substitutions, and alterations could be made hereto without departing from the spirit and scope of the invention.

What is claimed is:

1. A method for manufacturing a semiconductor device including a ferroelectric capacitor, the method comprising:
   forming a first metal film electrically connected to a transistor;
   forming an amorphous or microcrystalline metal oxide film over the first metal film;
   reducing the metal oxide film to a second metal film and forming a ferroelectric film over the second metal film; and
   forming a conductive film over the ferroelectric film.

2. The method according to claim 1, wherein in forming the metal oxide film, thickness of the metal oxide film is set so that the metal oxide film is reduced completely to the second metal film at the time of forming the ferroelectric film.

3. The method according to claim 1, wherein in forming the metal oxide film, the metal oxide film is made amorphous or microcrystalline by controlling temperature at which the metal oxide film is formed.

4. The method according to claim 1, wherein in forming the metal oxide film, the metal oxide film is formed in an atmosphere of mixed gas which contains oxygen gas, and oxidation degree of the metal oxide film reduced is controlled by controlling ratio of the oxygen gas contained in the mixed gas.

5. The method according to claim 4, wherein the ratio of the oxygen gas is changed according to a rate at which the metal oxide film is formed.

6. The method according to claim 1, wherein in forming the ferroelectric film:
   the ferroelectric film is formed by a MOCVD method;
   after the metal oxide film is formed, material gas for the ferroelectric film is introduced; and
   the metal oxide film is reduced to the second metal film with a component contained in the material gas, and the ferroelectric film is formed over the second metal film with the material gas.

7. The method according to claim 6, wherein before introducing the material gas:
   a temperature raising process for raising temperature to a temperature value at which the ferroelectric film is formed is performed; and
   the metal oxide film is crystallized in the temperature raising process.

8. The method according to claim 1, further comprising performing heat treatment in an atmosphere of an inert gas after the formation of the first metal film and before the formation of the metal oxide film.

9. The method according to claim 1, further comprising performing heat treatment in an atmosphere of mixed gas which contains oxygen gas after the formation of the ferroelectric film.

10. The method according to claim 1, wherein the metal oxide film is a noble metal oxide film.

11. The method according to claim 3, wherein the temperature at which the metal oxide film is formed is 10° C. to 100° C.

12. The method according to claim 11, wherein the temperature at which the metal oxide film is formed is about 60° C.

13. A semiconductor device including a ferroelectric capacitor, the device comprising:
   a first metal film electrically connected to a transistor;
   a second metal film which is formed over the first metal film and in which a diameter of crystal grains is smaller than a diameter of crystal grains in the first metal film;
   a ferroelectric film formed over the second metal film; and
   a conductive film formed over the ferroelectric film.

14. The semiconductor device according to claim 13, wherein the second metal film is thinner than the first metal film.

15. The semiconductor device according to claim 13, wherein the second metal film is 10 nanometers to 40 nanometers in thickness.

16. The semiconductor device according to claim 15, wherein the diameter of the crystal grains in the second metal film is smaller than or equal to 20 nanometers.

17. The semiconductor device according to claim 13, wherein the second metal film is a noble metal film.

18. The semiconductor device according to claim 13, wherein the first metal film and the second metal film are made of a same element.

19. The semiconductor device according to claim 13, wherein the first metal film and the second metal film contain iridium.

20. A method for manufacturing a semiconductor device including a ferroelectric capacitor, the method comprising:
   forming a lower electrode;
   forming a ferroelectric film formed over the lower electrode; and
   forming an upper electrode over the ferroelectric film, wherein:
   forming the lower electrode including:
      forming a first metal film; and
      forming a metal oxide film over the first metal film at a temperature of 10° C. to 100° C., and
   forming the ferroelectric film including reducing the metal oxide film to a second metal film and forming the ferroelectric film over the second metal film.

* * * * *